United States Patent
Itoga et al.

(10) Patent No.: US 6,947,518 B2
(45) Date of Patent: Sep. 20, 2005

(54) X-RAY EXPOSURE APPARATUS, X-RAY EXPOSURE METHOD, X-RAY MASK, X-RAY MIRROR, SYNCHROTRON RADIATION APPARATUS, SYNCHROTRON RADIATION METHOD AND SEMICONDUCTOR DEVICE

(75) Inventors: Kenji Itoga, Hyogo (JP); Toyoki Kitayama, Hyogo (JP); Yutaka Watanabe, Tochigi (JP); Shunichi Uzawa, Tokyo (JP)

(73) Assignees: Mitsubishi Denki Kabushiki Kaisha, Tokyo (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/769,490

(22) Filed: Jan. 26, 2001

(65) Prior Publication Data

US 2001/0021239 A1 Sep. 13, 2001

Related U.S. Application Data

(63) Continuation of application No. PCT/JP00/03337, filed on May 24, 2000.

(30) Foreign Application Priority Data

May 28, 1999 (JP) ............................................ 11-149621

(51) Int. Cl.[7] .............................................. G21K 5/00
(52) U.S. Cl. ......................................... 378/34; 378/85
(58) Field of Search ........................... 378/34, 35, 145, 378/84, 82, 85; 359/883, 884

(56) References Cited

U.S. PATENT DOCUMENTS

| | | | |
|---|---|---|---|
| 4,110,625 A | * | 8/1978 | Cairns et al. .................. 378/45 |
| 4,634,643 A | | 1/1987 | Suzuki |
| 5,214,685 A | * | 5/1993 | Howells ....................... 378/34 |

| 5,258,091 A | * | 11/1993 | Imai et al. .................. 156/613 |

(Continued)

FOREIGN PATENT DOCUMENTS

| EP | 0 597 664 A2 | | 5/1994 | |
|---|---|---|---|---|
| EP | 0 903 638 | | 3/1999 | |
| EP | 903638 A1 | * | 3/1999 | ........... G03F/7/039 |
| GB | 2054195 A | | 2/1981 | |
| JP | 55-71311 | | 5/1980 | |
| JP | 3-120714 | * | 5/1991 | ........... H01L/21/27 |
| JP | 06-194497 | * | 7/1994 | ........... G21K/1/06 |
| JP | 6-194497 | * | 7/1994 | ........... G21K/1/06 |
| JP | 8-152499 | | 6/1996 | |
| JP | 9-218299 | | 8/1997 | |
| JP | 10-083955 | * | 3/1998 | ......... H01L/21/027 |
| JP | 10-172883 | | 6/1998 | |
| JP | 10289867 A | * | 10/1998 | ......... H01L/21/027 |
| JP | 11-14800 | | 1/1999 | |
| JP | 11003858 A | * | 1/1999 | ......... H01L/21/027 |
| JP | 11-014800 | * | 1/1999 | ........... G21K/1/06 |
| JP | 11026350 A | * | 1/1999 | ......... H01L/21/027 |
| JP | 11038193 A | * | 2/1999 | ........... G21K/1/06 |
| JP | 11-084098 | * | 3/1999 | ........... G21K/5/02 |
| JP | 11-160871 | | 6/1999 | |
| KR | 1999-29914 | | 4/1999 | |

OTHER PUBLICATIONS

Bearden et al., Reviews in Modern Physics [1967], v. 39, from http://www-structure.lln.gov/Xray/elements.html.*

"Theoretical calculations of a square multilayer Bragg-Fresnel lens by quantum theory" Zichun Le, et al. *Optics and Laser Technology*, Oct. 1999, Elsevier, UK, vol. 31, No. 7, pp. 497–503, XP002178984.

(Continued)

*Primary Examiner*—Edward J. Glick
*Assistant Examiner*—Chih-Cheng Glen Kao
(74) *Attorney, Agent, or Firm*—McDermott Will & Emery LLP

(57) ABSTRACT

An X-ray exposure apparatus comprises an X-ray mirror containing a material having an absorption edge only in at least either one of a wavelength region of less than 0.45 nm and a wavelength region exceeding 0.7 nm as to X-rays.

8 Claims, 22 Drawing Sheets

U.S. PATENT DOCUMENTS

| | | | | |
|---|---|---|---|---|
| 5,356,662 A | * | 10/1994 | Early et al. | 427/140 |
| 5,374,974 A | * | 12/1994 | Rostoker et al. | 355/34 |
| 5,503,958 A | * | 4/1996 | Waldo | 430/311 |
| 5,524,131 A | * | 6/1996 | Uzawa et al. | 378/34 |
| 5,528,364 A | * | 6/1996 | Koike | 378/84 |
| 5,622,525 A | * | 4/1997 | Haisma et al. | 451/41 |
| 5,677,939 A | * | 10/1997 | Oshino | 378/34 |
| 5,770,335 A | * | 6/1998 | Miyake et al. | 430/5 |
| 5,923,719 A | * | 7/1999 | Watanabe | 378/34 |
| 5,931,723 A | * | 8/1999 | Katsuoka et al. | 451/285 |
| 5,949,844 A | * | 9/1999 | Watanabe | 378/34 |
| 6,049,588 A | * | 4/2000 | Cash, Jr. | 378/85 |
| 6,101,237 A | * | 8/2000 | Miyachi et al. | 378/35 |
| 6,167,111 A | * | 12/2000 | Watanabe et al. | 378/34 |
| 6,219,400 B1 | * | 4/2001 | Hasegawa et al. | 378/34 |
| 6,251,567 B1 | | 6/2001 | Reinecke et al. | |
| 6,256,371 B1 | * | 7/2001 | Hasegawa et al. | 378/34 |
| 2002/0048341 A1 | * | 4/2002 | Itoga et al. | 378/34 |
| 2002/0196896 A1 | * | 12/2002 | Kitayama et al. | 378/34 |
| 2003/0152190 A1 | * | 8/2003 | Watanabe et al. | 378/35 |

OTHER PUBLICATIONS

"Modeling X–ray proximity lithography", Jerry Z. Y. Guo et al., Journal of Research and Development, vol. 37, No. 3, May 1993, pp. 331–349.

"Updated system model for x–ray lithography", M. Khan et al., J. Vac. Sci. Technol. B 12(6), Nov./Dec. 1994, pp. 3930–3935.

"50–nm x–ray lithography using synchrotron radiation", Y. Chen et al., J. Vac. Sci. Technol. B 12(6), Nov./Dec. 1994, pp. 3959–3964.

NTT R&D vol. 43, No. 6, p. 501 (1994).

"Laser Generated X–Ray Source for Time–Resolved Biological and Material Structure Studies", Bartunik et al., Structural Biological Applications of X–Ray Absorption, Scattering, and Diffraction, pp. 331–348, 1996.

"X–Ray nanolithography–the clearest path to 0.1 and sub–0.1$\mu$m ULSI", M.L. Schattengurg et al , JJAP Series 5, Proc. of 1991 Intern. MicroProcess Conference, pp. 63–70.

"Progress of SR lithography–A path to 0.1 micron feature size–", Nobufumi Atoda, International Conference on Advanced Microelectronic Devices and Processing, pp. 103–108, Mar. 3–5, 1994.

"Extendibility of synchrotron radiation lithography to the sub–100–nm region", Kimiyoshi Deguchi, Bulletin of Solid State Physics and Applications, vol. 5, No. 2, May 25, 1999, pp. 59–64. (Partial English translation).

"Innovation in ULSI lithography", Tadahiro Takigawa, Naoaki Aizaki, Shinji Okazaki and Hiroaki Morimoto, Science Forum, Nov. 10, 1994, pp220–227. (Partial English translation).

"Lithography: Exposure system and resist process technology", Shinji Okazaki, Journal of Applied Physics, vol. 69, No. 2, (2000) pp. 196–200.

"Updated system model for x–ray lithography", M. Khan, L. Mohammad, J. Xiao, L. Ocola, and F. Cerrina, J. Vac. Sci. Technol. B 12(6), Nov./Dec. 1994, pp. 3930–3935.

"Sub–Half–Micron Lithography for ULSIs", Katsumi Suzuki, Shinji Matsui and Yukinori Ochiai, Cambridge University Press 2000, pp. 66–69.

"Performance of a wide–flux delivery system for synchrotron x ray lithography", J. P. Silverman, C. N. Archie, J. M. Oberschmidt, and R. P. Rippstein, J. Vac. Sci. Technol. B 11(6), Nov./Dec. 1993, pp2976–2980.

"Simultaneous optimization of spectrum, spatial coherence, gap, feature bias, and absorber thickness in synchrotron–based x–ray lithography", Scott D. Hector, Henry I. Smith and M. L. Schttenburg, J. Vac. Sci. Technol. B 11(6), Nov./Dec. 1993, pp2981–2985.

"X ray lithography for <100 nm ground rules in complex patterns", Scott Hector, Victor Pol and Raman Viswanathan et al., J. Vac. Sci. Technol. B 15(6), Nov./Dec. 1997, pp2517–2521.

"Mirror design and alignment for x ray lithography beamlines", Kenichi Kuroda and Takashi Kaneko, Jpn. J. Appl. Phys. vol. 34 (1995), pp. 6764–6769.

"High efficiency beamline for synchrotron radiation lithography", Takashi Kaneko, Yasunao Saitoh, Seiichi Itabashi, and Hideo Yoshihara, J. Vac. Sci. Technol. B 9(6), Nov./Dec. 1991, pp3214–3217.

"Fabrication of 0.2um large scale integrated circuits using synchrotron radiation x–ray lithography", K. Deguchi, K. Miyoshi, H. Ban, T. Matsuda, T. Ohno, and Y. Kado, J. Vac. Sci. Technol. B 13(6), Nov./Dec. 1995, pp3040–3045.

"Replication of near 0.1 $\mu$m hole patterns by using x–ray lithography", Yukiko Kikuchi, Naoko Kihara, Shinji Sugihara, and Satoshi Satoh, et al., J. Vac. Sci. Technol. B 14(6), Nov./Dec. 1996, pp4298–4302.

"Overlay and Critical Dimension Control in Proximity X ray Lithography", Kiyoshi Fuji, Yuusuke Tanaka, Katsumi Suzuki, Toshiyuki Iwamoto, Shinji Tsuboi and Yasuji Matsui, NEC Research & Development vol. 42, No. 1, pp. 27–31, Jan. 2001.

"Control of X–Ray Beam Fluctuation in Synchrotron Radiation Lithography Beamline", Hiroki Shimano, Hirofumi Tanaka, Yoshihiko Ozaki, and Kenji Marumoto, Jpn, J. Appl. Phys. vol. 34 (1995) pp. 5856–5861.

"Novel illumination system of synchrotron radiation stepper with full field exposure method", Yutaka Watanabe, Shinichi Hara, Nobutoshi Mizusawa, Yasuaki Fukuda and Shunichi Uzawa, J. Vac. Sci. Technolo. B 15(6), Nov./Dec. (1997), pp. 2503–2508.

"Evaluation of new x–ray stepper, the XRA", Hiroaki Sumitani, Muneyoshi Suita, Soichiro Mitsui, Hajime Aoyama, Kiyoshi Fujii, Hiroshi Watanabe, Takao Taguchi, and Yasuji Matsui, J. Vac. Sci. Technol. B19(6), Nov./Dec. (2001), pp. 2448–2454.

Parametric modeling at resist–substrate interfaces, L. E. Ocola and F. Cerrina, J. Vac. Sci. Technol. B 12(6), Nov./Dec. 1994, pp. 3986–3989.

"The effects of secondary electron from a silicon substrate on SR x–ray lithography", Taro Ogawa, Kozo Mochiji, Yasunari Soda and Takeshi Kimura, Japanese Journal of Applied Physics, vol. 28, No. 10, Oct., 1989, pp. 2070–2073.

"Sub–20 nm x–ray nanolithography using conventional mask technologies on monochromatized synchrotron radiation", G. Simon, A. M. Haghiri–Gosnet, J. Bourneix, D. Decanini, Y. Chen, F. Rousseaux, H. Launois, and B. Vidal, J. Vac. Sci. Technol. B15(6), Nov./Dec. 1997, pp. 2489–2494.

"The first x ray lithography beamline at Hefei National Synchrotron Radiation Laboratory", Shinan Qian et. al., J. Vac. Sci. Technol. B 8(6), Nov./Dec. 1990, pp. 1524–1528.

"Resolution limits in x ray lithography", M. Feldman and J. Sun, J. Vac. Sci. Technol. B 10(6), Nov./Dec. 1992, pp. 3173–3176.

"Synchrotron radiation beamline for x ray lithography", Shunji Goto, Takao Taguchi, Toshihiko Osada, Shigeru Okamura, and Tokushige Hisatsugu, J. Vac. Sci. Technol. B 11(2), Mar./Apr. 1993, pp. 286–295.

"Extendibility of synchrotron radiation lithography to the sub–100 nm region", Kimiyoshi Deguchi, Kazunori Miyoshi, Masatoshi Oda, Tadahito Matsuda, Akira Ozawa, and Hideo Yoshihara, J. Vac. Sci. Technol. B 14(6), Nov./Dec. 1996, pp. 4294–4297.

"Absence of Resolution Degradation in X–ray Lithography for λ From 4.5 nm to 0.83nm", K. Early, M. L. Schattenburg, and Henry I. Smith, Microelectronic Engineering 11 (1990), pp. 317–321.

"International Technology Roadmap for Semiconductors", (1999). pp. p154 Fig.23, http://public.itrs.net/Files/1999_SIA_Roadmap/Litho.pdf.

"X ray lithography source using a stationary solid Pd target", J. R. Maldonado, M. E. Poulsen, T. E. Saunders, F. Vratny, and A. Zacharias, J. Vac. Sci. Technol. 16, No. 6, Nov./Dec. 1979, pp. 1942–1945.

"SOR Lithography", T. Kosokawa, T. Hayasaka, H. Yoshihara, S. Ishihara, and T. Kitayama, Jpn. J. Appl. Phys. Proc. Of 1989 Intern. Symp. On MicroProcess Conference, pp. 72–75.

"Proposal for a 50 nm proximity x–ray lithography system and extension to 35 nm by resist material selection", Toyoki Kitayama Kenji Itoga, Yutaka Watanabe and Shunichi Uzawa, J. Vac. Sci. Technol. B 18(6), Nov./Dec. 2000 pp. 2950–2954.

"Technology and performance of the Canon XRA–1000 production x–ray stepper", Nobutoshi Mizusawa, Kouji Uda, Yutaka Tanaka, Hirohisa Ohta and Yutaka Watanabe, J. Vac. Sci. Technol. B 18(6), Nov./Dec. 2000, pp. 2955–2960.

"Extension of x–ray lithography to 50 nm with a harder spectrum", M. Khan, G. Han, S. B. Bollepalli, F. Cerrina and J. Maldonado, J. Vac. Sci. Technol. B 17(6), Nov./Dec. 1999, pp. 3426–3432.

"Can proximity x–ray lithography print 35 nm features ? Yes", Mumit Khan, Geng Han, Gene Tsvid, Toyoki Kitayama, Juan Muldonado, and Franco Cerrina, J. Vac. Sci. Technol. B 19(6), Nov./Dec. 2001, pp. 2423–2427.

"Effect of secondary electron from the substrate in x–ray lithography using harder radiation spectra", K. Itoga, K. Marumoto, T. Kitayama, H. Sumitani, M. Amemiya, and Y. Watanabe, J. Vac. Sci. Technol. B 19(6), Nov./Dec. 2001.pp. 2439–2443.

* cited by examiner

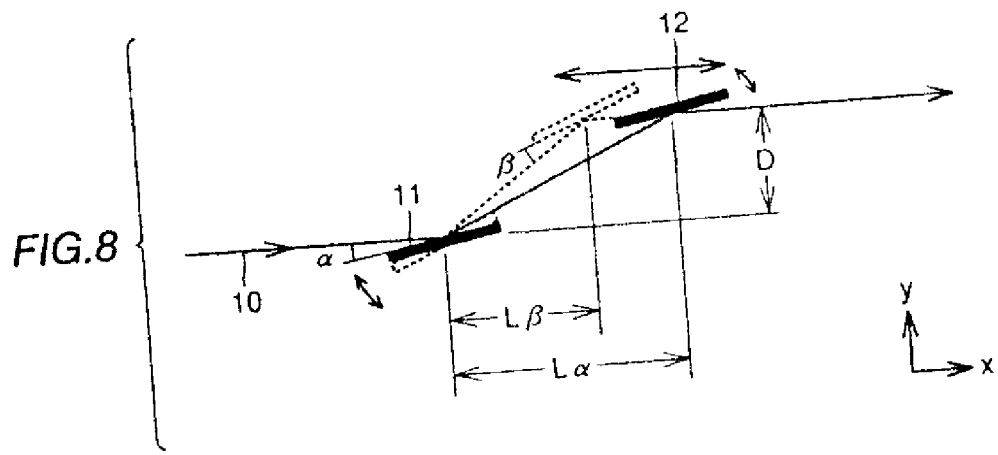
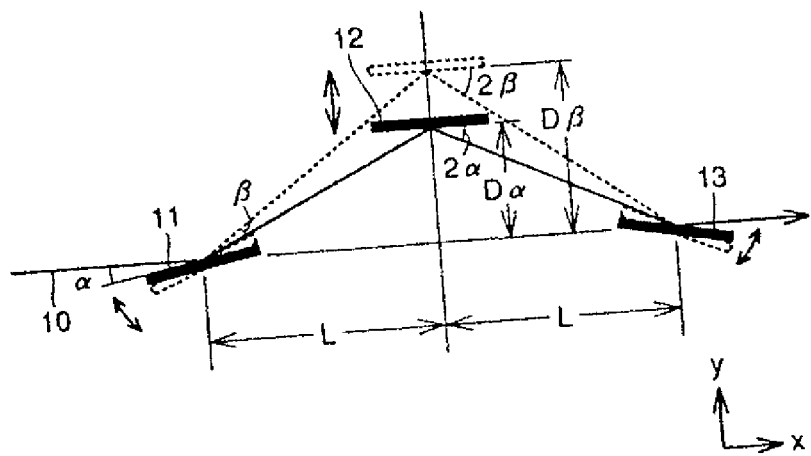

US 6,947,518 B2

X-RAY EXPOSURE APPARATUS, X-RAY EXPOSURE METHOD, X-RAY MASK, X-RAY MIRROR, SYNCHROTRON RADIATION APPARATUS, SYNCHROTRON RADIATION METHOD AND SEMICONDUCTOR DEVICE

REFERENCE TO RELATED APPLICATION

This application is a continuation of International Application No. PCT/JP00/03337, whose international filing date is May 24, 2000, which in turn claims the benefit of Japanese Patent Application No. 11-149621, filed May 28, 1999, the disclosure of which Application is incorporated by reference herein. The benefit of the filing and priority dates of the International and Japanese Applications is respectfully requested.

BACKGROUND OF THE INVENTION

1. Field of the Invention

The present invention relates to an X-ray exposure apparatus, an X-ray exposure method, an X-ray mask, an X-ray mirror, a synchrotron radiation apparatus, a synchrotron radiation method and a semiconductor device, and more specifically, it relates to an X-ray exposure apparatus, an X-ray exposure method, an X-ray mask, an X-ray mirror, a synchrotron radiation apparatus, a synchrotron radiation method and a semiconductor device capable of employing X-rays of a shorter wavelength region than the prior art for exposure.

2. Description of the Background Art

In recent years, requirement for higher integration and refinement of a semiconductor device is becoming more and more strong. Therefore, necessity for forming a pattern of a semiconductor integrated circuit smaller than the prior art increases. Thus, an X-ray proximity exposure technique employing X-rays shorter in wavelength than exposure light having been employed in general as exposure light is watched with interest in a photolithographic working step.

FIG. 24 is a schematic diagram of a conventional X-ray exposure apparatus. Referring to FIG. 24, the X-ray exposure apparatus is formed by a synchrotron radiation source 101, X-ray mirrors 103, a heat removal filter 104, a beryllium window 105, a window 122 consisting of a silicon nitride film, an X-ray mask 106 and a vertical X-Y stage 123 for setting a semiconductor wafer 109. Radiation 102 generated in the synchrotron radiation source 101 passes through the X-ray mirrors 103, the heat removal filter 104, the beryllium window 105 and the window 122 consisting of a silicon nitride film and reaches the X-ray mask 106. In the X-ray mask 106, a circuit pattern to be transferred to the semiconductor wafer 109 is formed by an X-ray absorber. The radiation 102 passes through the X-ray mask 106, whereby this circuit pattern is transferred to resist applied onto the semiconductor wafer 109. Such an X-ray exposure apparatus is shown in NTT R & D Vol. 43, No. 6, p. 501 (1994), for example.

At this point, the radiation 102 is continuous spectral light having wavelengths over a wide range from the X-ray region to the infrared region. As to X-rays required in an X-ray exposure step of transferring the transfer pattern to the semiconductor wafer 109, on the other hand, only X-rays of a certain proper wavelength region are required. Therefore, the conventional X-ray exposure apparatus first utilizes the reflection characteristics of the X-ray mirrors 103 for absorbing/cutting shorter-wavelength X-ray components having wavelengths of not more than 0.7 nm. Then, when the radiation 102 is transmitted through the heat removal filter 104 consisting of beryllium, X-ray components whose wavelengths are longer than 1.5 nm are substantially entirely absorbed/cut by the heat removal filter 104 due to the characteristics of beryllium.

Thus, the radiation 102 is so adjusted that the wavelengths thereof are in the range of about 0.7 to 1.5 nm. Then, the radiation 102 is successively transmitted through the beryllium window 105 and the window 122 consisting of a silicon nitride film. At this time, heat is hardly generated in the beryllium window 105 and the window 122 consisting of a silicon nitride film. The space between the beryllium window 105 and the window 122 consisting of a silicon nitride film is filled with helium of the atmospheric pressure. Therefore, the beryllium window 105 serves as a partition between a vacuum region upstream the beryllium window 105 and an atmospheric pressure region on the downstream side. The heat removal filter 104 cuts unnecessary X-ray components, thereby suppressing heat generation of the beryllium window 105. Consequently, it is possible to keep mechanical strength of the beryllium window 105.

The window 122 consisting of a silicon nitride film fills the role of a partition between the region filled with helium and the atmosphere. When bringing it into an apparatus structure setting the vertical X-Y stage 123 in a helium atmosphere, the window 122 consisting of a silicon nitride film is unnecessary.

The X-ray mask 106 is formed with the circuit pattern to be transferred to the semiconductor wafer as hereinabove described. This circuit pattern is transferred by irradiating a prescribed region of the resist applied to the semiconductor wafer 109 with the radiation 102 through the X-ray mask 106.

In general, a heavy metal such as gold or platinum has been employed as the material for the surfaces of the X-ray mirrors 103 reflecting X-rays. This is because reflectance for X-rays of about 60% is obtained at wavelengths around about 0.7 nm, which are the wavelengths of X-rays employed for exposure also when relatively increasing an oblique-incidence angle of the radiation 102 with respect to the X-ray mirrors 103 to about 2°. Means of converging a larger quantity of X-rays by preparing X-ray mirrors having a large converging angle with such a material of gold or platinum is studied. The intensity of X-rays employed for exposure can be increased by thus converging a lager quantity of X-rays. Consequently, it becomes possible to obtain a high throughput in the exposure step.

It is also proposed to employ silicon carbide or fused quartz as the material for the X-ray mirrors 103. This silicon carbide can bring the reflectance for X-rays to an extremely high value of about 90% by relatively shallowly setting the oblique-incidence angle to about 1°.

While a beryllium thin film is proposed as the material for the heat removal filter 104 absorbing/cutting long-wave X-rays, a proposal for employing silicon nitride or a diamond thin film in an auxiliary manner is also made in addition. This is for an object of increasing efficiency of heat absorption and an object of attaining oxidation prevention of the beryllium thin film.

The X-ray mask 106 generally comprises a membrane consisting of silicon carbide or the like and an X-ray absorber formed on this membrane. At this point, silicon carbide is employed since absorbance for X-rays of about 0.7 nm to 1.5 nm in wavelength, which are X-rays employed for exposure, is relatively small.

Thus, gold, platinum, silicon carbide, fused quartz or the like is proposed as the material for the surfaces of the X-ray mirrors reflecting X-rays. Further, beryllium, silicon nitride, diamond or the like is proposed as the window material. At this point, any of these is on the premise of employment of X-rays having a peak wavelength of about 0.75 nm, generally regarded as most suitable, as exposure light.

At this point, the reason why it has been said that the X-rays having a peak wavelength of about 0.75 nm are suitable as the optimum exposure light is as follows:

That is, in principle, the resolution of an obtained optical image improves as employing X-rays having shorter wavelengths, and it is possible to form a fine pattern. As the wavelengths of the X-rays reduce, however, energy of the X-rays increases. Consequently, when the resist applied onto the semiconductor wafer 109 is irradiated with the X-rays in the exposure step, photoelectrons are generated in this resist. The kinetic energy of these photoelectrons increases as the energy of the X-rays incident upon the resist increases. The resist is sensitized by these photoelectrons. Consequently, it follows that the region of the resist sensitized by the photoelectrons generated in the resist increases as employing Short-wave X-rays. Consequently, it follows that the pattern formed on the resist is blurred due to influence by these photoelectrons. That is, it has been regarded that the range of these photoelectrons decides the resolution limit as such.

In consideration of the range of these photoelectrons, therefore, it has generally been said that the optimum peak wavelength of X-rays employed for exposure is about 0.75 nm.

Thus, it has been considered that the range of the photoelectrons decides the resolution limit, and hence it has generally been said that a pattern having a line width or a line space of not more than 100 nm cannot be formed through an exposure step employing X-rays having a peak wavelength of about 0.75 nm as described above.

In order to improve the resolution in the exposure step employing X-rays under such circumstances, there has been made a proposal for attaining higher resolution by employing a low-contrast mask, a phase-shift mask prepared by vertically tapering an absorber pattern, a mask subjected to optical proximity effect correction or the like. In any case, however, it has been difficult to remarkably improve the resolution.

Since the aforementioned problem of the range of photoelectrons is present, an idea of shifting the wavelengths of X-rays employed for exposure to a shorter wavelength region thereby attaining higher resolution has not generally been studied in the technical field of X-ray exposure performing transfer of a circuit pattern for a semiconductor device. When employing X-rays of a shorter wavelength region, the X-rays are readily transmitted through an X-ray absorber of an X-ray mask since the energy of the X-rays is larger than general. In order to attain a necessary contrast, therefore, it is conceivably necessary to increase the thickness of the X-ray absorber. In such a case, the transmission characteristics of the X-rays are deteriorated due to a waveguide effect when the X-rays are transmitted through a transfer pattern formed by the X-ray absorber having a large thickness, and hence there has been such a problem that the resolution of the transferred circuit pattern lowers. Thus, it has been regarded that refinement of the transfer pattern is difficult.

As an exposure technique with Short-wave X-rays, there is an example setting the exposure wavelength to about 0.3 nm in the field of a micromachine technique. However, it has thus employed the Short-wave X-rays for an object of performing high-aspect pattern working of forming a pattern of several microns with a height of about several 100 microns by increasing transmission ability of X-rays into resist. Further, a pattern size required in this field of the micromachine technique is larger than a required pattern size demanded in the aforementioned field of semiconductor devices by at least one digit to two digits. In addition, the thickness of the X-ray absorber of the X-ray mask is also larger than that employed in the field of the semiconductor devices. Further, a metal such as titanium is employed for a substrate of the X-ray mask. That is, the aforementioned technique belongs to a technical field absolutely different from the technical field of the present invention. Further, in relation to an exposure apparatus employing a point light source of an electron beam excitation type employing a palladium target, an exemplary experiment employing a mask prepared by forming an absorber on a substrate consisting of boron nitride by gold plating for performing exposure with X-rays of a wavelength region of 0.415 nm to 0.44 nm is reported. However, this technique also belongs to a technical field basically different from the present invention employing a synchrotron radiation source.

At this point, necessity for forming a fine pattern whose design rule is about 0.05 μm has recently become obvious following requirement for refinement and higher integration of a semiconductor device. In the aforementioned exposure step employing X-rays whose peak wavelength is about 0.75 nm, it is conceivably difficult to accurately form such a fine pattern whose line width or line space is at the level of 0.05 μm.

Therefore, the inventors have made various experiments and studies aiming at spreading the application limit of the X-ray exposure technique to a finer region and transferring a pattern of high resolution at a high speed (attaining a high throughput). Consequently, they have found it possible to employ X-rays of a shorter wavelength region than general for the X-ray exposure step as described later. However, the current X-ray exposure apparatus has been designed basically on the premise of employing X-rays whose peak wavelength is about 0.75 nm as exposure light, and hence it has been difficult to effectively use X-rays having wavelengths smaller than 0.7 nm, for example, as exposure light.

The present invention has been proposed in order to solve the aforementioned problems, and one object of the present invention is to provide an X-ray exposure apparatus capable of transferring a pattern of high resolution and capable of attaining a high throughput by spreading the wavelengths of X-rays employed for X-ray exposure to a shorter wavelength region than general.

Another object of the present invention is to provide an X-ray exposure method capable of transferring a pattern of high resolution and capable of attaining a high throughput by spreading the wavelengths of X-rays employed for X-ray exposure to a shorter wavelength region than general.

Still another object of the present invention is to provide an X-ray mirror employed for an X-ray exposure apparatus capable of transferring a pattern of high resolution and capable of attaining a high throughput by spreading the wavelengths of X-rays employed for X-ray exposure to a shorter wavelength region than general.

A further object of the present invention is to provide an X-ray mask employed for an X-ray exposure apparatus capable of transferring a pattern of high resolution and capable of attaining a high throughput by spreading the wavelengths of X-rays employed for X-ray exposure to a shorter wavelength region.

A further object of the present invention is to provide a synchrotron radiation apparatus applicable to an X-ray exposure apparatus capable of transferring a pattern of high resolution and capable of attaining a high throughput by spreading the wavelengths of X-rays employed for X-ray exposure to a shorter wavelength region.

A further object of the present invention is to provide a synchrotron radiation method applicable to an X-ray exposure apparatus capable of transferring a pattern of high resolution and capable of attaining a high throughput by spreading the wavelengths of X-rays employed for X-ray exposure to a shorter wavelength region.

A further object of the present invention is to provide a highly integrated semiconductor device manufactured with an X-ray exposure method capable of transferring a pattern of high resolution and capable of attaining a high throughput by spreading the wavelengths of X-rays employed for X-ray exposure to a shorter wavelength region than general.

SUMMARY OF THE INVENTION

An X-ray exposure apparatus according to one aspect of the present invention comprises an X-ray mirror containing a material having an absorption edge only in at least either one of a wavelength region of less than 0.45 nm and a wavelength region exceeding 0.7 nm as to X-rays.

At this point, it has generally been said that the range, referred to as a gluon range, of photoelectrons generated by X-irradiation in resist decides the resolution limit of the transfer pattern in X-ray exposure. Therefore, it has been said that a pattern whose line width or line space is not more than 100 nm cannot be formed by the X-ray exposure.

However, the inventors have found that a line pattern of 50 nm can be formed by empirically employing non-chemical amplification type resist. In this case, photoelectrons have not become a definitive factor deciding the resolution limit although having action of weakening an optical image.

That is, the inventors have found that the range of photoelectrons does not become a dominant factor deciding the resolution limit when employing such resist that a solution speed ratio of a resist part influenced by the photoelectrons and a resist part directly irradiated with X-rays is large. Consequently, the inventors have discovered that X-rays of a shorter wavelength region than general can be employed as exposure light as in the X-ray exposure apparatus according to the present invention.

From this recognition of the inventors, X-rays of a wavelength region shorter than the wavelengths of X-rays generally employed for X-ray exposure can be utilized for an exposure step, and hence a pattern of higher resolution than general can be transferred in the exposure step.

Specifically in the present invention, the X-ray exposure apparatus comprises an X-ray mirror containing a material having an absorption edge only in at least either one of a wavelength region of less than 0.45 nm and a wavelength region exceeding 0.7 nm as to X-rays, i.e., a material having no absorption edge in a wavelength region of at least 0.45 nm and not more than 0.7 nm. Therefore, X-rays of a shorter wavelength region than the wavelength of about 0.75 nm having been employed in general can be obtained. Consequently, X-rays of a shorter wavelength region than general can be utilized when employing the X-ray mirror according to the present invention in the X-ray exposure apparatus. Therefore, it becomes possible to transfer a circuit pattern of higher resolution than general.

The material forming the X-ray mirror according to the present invention has no absorption peak in the wavelength region of at least 0.45 nm and not more than 0.7 nm. Therefore, the X-rays of the wavelength region of at least 0.45 nm and not more than 0.7 nm can be more reliably reflected than a conventional X-ray mirror, whereby sufficient irradiation strength for X-rays can be secured. Consequently, a high throughput can be attained.

Further, short-wave components can be added to general light intensity by spreading the wavelengths of the X-rays employed for exposure to the shorter wavelength region. Thus, the intensity of the X-rays can be increased, whereby the time required for the exposure step can be reduced. Consequently, a high throughput can be implemented more reliably than general.

The X-rays of the wavelength region of at least 0.45 nm and not more than 0.7 nm are employed for the exposure step for the following reason: That is, when the wavelengths of the X-rays are less than 0.45 nm, the sensitivity of resist with respect to the X-rays rather reduces and it becomes difficult to transfer a circuit pattern of high resolution. Further, this is because it is effective to employ X-rays of the wavelength region of not more than 0.7 nm becoming a shorter wavelength region than the wavelength region exceeding 0.7 nm having been utilized in general, in order to implement a higher throughput than general simultaneously with transferring a circuit pattern of higher resolution than general.

In the X-ray exposure apparatus according to the aforementioned one aspect, the X-rays may be included in radiation outgoing from a synchrotron radiation source.

In the X-ray exposure apparatus according to the aforementioned one aspect, the X-ray mirror may be an X-ray mirror for cutting shorter wavelengths absorbing at least 90% of X-rays of a wavelength region of less than 0.3 nm.

When the absorbance for X-rays in the wavelength region of less than 0.3 nm is at least 90% in this case, short-wave X-rays having wavelengths of less than 0.3 nm can be reliably prevented from mixing into the exposure light. Consequently, generation of photoelectrons in the resist can be effectively prevented in exposure with these short-wave X-rays. Thus, deterioration of resolution resulting from photoelectrons can be prevented.

In the X-ray exposure apparatus according to the aforementioned one aspect, the said X-ray mirror may be an X-ray mirror for cutting shorter wavelengths absorbing X-rays whose wavelengths are only less than 0.45 nm.

In this case, X-rays of a shorter wavelength region than the wavelength of about 0.75 nm having been employed in general can be obtained. Consequently, X-rays of a shorter wavelength region than general can be utilized when employing the X-ray mirror according to the present invention in the X-ray exposure apparatus. Thus, it becomes possible to transfer a circuit pattern of higher resolution than general.

In the X-ray exposure apparatus according to the aforementioned one aspect, the aforementioned X-ray mirror may contain a material having an absorption edge only in a wavelength region of less than 0.45 nm as to X-rays.

In the X-ray exposure apparatus according to the aforementioned one aspect, the X-ray mirror may contain a single type of mirror material selected from a group consisting of beryllium, titanium, silver, ruthenium, rhodium and palladium, nitrides, carbides and borides of these, diamond, diamond-like carbon and boron nitride.

In this case, the material forming the X-ray mirror according to the present invention has no absorption peak in the wavelength region of at least 0.45 nm and not more than 0.7 nm. Consequently, the X-ray mirror according to the present invention hardly absorbs X-rays in the wavelength region of at least 0.45 nm and not more than 0.7 nm. Therefore, X-rays in the wavelength region of at least 0.45 nm and not more than 0.7 nm can be more reliably reflected than the conventional X-ray mirror, and hence sufficient irradiation strength for X-rays can be secured. Consequently, a high throughput can be reliably attained.

The absorption edge of beryllium is 11.1 nm, the absorption edges of titanium are 0.249734 nm and 2.729 nm, the absorption edges of silver are 0.048589 nm, 0.32564 nm, 0.35164 nm, 0.36999 nm, 3.082 nm and 3.114 nm, the absorption edges of ruthenium are 0.056051 nm, 0.3835 nm, 0.4180 nm, 0.4369 nm and 4.43 nm, the absorption edges of rhodium are 0.053392 nm, 0.3629 nm, 0.39425 nm, 0.41299 nm and 4.04 nm, and the absorption edges of palladium are 0.05092 nm, 0.3437 nm, 0.37228 nm, 0.39074 nm and 3.70 nm. Further, the absorption edge of nitrogen is 3.099 nm, and the absorption edge of carbon is 4.368 nm.

In the X-ray exposure apparatus according to the aforementioned one aspect, the X-ray mirror may include a substrate and a layer containing a mirror material formed on the substrate.

In this case, this substrate can be previously subjected to working to have a shape such as a spherical surface necessary for the X-ray mirror by employing a material easy to work as the substrate. Consequently, a large-sized X-ray mirror having a complicated shape can be readily prepared.

In the X-ray exposure apparatus according to the aforementioned one aspect, the X-ray mirror may have a function of converging X-rays.

In this case, the X-ray mirror for cutting shorter wavelengths also has the function of converging X-rays, whereby the structure of the X-ray exposure apparatus can be more simplified.

In the X-ray exposure apparatus according to the aforementioned one aspect, the X-ray mirror may have a function of magnifying the area of a region capable of being simultaneously irradiated with X-rays outgoing from the X-ray mirror.

In this case, the X-ray mirror for cutting shorter wavelengths also has the function as a magnifying mirror magnifying a projected region of the X-rays outgoing from the X-ray mirror, whereby the structure of the X-ray exposure apparatus can be more simplified.

In the X-ray exposure apparatus according to the aforementioned one aspect, it may further comprise an X-ray converging mirror.

In this case, the converging mirror and the X-ray mirror for cutting shorter wavelengths can be separately adjusted, whereby finer setting can be performed.

Further, it employs the structure separately comprising the converging mirror and the X-ray mirror for cutting shorter wavelengths in this manner, whereby it becomes possible to readily modify a conventional X-ray exposure apparatus to the X-ray exposure apparatus according to the present invention by inserting this X-ray mirror for cutting shorter wavelengths in the conventional X-ray exposure apparatus. Consequently, X-rays of a shorter wavelength region than general can be employed as exposure light, while the cost for implementing the X-ray exposure apparatus according to the present invention can be reduced at the same time.

In the X-ray exposure apparatus according to the aforementioned one aspect, it may further comprise a magnifying mirror having a function of magnifying the area of a region capable of being simultaneously irradiated with X-rays outgoing from the X-ray mirror.

In this case, the magnifying mirror and the X-ray mirror for cutting shorter wavelengths can be separately adjusted, whereby finer setting can be performed.

Further, it employs the structure separately comprising the magnifying mirror and the X-ray mirror for cutting shorter wavelengths, whereby the X-ray exposure apparatus according to the present invention can be readily implemented by inserting the X-ray mirror for cutting shorter wavelengths into the conventional X-ray exposure apparatus. Consequently, the cost for implementing the X-ray exposure apparatus according to the present invention can be reduced.

In the X-ray exposure apparatus according to the aforementioned one aspect, a surface of the X-ray mirror upon which X-rays are incident may be mechanically polished.

In the X-ray exposure according to the aforementioned one aspect, a surface of the X-ray mirror upon which X-rays are incident may be chemically polished.

The X-ray exposure apparatus according to the aforementioned one aspect may further comprise an X-ray mask. The X-ray mask may include a membrane and an X-ray absorber formed on the membrane. The membrane may contain a single species selected from a group consisting of diamond, diamond-like carbon, boron nitride and beryllium.

In this case, the material employed as the membrane of the X-ray mask according to the present invention has no absorption edge in a wavelength region around 0.67 nm dissimilarly to a silicon-based material having been employed as a conventional membrane, whereby the total transmittance for X-rays in the wavelength region of at least 0.45 nm and not more than 0.7 nm can be rendered higher than general. Consequently, the time required for the exposure step can be more reliably reduced than general, whereby the throughput of the exposure step can be rendered higher than general.

In the X-ray exposure apparatus according to the aforementioned one aspect, it may further comprise an X-ray mask, and the X-ray mask may include a membrane and an X-ray absorber formed on the membrane. The membrane may contain a material having an absorption edge only in at least either one of a wavelength region of less than 0.45 nm and a wavelength region exceeding 0.7 nm as to X-rays, and the X-ray absorber may contain a material having an absorption edge in a wavelength region of at least 0.6 nm and less than 0.85 nm.

In this case, the material contained in the membrane has no absorption edge in the wavelength region of at least 0.45 nm and not more than 0.7 nm, whereby X-rays of a shorter wavelength region than general can be effectively utilized in the X-ray exposure step.

While the absorbance for X-rays exhibits a peak value at the absorption edge wavelength of the material, the absorbance for X-rays reaches a sufficiently large value also in a wavelength region of 0.15 nm around this absorption edge wavelength. Therefore, when the X-ray absorber contains the material having an absorption edge in the wavelength region of at least 0.6 nm and less than 0.85 nm, X-rays employed for exposure can be reliably screened with this X-ray absorber in the wavelength region (at least 0.45 nm and not more than 0.7 nm) of the X-rays employed for exposure. Further, the material having an absorption edge in such a wavelength region is employed as the X-ray absorber, whereby the thickness of the X-ray absorber can be reduced. Consequently, the aspect ratio of a transfer circuit pattern formed by the X-ray absorber can be reduced. Therefore, a fine circuit pattern can be reliably transferred with X-rays of a shorter wavelength region than general.

In the X-ray exposure apparatus according to the aforementioned one aspect, the X-ray absorber may contain a single species selected from a group consisting of tungsten, tantalum and rhenium.

At this point, the absorption edge of tungsten (W) is 0.683 nm, the absorption edge of tantalum (Ta) is 0.711 nm, and the absorption edge of rhenium (Re) is 0.656 nm.

In the X-ray exposure apparatus according to the aforementioned one aspect, the X-ray absorber may include stacked first layer and second layer.

In this case, the X-ray absorber is formed by a plurality of layers, whereby the degree of freedom in selection of the material employed as the X-ray absorber can be enlarged.

Further, a plurality of materials whose absorption peak wavelengths are different as to X-rays can be employed as the X-ray absorber, whereby it becomes possible to more reduce the thickness of the X-ray absorber in the case where X-rays of a wide wavelength region must be absorbed than the case of forming a single-layer X-ray absorber employing a single material.

In the X-ray exposure apparatus according to the aforementioned one aspect, a first material contained in the first layer may have a larger atomic weight than the atomic weight of a second material contained in the second layer.

In this case, the absorption peak wavelength for X-rays can be varied with each layer by containing elements having different atomic weights as the first and second materials and forming a plurality of layers, whereby X-rays can be reliably absorbed over a wider wavelength range.

A heavy element such as molybdenum or rhodium having a large atomic weight may be employed as the first material. Further, a light element such as carbon or beryllium having a small atomic weight may be employed as the second material.

Thus, an X-ray absorber such as that stacking a heavy element and a light element is formed, whereby X-rays can be reliably screened by reflecting the same. When rendering X-ray screenability substantially equivalent, therefore, the thickness of the X-ray absorber can be more reduced than general. Consequently, the aspect ratio of the transfer circuit pattern formed on the X-ray absorber can be reduced. At this point, the aspect ratio stands for, when considering a groove in the transfer circuit pattern formed on the X-ray absorber, the ratio of the width of the bottom portion of the groove and the depth of the groove, and the aspect ratio enlarges when the width of the bottom portion is constant and the depth of the groove enlarges. The aspect ratio can be thus reduced, whereby the transfer pattern can be readily formed while high transfer accuracy can be implemented at the same time.

The X-ray exposure apparatus according to the aforementioned one aspect may comprise a plurality of X-ray mirrors.

In this case, the degree of freedom in design of the X-ray exposure apparatus such as setting of the optical axis of X-rays employed for exposure can be enlarged. Further, short-wave X-rays can be more reliably removed from the X-rays employed for exposure by employing a plurality of X-ray mirrors for cutting shorter wavelengths.

In the X-ray exposure apparatus according to the aforementioned one aspect, it may comprise the X-ray mirrors by at least two and not more than four.

When employing two X-ray mirrors in this case, the traveling direction of X-rays before entering these two X-ray mirrors and the traveling direction of X-rays finally outgoing from the two X-ray mirrors can be rendered substantially parallel by adjusting the oblique-incidence angles of the X-rays in these X-ray mirrors. Further, the peak wavelength of the X-rays employed for exposure can be controlled by controlling the angles of the incidence directions of the X-rays with respect to the X-ray mirrors and reflecting surfaces of the X-ray mirrors.

When employing three or four X-ray mirrors, the oblique-incidence angles of the X-rays in the X-ray mirrors and the positions of the optical axes of the X-rays finally outgoing from the X-ray mirrors can be independently controlled, whereby the degree of freedom in design of the X-ray exposure apparatus can be more enlarged.

When inserting the X-ray mirrors according to the present invention in the conventional X-ray exposure apparatus, it becomes possible to assemble the X-ray mirrors according to the present invention into the conventional X-ray exposure apparatus without changing the optical axis of general X-rays.

The changeable wavelength region of X-rays can be more widened by employing four X-ray mirrors than the case of employing two X-ray mirrors.

In the X-ray exposure apparatus according to the aforementioned one aspect, the outgoing direction of X-rays outgoing from the X-ray mirror finally reached by X-rays among the plurality of X-ray mirrors may be substantially identical to the incidence direction of X-rays incident upon the X-ray mirror initially reached by X-rays among the plurality of X-ray mirrors.

In this case, the oblique-incidence angles of the X-rays with respect to the X-ray mirrors can be controlled in a state substantially identically holding the incidence direction of the X-rays and the outgoing direction of the X-rays, whereby X-rays of arbitrary wavelengths can be obtained without changing the outgoing direction of the X-rays.

In the X-ray exposure apparatus according to the aforementioned one aspect, it may comprise a function of controlling the position of the X-ray mirror and a function of controlling the angle of a surface of the X-ray mirror upon which X-rays are incident and the incidence direction of the X-rays.

In this case, the angle (oblique-incidence angle) of the surface of the X-ray mirror upon which X-rays are incident and the incidence direction of the X-rays can be arbitrarily selected without changing the outgoing direction of the X-rays (in a state keeping the traveling direction of the X-rays constant). Consequently, X-rays having an arbitrary peak wavelength, from which X-rays of a shorter wavelength region are cut, can be obtained by controlling the oblique-incidence angle.

In the X-ray exposure apparatus according to the aforementioned one aspect, the outgoing optical axis of X-rays outgoing from the X-ray mirror finally reached by X-rays among the plurality of X-ray mirrors may be substantially identical to the incidence optical axis of X-rays incident upon the X-ray mirror initially reached by X-rays among the plurality of X-ray mirrors.

In this case, X-rays having a peak wavelength in a shorter wavelength region than general, from which X-rays of a shorter wavelength region are cut, can be obtained in a state rendering the incidence optical axis and the outgoing optical axis substantially identical.

In the X-ray exposure apparatus according to the aforementioned one aspect, it may comprise a function of controlling the position of the X-ray mirror and the angle of a surface of the X-ray mirror upon which X-rays are incident and the incidence direction of X-rays in a state keeping the outgoing optical axis substantially identical.

In this case, X-rays having an arbitrary peak wavelength, from which X-rays of a shorter wavelength region are cut, can be obtained by controlling the position of the X-ray mirror and the oblique incidence angle in a state keeping the incidence optical axis and the outgoing optical axis of the X-rays substantially identical.

In the X-ray exposure apparatus according to the aforementioned one aspect, it may be possible to change the peak wavelength of the X-rays outgoing from the X-ray mirror.

In this case, the peak wavelength of the X-rays can be controlled to be more suitable to the material for the X-ray mask, resolution required to the transferred circuit pattern, the characteristics of the resist and the like. Consequently, it becomes possible to accurately form a circuit pattern finer than general.

An X-ray mirror according to another aspect of the present invention contains a material having an absorption edge only in at least either one of a wavelength region of less than 0.45 nm and a wavelength region exceeding 0.7 nm as to X-rays.

Therefore, X-rays of a shorter wavelength region than a wavelength of about 0.75 nm having been employed in general can be obtained. Consequently, when employing the X-ray mirror according to the present invention in an X-ray exposure apparatus, X-rays of a shorter wavelength region than general can be utilized. Therefore, it becomes possible to transfer a circuit pattern of higher resolution than general.

The material forming the X-ray mirror according to the present invention has no absorption peak in a wavelength region of at least 0.45 nm and not more than 0.7 nm. Therefore, X-rays of the wavelength region of at least 0.45 nm and not more than 0.7 nm can be more reliably reflected than a conventional X-ray mirror, whereby sufficient irradiation strength for X-rays can be secured. Consequently, a high throughput can be attained.

Further, short-wave components can be added to general light intensity by spreading the wavelengths of X-rays employed for exposure to the shorter wavelength region. Therefore, the intensity of the X-rays can be enlarged, whereby a time required for an exposure step can be reduced. Consequently, a high throughput can be implemented more reliably than general.

The X-ray mirror according to the aforementioned another aspect may reflect X-rays included in radiation outgoing from a synchrotron radiation source.

The X-ray mirror according to the aforementioned another aspect may absorb at least 90% of X-rays in a wavelength region of less than 0.3 nm and cut shorter wavelengths.

When absorbance for X-rays of the wavelength region of less than 0.3 nm is at least 90% in this case, short-wave X-rays having wavelengths of less than 0.3 nm can be reliably prevented from mixing into exposure light. Consequently, generation of photoelectrons in resist can be effectively prevented in exposure with these short-wave X-rays. Thus, deterioration of resolution resulting from photoelectrons can be prevented.

The X-ray mirror according to the aforementioned another aspect may be capable of absorbing X-rays whose wavelengths are only less than 0.45 nm.

In this case, X-rays of a shorter wavelength region than a wavelength of about 0.75 nm having been employed in general can be obtained. Consequently, X-rays of a shorter wavelength region than general can be utilized when employing the X-ray mirror according to the present invention in an X-ray exposure apparatus. Consequently, it becomes possible to transfer a circuit pattern of higher resolution than general.

Further, X-rays of a shorter wavelength region are employed, whereby the energy of the X-rays also becomes larger than general. Consequently, irradiation strength for the X-rays also becomes larger than general, whereby the time required for the exposure step can be reduced. Consequently, a throughput higher than general can be readily implemented.

The X-ray mirror according to the aforementioned another aspect may contain a material having an absorption edge only in a wavelength region of less than 0.45 nm as to X-rays.

The X-ray mirror according to the aforementioned another aspect may contain a single type of mirror material selected from a group consisting of beryllium, titanium, silver, ruthenium, rhodium and palladium, nitrides, carbides and borides of these, diamond, diamond-like carbon and boron nitride.

In this case, the material forming the X-ray mirror according to the present invention has no absorption peak in the wavelength region of at least 0.45 nm and not more than 0.7 nm. Consequently, the X-ray mirror according to the present invention hardly absorbs X-rays of the wavelength region of at least 0.45 nm and not more than 0.7 nm. Therefore, X-rays of the aforementioned wavelength region can be more reliably reflected than the conventional X-ray mirror, whereby sufficient irradiation strength for X-rays can be secured. Consequently, a high throughput can be reliably obtained.

The X-ray mirror according to the aforementioned another aspect may comprise a substrate and a layer containing a mirror material formed on the substrate.

In this case, a large-sized X-ray mirror having an arbitrary complicated shape can be readily prepared by previously working the substrate into a spherical surface or another necessary shape required to the X-ray mirror.

The X-ray mirror according to the aforementioned another aspect may have a function of converging X-rays.

In this case, the X-ray mirror for cutting shorter wavelengths also has the function of converging X-rays, whereby the structure of an X-ray exposure apparatus comprising such an X-ray mirror can be more simplified.

The X-ray mirror according to the aforementioned another aspect may have a function of magnifying the area of a region capable of being simultaneously irradiated with X-rays.

In this case, the X-ray mirror for cutting shorter wavelengths also has the function as a magnifying mirror magnifying a projected region of X-rays outgoing from the X-ray mirror, whereby the structure of an X-ray exposure apparatus comprising such an X-ray mirror can be more simplified.

In the X-ray mirror according to the aforementioned another aspect, a surface upon which X-rays are incident may be mechanically polished.

In the X-ray mirror according to the aforementioned another aspect, a surface upon which X-rays are incident may be chemically polished.

An X-ray exposure method according to still another aspect of the present invention comprises an X-ray incidence step of making X-rays incident upon an X-ray mirror containing a material having an absorption edge only in at least either one of a wavelength region of less than 0.45 nm and a wavelength region exceeding 0.7 nm as to X-rays and an exposure step of performing exposure with X-rays outgoing from the said X-ray mirror.

In this case, X-rays of a shorter wavelength region than the wavelength of about 0.75 nm having been employed in general can be utilized. Therefore, it becomes possible to transfer a circuit pattern of higher resolution than general.

Further, the material forming the X-ray mirror in the present invention has no absorption peak in a wavelength region of at least 0.45 nm and not more than 0.7 nm. Therefore, X-rays of the wavelength region of at least 0.45 nm and not more than 0.7 nm can be more reliably reflected than a conventional X-ray mirror, whereby sufficient irradiation strength for X-rays can be secured. Consequently, a high throughput can be reliably obtained.

Further, short-wave components can be added to general light intensity by spreading the wavelengths of X-rays employed for exposure to the shorter wavelength region. Therefore, the intensity of the X-rays can be enlarged, whereby the time required for the exposure step can be reduced. Consequently, a high throughput can be implemented more reliably than general.

The X-ray exposure method according to the aforementioned still another aspect may further comprise an X-ray outgoing step of making the X-rays outgo from a synchrotron radiation source.

In the X-ray exposure method according to the aforementioned still another aspect, the X-ray mirror may include an X-ray mirror for cutting shorter wavelengths, absorbing at least 90% of X-rays in a wavelength region of less than 0.3 nm.

In this case, short-wave X-rays having wavelengths of less than 0.3 nm can be reliably prevented from mixing into exposure light. Consequently, generation of photoelectrons in resist can be effectively prevented in exposure with these short-wave X-rays. Therefore, deterioration of resolution resulting from photoelectrons can be prevented.

In the X-ray exposure method according to the aforementioned still another aspect, the X-ray mirror may be an X-ray mirror for cutting shorter wavelengths absorbing X-rays whose wavelengths are only less than 0.45 nm.

In this case, X-rays of a shorter wavelength region can be utilized than a conventional X-ray exposure method having utilized X-rays whose wavelengths are larger than 0.7 nm. Consequently, the wavelengths of X-rays employed for exposure reduce, whereby a circuit pattern having higher resolution than general can be transferred.

The wavelengths of the X-rays reduce so that irradiation strength for the X-rays can be enlarged, whereby a higher throughput than general can be obtained.

In the X-ray exposure method according to the aforementioned still another aspect, the X-ray mirror may contain a material having an absorption edge only in a wavelength region of less than 0.45 nm as to X-rays.

In the X-ray exposure method according to the aforementioned still another aspect, the X-ray mirror may contain a single type of mirror material selected from a group consisting of beryllium, titanium, silver, ruthenium, rhodium and palladium, nitrides, carbides and borides of these, diamond, diamond-like carbon and boron nitride.

In this case, the X-ray mirror employed in the X-ray exposure method according to the present invention has no absorption edge in a wavelength region of at least 0.45 nm. Consequently, no such an absorption peak that X-rays are absorbed by the X-ray mirror is present in the wavelength region of at least 0.45 nm, whereby irradiation strength for X-rays can be more reliably secured.

In the X-ray exposure method according to the aforementioned still another aspect, the X-ray mirror may comprise a substrate and a layer containing a mirror material formed on the substrate.

In this case, the substrate can be previously worked into a shape required to the X-ray mirror, whereby an X-ray mirror of a complicated shape can be readily obtained.

In the X-ray exposure method according to the aforementioned still another aspect, the X-ray incidence step may include a step of converging X-rays with the X-ray mirror.

In this case, a step of cutting shorter wavelengths and the step of converging X-rays can be simultaneously performed with the X-ray mirror, whereby the structure of an X-ray exposure apparatus carrying out the X-ray exposure method according to the present invention can be simplified.

In the X-ray incidence method according to the aforementioned still another aspect, the X-ray incidence step may include a step of magnifying the area of a region capable of being simultaneously irradiated with X-rays outgoing from the X-ray mirror with the X-ray mirror.

In this case, the X-ray mirror has both the shorter wavelength cutting function and the function of magnifying the area of the region capable of being simultaneously irradiated with X-rays, whereby the structure of the X-ray exposure apparatus carrying out the X-ray exposure method according to the present invention can be simplified.

In the X-ray exposure method according to the aforementioned still another aspect, the X-ray incidence step may include a step of further converging X-rays with a converging mirror.

Therefore, the X-ray mirror for cutting shorter wavelengths and the converging mirror are independently employed, whereby the X-ray exposure method according to the present invention can be readily executed by inserting the X-ray mirror according to the present invention in a conventional X-ray exposure apparatus.

In the X-ray exposure method according to the aforementioned still another aspect, the X-ray incidence step may include a step of magnifying the area of the region capable of being simultaneously irradiated with X-rays using magnifying mirror.

In this case, the X-ray mirror for cutting shorter wavelengths and the magnifying mirror are independently employed, whereby the X-ray exposure method according to the present invention can be readily executed by inserting the X-ray mirror according to the present invention in an X-ray exposure apparatus in which the conventional X-ray exposure method has been performed.

In the X-ray exposure method according to the aforementioned still another aspect, it may employ an X-ray mirror whose surface upon which X-rays are incident is mechanically polished in the X-ray incidence step.

In the X-ray exposure method according to the aforementioned still another aspect, it may employ a X-ray mirror whose surface upon which X-rays are incident is chemically polished in the X-ray incidence step.

In the X-ray exposure method according to the aforementioned still another aspect, it may employ an X-ray mask, and this X-ray mask may include a membrane and an X-ray absorber formed on the membrane. The membrane may contain a single species selected from a group consisting of diamond, diamond-like carbon, boron nitride and beryllium.

At this point, the material employed in the membrane of the X-ray mask according to the present invention has no absorption edge in a wavelength region around 0.67 nm, dissimilarly to a silicon-based material having been employed for a conventional membrane. In the case of employing X-rays having wavelengths of not more than 0.7 nm which is a shorter wavelength region than general in the exposure step, therefore, these X-rays can be prevented from being absorbed in the membrane. Consequently, a sufficient quantity of exposure can be secured. Therefore, transmittance for X-rays in the membrane can be increased than the case of employing a conventional X-ray mask, whereby a high throughput can be secured.

In the X-ray exposure method according to the aforementioned still another aspect, it may employ an X-ray mask, and this X-ray mask may include a membrane and an X-ray absorber formed on the membrane. The membrane may contain a material having an absorption edge only in at least either one of a wavelength region of less than 0.45 nm and a wavelength region exceeding 0.7 nm as to X-rays, and the X-ray absorber may contain a material having an absorption edge in a wavelength region of at least 0.6 nm and less than 0.85 nm.

In this case, the material contained in the membrane has no absorption edge in the wavelength region of at least 0.45 nm and not more than 0.7 nm, whereby X-rays of such a shorter wavelength region than general can be effectively utilized in the X-ray exposure step.

While absorbance for X-rays exhibits a peak value at the absorption edge wavelength of the material, absorbance for X-rays reaches a sufficiently large value also in a wavelength region of about 0.15 nm around this absorption edge wavelength. When the X-ray absorber contains the material having an absorption edge in the wavelength region of at least 0.6 nm and less than 0.85 nm, therefore, X-rays employed for exposure can be reliably screened with this X-ray absorber in the wavelength region (at least 0.45 nm and not more than 0.7 nm) of the X-rays employed for exposure. Further, the material having an absorption edge in such a wavelength region is employed as the X-ray absorber, whereby the thickness of the X-ray absorber can be reduced. Consequently, the aspect ratio of a transfer circuit pattern formed by the X-ray absorber can be reduced. Therefore, a fine circuit pattern can be reliably transferred with X-rays of a shorter wavelength region than general.

In the X-ray exposure method according to the aforementioned still another aspect, the X-ray absorber may contain a single species selected from a group consisting of tungsten, tantalum and rhenium.

In the X-ray exposure method according to the aforementioned still another aspect, the X-ray absorber may include stacked first layer and second layer.

In this case, a plurality of layers are formed in the X-ray absorber, whereby the degree of freedom of the material employed as the X-ray absorber can be more increased. When forming the X-ray absorber by combining materials whose absorption peak wavelengths for X-rays are different, X-rays can be reliably screened with an X-ray absorber of a smaller thickness than the case of forming the X-ray absorber with a single material.

In the X-ray exposure method according to the aforementioned still another aspect, a first material contained in the first layer may have a larger atomic weight than the atomic weight of a second material contained in the second layer.

A heavy element such as molybdenum or rhodium whose atomic weight is relatively large may be employed as the first material, while it is preferable to employ a light element such as carbon or beryllium whose atomic weight is relatively low as the second material. Thus, the thickness of the X-ray absorber can be more reduced by employing materials whose absorption peak wavelengths for X-rays are different.

In the X-ray exposure method according to the aforementioned still another aspect, it may employ a plurality of X-ray mirrors in the X-ray incidence step.

In this case, the degree of freedom at the time of designing X-ray oblique-incidence angles or outgoing optical axes in the X-ray mirrors can be enlarged by employing a plurality of X-ray mirrors.

Further, X-rays of a shorter wavelength region can be more reliably cut by employing a plurality of X-ray mirrors.

In the X-ray exposure method according to the aforementioned still another aspect, it may employ at least two and not more than four X-ray mirrors in the X-ray incidence step.

In the case of employing two X-ray mirrors in this case, for example, the oblique-incidence angles of X-rays with respect to the X-ray mirrors can be arbitrarily set in a state keeping the outgoing direction of the X-rays from the X-ray mirrors constant by controlling the positions of the X-ray mirrors and the oblique-incidence angles of the X-rays with respect to the X-ray mirrors.

When employing the X-ray mirrors by three or four, the oblique-incidence angles of the X-rays with respect to the X-ray mirrors can be controlled without changing the optical axes of the X-rays. Therefore, it becomes possible to readily carry out the X-ray exposure method according to the present invention by inserting the X-ray mirrors according to the present invention in an X-ray exposure apparatus in which the conventional X-ray exposure method has been performed.

When increasing the number of the X-ray mirror to three or four, the width of a wavelength region capable of controlling the peak wavelength of X-rays can be rendered broader.

In the X-ray exposure method according to the aforementioned still another aspect, the outgoing direction of X-rays outgoing from the X-ray mirror finally reached by X-rays among the plurality of X-ray mirrors may be substantially identical to the incidence direction of X-rays incident upon the X-ray mirror initially reached by X-rays among the plurality of X-ray mirrors in the X-ray incidence step.

In this case, X-rays having an arbitrary peak wavelength can be obtained in a state rendering the outgoing direction of the X-rays substantially identical to the incidence direction by controlling the positions of the X-ray mirrors and the angles with respect to the X-rays.

In the X-ray exposure method according to the aforementioned still another aspect, the X-ray incidence step may include a step of controlling the position of the X-ray mirror and a step of controlling the angle of a surface of the X-ray mirror upon which X-rays are incident and the incidence direction of the X-rays.

In this case, X-rays having an arbitrary peak wavelength can be more reliably obtained in a state keeping the outgoing direction and the incidence direction of the X-rays substantially identical.

Further, the peak wavelength of the X-rays can be controlled by controlling the angle (oblique-incidence angle) of the surface of the X-ray mirror upon which X-rays are incident and the incidence direction of the X-rays.

In the X-ray exposure method according to the aforementioned still another aspect, the outgoing optical axis of X-rays outgoing from the X-ray mirror finally reached by X-rays among the plurality of X-ray mirrors may be substantially identical to the incidence optical axis of X-rays incident upon the X-ray mirror initially reached by X-rays among the plurality of X-ray mirrors in the X-ray incidence step.

In this case, X-rays having an arbitrary peak wavelength can be obtained when controlling the oblique-incidence angles of the X-rays with respect to the X-ray mirrors in a state rendering the outgoing optical axis and the incidence optical axis of the X-rays substantially identical.

In the X-ray exposure method according to the aforementioned still another aspect, it may include a step of controlling the position of the X-ray mirror in a state keeping the outgoing optical axis substantially identical and a step of controlling the angle of the surface of the X-ray mirror upon which X-rays are incident and the incidence direction of the X-rays in the X-ray incidence step.

In this case, X-rays having an arbitrary peak wavelength can be readily obtained in the state keeping the outgoing optical axis substantially identical.

In the X-ray exposure method according to the aforementioned still another aspect, the X-ray incidence step may further comprise a step of changing the peak wavelength of the X-rays outgoing from the X-ray mirror.

In this case, the peak wavelength of the X-rays can be controlled to be suitable to the X-ray mask employed in the X-ray exposure method, resolution required to a transfer circuit pattern and the characteristics of resist applied onto a semiconductor substrate. Consequently, a circuit pattern of higher resolution can be reliably transferred.

A synchrotron radiation apparatus according to a further aspect of the present invention comprises a synchrotron radiation source and an X-ray mirror group including a plurality of X-ray mirrors upon which radiation outgoing from the synchrotron radiation source is incident. The X-ray mirrors contain a material having an absorption edge only in at least either one of a wavelength region of less than 0.45 nm and a wavelength region exceeding 0.7 nm as to X-rays, and the outgoing direction of the radiation outgoing from the synchrotron radiation source and the outgoing direction of reflected light outgoing from the X-ray mirror group are substantially identical.

Therefore, synchrotron radiation can be readily obtained including X-rays of a shorter wavelength region than the wavelength of about 0.75 nm having been considered as employed for X-ray exposure in general. Consequently, radiation (X-rays) of a shorter wavelength region than general can be utilized when applying the synchrotron radiation apparatus according to the present invention to an X-ray exposure apparatus. Therefore, it becomes possible to transfer a circuit pattern of higher resolution than general.

Further, the material forming the X-ray mirrors of the synchrotron radiation apparatus according to the present invention has no absorption peak in a wavelength region of at least 0.45 nm and not more than 0.7 nm. Therefore, X-rays of the wavelength region of at least 0.45 nm and not more than 0.7 nm can be more reliably reflected than conventional X-ray mirrors, whereby sufficient irradiation strength for X-rays can be secured. Consequently, a high throughput can be attained when applying the synchrotron radiation apparatus according to the present invention to an X-ray exposure apparatus. Further, short-wave components can be added to general light intensity by spreading the wavelengths of X-rays employed for exposure to a shorter wavelength region. Therefore, the intensity of the X-rays can be enlarged, whereby a time required for an exposure step can be reduced. Consequently, a high throughput can be implemented more reliably than general.

When controlling the oblique-incidence angles of X-rays with respect to the X-ray mirrors in a state holding the outgoing direction of radiation from the synchrotron radiation source and the outgoing direction of reflected light from the X-ray mirror group substantially identical, X-rays of arbitrary wavelengths can be obtained.

In the synchrotron radiation apparatus according to the aforementioned further aspect, the outgoing optical axis of the radiation outgoing from the synchrotron radiation source and the outgoing optical axis of reflected light outgoing from the X-ray mirror group may be substantially identical.

In this case, radiation (X-rays) having a peak wavelength in a shorter wavelength region than general, from which X-rays of a shorter wavelength region are cut, can be obtained in the state holding the outgoing optical axis of the radiation from the synchrotron radiation source and the outgoing optical axis of the radiation from the X-ray mirror group substantially identical.

In the synchrotron radiation apparatus according to the aforementioned further aspect, the X-ray mirrors may contain beryllium as a mirror material. Further, the X-ray mirrors may include three plane mirrors.

In the synchrotron radiation apparatus according to the aforementioned further aspect, the X-ray mirrors may contain rhodium as a mirror material.

In the synchrotron radiation apparatus according to the aforementioned further aspect, the X-ray mirrors may include three plane mirrors containing beryllium as well as a magnifying mirror and a converging mirror containing rhodium.

A synchrotron radiation method according to a further aspect of the present invention is a synchrotron radiation method employing a synchrotron radiation apparatus comprising a synchrotron radiation source and an X-ray mirror group including a plurality of X-ray mirrors upon which radiation outgoing from the synchrotron radiation source is incident, and comprises a radiation incidence step of making radiation outgoing from the synchrotron radiation source incident upon the X-ray mirrors containing a material having an absorption edge only in at least either one of a wavelength region of less than 0.45 nm and a wavelength region exceeding 0.7 nm as to X-rays and a reflected light emitting step of emitting reflected light from the X-ray mirror group in a direction substantially identical to the outgoing direction of the radiation outgoing from the synchrotron radiation source.

Therefore, synchrotron radiation including X-rays of a shorter wavelength region than the wavelength of about 0.75 nm having been considered as employed for X-ray exposure in general can be readily obtained. Consequently, radiation (X-rays) of a shorter wavelength region than general can be utilized when applying the synchrotron radiation method according to the present invention to an X-ray exposure step. Therefore, it becomes possible to transfer a circuit pattern of higher resolution than general.

Further, the material forming the X-ray mirrors in the synchrotron radiation method according to the present invention has no absorption peak in a wavelength region of at least 0.45 nm and not more than 0.7 nm. Therefore, X-rays in the wavelength region of at least 0.45 nm and not more than 0.7 nm can be more readily reflected than conventional X-ray mirrors, whereby sufficient irradiation strength for X-rays can be secured. Consequently, a high throughput can be attained when applying the synchrotron radiation method according to the present invention to an X-ray exposure step. Further, short-wave components can be added to general light intensity by spreading the wavelengths of X-rays employed for exposure to the shorter wavelength region. Therefore, the intensity of the X-rays can be enlarged, whereby a time required for the exposure step can be reduced. Consequently, a high throughput can be implemented more reliably than general.

Further, X-rays of arbitrary wavelengths can be obtained when controlling the oblique-incidence angles of the X-rays with respect to the X-ray mirrors in a state holding the outgoing direction of the radiation from the synchrotron radiation source and the outgoing direction of the reflected light from the X-ray mirror group substantially identical.

In the synchrotron radiation method according to the aforementioned further aspect, the outgoing optical axis of the radiation outgoing from the synchrotron radiation source and the outgoing optical axis of the reflected light outgoing from the X-ray mirror group may be substantially identical.

In this case, radiation (X-rays) having a peak wavelength in a shorter wavelength region than general, from which X-rays of a shorter wavelength region are cut, can be readily obtained in a state holding the outgoing optical axis of the radiation from the synchrotron radiation source and the outgoing optical axis of the reflected light from the X-ray mirror group substantially identical.

An X-ray mask according to a further aspect of the present invention comprises a membrane and an X-ray absorber formed on the membrane. The membrane contains a material having an absorption edge only in at least either one of a wavelength region of less than 0.45 nm and a wavelength region exceeding 0.7 nm as to X-rays, and the X-ray absorber contains a material having an absorption edge in a wavelength region of at least 0.6 nm and less than 0.85 nm.

At this point, a conventional X-ray mask mainly employed silicon-based materials. These silicon-based materials had absorption edges in a wavelength region around 0.67 nm. When employing X-rays of a wavelength region of not more than 0.7 nm as exposure light for X-ray exposure, therefore, it has been difficult to attain sufficient irradiation strength.

In the X-ray mask according to the present invention, however, more sufficient irradiation strength than the conventional X-ray mask can be attained when employing X-rays of not more than 0.7 nm, by employing a material having no absorption edge in the wavelength region of at least 0.45 nm and not more than 0.7 nm as the membrane. Consequently, a high throughput can be implemented.

Further, a sufficient contrast can be attained by employing a material having an absorption edge in the wavelength region of at least 0.6 nm and less than 0.85 nm, more preferably a material having an absorption edge on a slightly longer wavelength side than a peak exposure wavelength as the X-ray absorber, also when reducing the thickness of the X-ray absorber in a principal exposure wavelength region. This is for the following reason: That is, while absorbance for X-rays exhibits a peak value at the absorption edge wavelength of the material, the absorbance for X-rays reaches a sufficiently large value also in a wavelength region of about 0.15 nm around this absorption edge wavelength. When the X-ray absorber contains a material having an absorption edge in the wavelength region of at least 0.6 nm and less than 0.85 nm, therefore, X-rays employed for exposure can be reliably screened with this X-ray absorber in the wavelength region (at least 0.45 nm and not more than 0.7 nm) of X-rays employed for exposure. Consequently, the thickness of the X-ray absorber can be reduced. Consequently, the aspect ratio of a transfer circuit pattern formed by the X-ray absorber can be reduced. Therefore, influence by a waveguide effect or the like can be reduced, whereby a circuit pattern of high resolution can be transferred.

In the X-ray mask according to the aforementioned further aspect, the X-ray absorber may contain a single species selected from a group consisting of tungsten, tantalum and rhenium.

In the X-ray mask according to the aforementioned further aspect, the membrane may contain a single species selected from a group consisting of diamond, diamond-like carbon, boron nitride and beryllium.

By employing a material such as diamond having no absorption edge in the wavelength region of at least 0.45 nm and not more than 0.7 nm as the membrane in this case, more sufficient irradiation strength can be obtained than a conventional X-ray mask when employing X-rays of not more than 0.7 nm as exposure light. Consequently, a high throughput can be implemented.

In the X-ray mask according to the aforementioned further aspect, the X-ray absorber may include a first layer and a second layer formed on the first layer.

In this case, a plurality of materials can be employed as the X-ray absorber by structuring the X-ray absorber by a plurality of layers. Therefore, the degree of freedom in design of the X-ray mask can be enlarged.

When employing materials whose absorption peak wavelengths for X-rays are different respectively as the X-ray absorber, X-rays of a necessary wavelength region can be screened with a smaller thickness than the case of employing a single material as the X-ray absorber. Consequently, the thickness of the X-ray absorber can be reduced than general.

An X-ray exposure apparatus according to a further aspect of the present invention includes the X-ray mask according to the aforementioned further aspect.

Therefore, X-rays of not more than 0.7 nm can be effectively utilized as exposure light, whereby a circuit pattern of high resolution can be transferred while a high throughput can be implemented at the same time.

A semiconductor device according to a further aspect of the present invention is manufactured with the X-ray exposure method according to the aforementioned further aspect.

When employing the X-ray exposure method according to the present invention as described above in this case, a circuit pattern of higher resolution than general can be transferred, whereby a semiconductor device more highly integrated than general can be obtained.

A synchrotron radiation apparatus according to a further aspect of the present invention comprises an X-ray mirror containing a material having an absorption edge only in at least either one of a wavelength region of less than 0.45 nm and a wavelength region exceeding 0.7 nm as to X-rays.

In this case, X-rays of a shorter wavelength region than the wavelength of about 0.75 nm having been employed for X-ray exposure or the like in general can be obtained. Consequently, X-rays of a shorter wavelength region than general can be utilized when employing the synchrotron radiation apparatus according to the present invention in an X-ray exposure apparatus. Therefore, it becomes possible to transfer a circuit pattern of higher resolution than general.

Further, the material forming the X-ray mirror according to the present invention has no absorption peak in a wavelength region of at least 0.45 nm and not more than 0.7 nm. Therefore, X-rays in the wavelength region of at least 0.45 nm and not more than 0.7 nm can be more reliably reflected than a conventional X-ray mirror, whereby sufficient irradiation strength for X-rays can be secured. Consequently, a high throughput can be attained in an X-ray exposure step.

In addition, short-wave components can be added to general light intensity by spreading the wavelengths of X-rays employed for exposure to the shorter wavelength region. Therefore, the intensity of the X-rays can be enlarged, whereby the time required for the exposure step can be reduced. Consequently, a high throughput can be implemented more reliably than general.

In the synchrotron radiation apparatus according to the aforementioned further aspect, the X-ray mirror may be an X-ray mirror for cutting shorter wavelengths absorbing at least 90% of X-rays of a wavelength region of less than 0.3 nm.

When absorbance for X-rays of the wavelength region of less than 0.3 nm is at least 90% in this case, short-wave X-rays having wavelengths of less than 0.3 nm can be reliably prevented from mixing into exposure light when employing the synchrotron radiation apparatus according to the present invention for X-ray exposure. Consequently, generation of photoelectrons in resist can be effectively prevented in exposure with these short-wave X-rays. Therefore, deterioration of resolution resulting from photoelectrons can be prevented.

The synchrotron radiation apparatus according to the aforementioned further aspect of the present invention may be such that the said X-ray mirror is an X-ray mirror for cutting shorter wavelengths absorbing X-rays whose wavelengths are only less than 0.45 nm.

In this case, X-rays of a shorter wavelength region than the wavelength of about 0.75 nm having been employed in general can be obtained. Consequently, X-rays of a shorter wavelength region than general can be utilized when employing the X-ray mirror according to the present invention in the synchrotron radiation apparatus. Therefore, when applying the synchrotron radiation apparatus according to the present invention to an X-ray exposure apparatus, it becomes possible to transfer a circuit pattern of higher resolution than general.

In the synchrotron radiation apparatus according to the aforementioned further aspect, the aforementioned X-ray mirror may contain a material having an absorption edge only in a wavelength region of less than 0.45 nm as to X-rays.

In the synchrotron radiation apparatus according to the aforementioned further aspect, the X-ray mirror may contain a single type of mirror material selected from a group consisting of beryllium, titanium, silver, ruthenium, rhodium and palladium, nitrides, carbides and borides of these, diamond, diamond-like carbon and boron nitride.

In this case, the material forming the X-ray mirror according to the present invention has no absorption peak in a wavelength region of at least 0.45 nm and not more than 0.7 nm. Consequently, the X-ray mirror according to the present invention hardly absorbs X-rays of the wavelength region of at least 0.45 nm and not more than 0.7 nm. Therefore, X-rays of the wavelength region of at least 0.45 nm and not more than 0.7 nm can be more reliably reflected than a conventional X-ray mirror, whereby sufficient irradiation strength for X-rays can be secured. Consequently, a high throughput can be reliably attained.

In the synchrotron radiation apparatus according to the aforementioned further aspect, the X-ray mirror may comprise a substrate and a layer containing a mirror material formed on the substrate.

By employing a material easy to work as the substrate in this case, this substrate can be previously subjected to working into a shape such as a spherical surface necessary for the X-ray mirror. Consequently, a large-sized X-ray mirror having a complicated shape can be readily prepared.

In the synchrotron radiation apparatus according to the aforementioned further aspect, the X-ray mirror may have a function of converging X-rays.

In this case, the X-ray mirror for cutting shorter wavelengths also has the function of converging X-rays, whereby the structure of the synchrotron radiation apparatus can be more simplified.

In the synchrotron radiation apparatus according to the aforementioned further aspect, the X-ray mirror may have a function of magnifying the area of a region capable of being simultaneously irradiated with X-rays outgoing from the X-ray mirror.

In this case, the X-ray mirror for cutting shorter wavelengths also has the function as a magnifying mirror magnifying a projected region of the X-rays outgoing from the X-ray mirror, whereby the structure of the synchrotron radiation apparatus can be more simplified.

In the synchrotron radiation apparatus according to the aforementioned further aspect, it may further comprise a converging mirror converging X-rays.

In this case, the converging mirror and the X-ray mirror for cutting shorter wavelengths can be separately adjusted, whereby finer setting can be performed.

Further, it employs the structure separately comprising the converging mirror and the X-ray mirror for cutting shorter wavelengths in this manner, whereby it becomes possible to readily modify a conventional synchrotron radiation apparatus to the synchrotron radiation apparatus according to the present invention by inserting this X-ray mirror for cutting shorter wavelengths in the conventional synchrotron radiation apparatus. Consequently, when employing the synchrotron radiation apparatus according to the present invention to an X-ray exposure apparatus, X-rays of a shorter wavelength region than general can be employed as exposure light, while the cost for implementing the synchrotron radiation apparatus according to the present invention can be reduced at the same time.

In the synchrotron radiation apparatus according to the aforementioned further aspect, it may further comprise a magnifying mirror having a function of magnifying the area of a region capable of being simultaneously irradiated with X-rays outgoing from the X-ray mirror.

In this case, the magnifying mirror and the X-ray mirror for cutting shorter wavelengths can be separately adjusted, whereby finer setting can be performed.

Further, it employs the structure separately comprising the magnifying mirror and the X-ray mirror for cutting shorter wavelengths, whereby the synchrotron radiation apparatus according to the present invention can be readily implemented by inserting the X-ray mirror for cutting shorter wavelengths according to the present invention in the conventional synchrotron radiation apparatus. Consequently, the cost for implementing the synchrotron radiation apparatus according to the present invention can be reduced.

In the synchrotron radiation apparatus according to the aforementioned further aspect, a surface of the X-ray mirror upon which X-rays are incident may be mechanically polished.

In the synchrotron radiation apparatus according to the aforementioned further aspect, a surface of the X-ray mirror upon which X-rays are incident may be chemically polished.

The synchrotron radiation apparatus according to the aforementioned further aspect may further comprise an X-ray mask. The X-ray mask may include a membrane and an X-ray absorber formed on the membrane. The membrane may contain a single species selected from a group consisting of diamond, diamond-like carbon, boron nitride and beryllium.

In this case, the material employed as the membrane of the X-ray mask according to the present invention has no absorption edge in a wavelength region around 0.67 nm dissimilarly to a silicon-based material having been employed as a conventional membrane, whereby total transmittance for X-rays in a wavelength region of at least 0.45 nm can be rendered higher than general. Consequently, when applying the synchrotron radiation apparatus according to the present invention to an X-ray exposure apparatus, the time required for the exposure step can be more reliably reduced than general, whereby the throughput of the exposure step can be rendered higher than general.

In the synchrotron radiation apparatus according to the aforementioned further aspect, it may comprise an X-ray mask, and the X-ray mask may include a membrane and an X-ray absorber formed on the membrane. The membrane may contain a material having an absorption edge only in at least either one of a wavelength region of less than 0.45 nm and a wavelength region exceeding 0.7 nm as to X-rays, and the X-ray absorber may contain a material having an absorption edge in a wavelength region of at least 0.6 nm and less than 0.85 nm.

In this case, the material contained in the membrane has no absorption edge in a wavelength region of at least 0.45 nm and not more than 0.7 nm, whereby X-rays of a shorter wavelength region than general can be effectively utilized in an X-ray exposure step when applying the synchrotron radiation apparatus according to the present invention to an X-ray exposure apparatus.

While the absorbance for X-rays exhibits a peak value at the absorption edge wavelength of the material, the absorbance for X-rays reaches a sufficiently large value also in a wavelength region of 0.15 nm around this absorption edge wavelength. Therefore, when the X-ray absorber contains a material having an absorption edge in the wavelength region of at least 0.6 nm and less than 0.85 nm, X-rays employed for exposure can be reliably screened with this X-ray absorber in the wavelength region (at least 0.45 nm and not more than 0.7 nm) of the X-rays employed for exposure. Further, the material having an absorption edge in such a wavelength region is employed as the X-ray absorber, whereby the thickness of the X-ray absorber can be reduced. Consequently, the aspect ratio of a transfer circuit pattern formed by the X-ray absorber can be reduced. Therefore, a fine circuit pattern can be reliably transferred with X-rays of a shorter wavelength region than general when applying the synchrotron radiation apparatus according to the present invention to an X-ray exposure apparatus.

In the synchrotron radiation apparatus according to the aforementioned further aspect, the X-ray absorber may contain a single species selected from a group consisting of tungsten, tantalum and rhenium.

In the synchrotron radiation apparatus according to the aforementioned further aspect, the X-ray absorber may include stacked first layer and second layer.

In this case, the X-ray absorber is structured by a plurality of layers, whereby the degree of freedom in selection of the material employed as the X-ray absorber can be enlarged.

Further, a plurality of materials whose absorption peak wavelengths are different as to X-rays can be employed as the X-ray absorber, whereby it becomes possible to more reduce the thickness of the X-ray absorber in the case where X-rays of a wide wavelength region must be absorbed than the case of forming a single-layer X-ray absorber employing a single material.

In the synchrotron radiation apparatus according to the aforementioned further aspect, a first material contained in the first layer may have a larger atomic weight than the atomic weight of a second material contained in the second layer.

In this case, the absorption peak wavelength for X-rays can be varied with each layer by including elements whose atomic weights are different as the first and second materials and forming a plurality of layers, whereby X-rays can be reliably absorbed over a wider wavelength range.

A heavy element such as molybdenum or rhodium whose atomic weight is large may be employed as the first material. Further, a light element such as carbon or beryllium whose atomic weight is small may be employed as the second material.

Thus, X-rays can be more reliably absorbed by forming the X-ray absorber stacking a heavy element and a light element. When rendering screenability for X-rays substantially equivalent, therefore, the thickness of the X-ray absorber can be rendered smaller than general. Consequently, the aspect ratio of a transfer pattern formed on the X-ray absorber can be reduced. The aspect ratio can be thus reduced, whereby the transfer pattern can be readily formed and high transfer accuracy can be implemented at the same time when applying the synchrotron radiation apparatus according to the present invention to an X-ray exposure apparatus.

The synchrotron radiation apparatus according to the aforementioned further aspect may comprise a plurality of X-ray mirrors.

In this case, the degree of freedom at the time of designing the synchrotron radiation apparatus such as setting of optical axes of X-rays employed for exposure can be enlarged. Further, short-wave X-rays can be more reliably removed from X-rays employed for exposure by employing a plurality of X-ray mirrors for cutting shorter wavelengths.

In the synchrotron radiation apparatus according to the aforementioned further aspect, it may comprise the X-ray mirrors by at least two and not more than four.

In the case of employing two X-ray mirrors in this case, the traveling direction of X-rays before entering these two X-ray mirrors and the traveling direction of X-rays finally outgoing from the two X-ray mirrors can be rendered substantially parallel by adjusting the oblique-incidence angles of the X-rays in these X-ray mirrors. Further, the peak wavelength of the X-rays employed for exposure can be controlled by controlling the angles of the incidence direction of the X-rays with respect to the X-ray mirrors and reflecting surfaces of the X-ray mirrors.

When employing three or four X-ray mirrors, the oblique-incidence angles of the X-rays in the X-ray mirrors and the positions of the optical axes of the X-rays finally outgoing from the X-ray mirrors can be independently controlled, whereby the degree of freedom in design of the synchrotron radiation apparatus can be more enlarged.

When inserting the X-ray mirrors according to the present invention in a conventional synchrotron radiation apparatus, it becomes possible to assemble the X-ray mirrors according to the present invention into the conventional synchrotron radiation apparatus without changing the optical axis of general X-rays.

The changeable wavelength region of X-rays can be more widened rather by employing four X-ray mirrors than the case of employing two X-ray mirrors.

In the synchrotron radiation apparatus according to the aforementioned further aspect, the outgoing direction of X-rays outgoing from the X-ray mirror finally reached by X-rays among the plurality of X-ray mirrors may be substantially identical to the incidence direction of X-rays incident upon the X-ray mirror initially reached by X-rays among the plurality of X-ray mirrors.

In this case, the oblique-incidence angles of the X-rays with respect to the X-ray mirrors can be controlled in a state substantially identically holding the incidence direction of the X-rays and the outgoing direction of the X-rays, whereby X-rays of arbitrary wavelengths can be obtained without changing the outgoing direction of the X-rays.

In the synchrotron radiation apparatus according to the aforementioned further aspect, it may comprise a function of controlling the position of the X-ray mirror and a function of controlling the angle of a surface of the X-ray mirror upon which X-rays are incident and the incidence direction of the X-rays.

In this case, the angle (oblique-incidence angle) of the surface of the X-ray mirror upon which X-rays are incident and the incidence angle of the X-rays can be arbitrarily selected without changing the outgoing direction of the X-rays (in a state keeping the traveling direction of the X-rays constant). Consequently, X-rays having an arbitrary peak wavelength, from which X-rays of a shorter wavelength region are cut, can be obtained by controlling the oblique-incidence angle.

In the synchrotron radiation apparatus according to the aforementioned further aspect, the outgoing optical axis of X-rays outgoing from the X-ray mirror finally reached by the X-rays among the plurality of X-ray mirrors may be substantially identical to the incidence optical axis of X-rays incident upon the X-ray mirror initially reached by the X-rays among the plurality of X-ray mirrors.

In this case, X-rays having a peak wavelength in a shorter wavelength region than general, from which X-rays of the shorter wavelength region are cut, can be obtained in a state rendering the incidence optical axis and the outgoing optical axis substantially identical.

In the synchrotron radiation apparatus according to the aforementioned further aspect, it may comprise a function of controlling the position of the X-ray mirror in a state keeping the outgoing optical axis substantially identical and a function of controlling the angle of a surface of the X-ray mirror upon which X-rays are incident and the incidence direction of the X-rays.

In this case, X-rays having an arbitrary peak wavelength, from which X-rays of a shorter wavelength region are cut, can be readily obtained by controlling the position of the X-ray mirror and the oblique-incidence angle in a state keeping the incidence optical axis and the outgoing optical axis of the X-rays substantially identical.

In the synchrotron radiation apparatus according to the aforementioned further aspect, it may be possible to change the peak wavelength of X-rays outgoing from the X-ray mirror.

In this case, the peak wavelength of the X-rays can be controlled to be more suitable to the material for the X-ray mask, resolution required to the transferred circuit pattern, the characteristics of resist and the like. Consequently, it becomes possible to accurately form a finer circuit pattern than general.

A synchrotron radiation method according to a further aspect of the present invention comprises an X-ray emitting step of emitting X-rays from a synchrotron radiation source and an X-ray incidence step of making the said X-rays in an X-ray mirror containing a material having an absorption edge only in at least either one of a wavelength region of less than 0.45 nm and a wavelength region exceeding 0.7 nm as to X-rays.

In this case, X-rays of a shorter wavelength region than the wavelength of about 0.75 nm having been employed in general can be taken out from the synchrotron radiation source, whereby X-rays of this shorter wavelength region can be readily utilized in an X-ray exposure step. Therefore, it becomes possible to transfer a circuit pattern of higher resolution than general.

Further, the material forming the X-ray mirror in the present invention has no absorption peak in a wavelength region of at least 0.45 nm and not more than 0.7 nm. Therefore, X-rays of the wavelength region of at least 0.45 nm and not more than 0.7 nm can be more reliably reflected than a conventional X-ray mirror, whereby sufficient irradiation strength for X-rays can be secured. Consequently, a high throughput can be reliably attained in the X-ray exposure step.

Further, short-wave components can be added to general light intensity by spreading the wavelengths of X-rays employed for exposure to a shorter wavelength region. Therefore, the intensity of X-rays can be enlarged, whereby the time required for the exposure step can be reduced. Consequently, a high throughput can be implemented more reliably than general.

In the synchrotron radiation method according to the aforementioned further aspect, the X-ray mirror may include an X-ray mirror for cutting shorter wavelengths absorbing X-rays of a wavelength region of less than 0.3 nm by at least 90%.

In this case, short-wave X-rays having wavelengths of less than 0.3 nm can be reliably prevented from mixing into exposure light. Consequently, generation of photoelectrons in resist can be effectively prevented in exposure with these short-wave X-rays. Therefore, deterioration of resolution resulting from photoelectrons can be prevented.

In the synchrotron radiation method according to the aforementioned further aspect, the X-ray mirror may be an X-ray mirror for cutting shorter wavelengths absorbing X-rays whose wavelengths are only less than 0.45 nm.

In this case, X-rays of a shorter wavelength region can be utilized than a conventional synchrotron radiation method having utilized X-rays whose wavelengths are larger than 0.7 nm. Consequently, the wavelengths of X-rays employed for exposure reduce, whereby a circuit pattern having higher resolution than general can be transferred.

Further, the wavelengths of the X-rays so reduce that irradiation strength for X-rays can be enlarged, whereby a higher throughput than general can be attained.

In the synchrotron radiation method according to the aforementioned further aspect, the X-ray mirror may contain a material having an absorption edge only in a wavelength region of less than 0.45 nm as to X-rays.

In this case, the X-ray mirror employed in the synchrotron radiation method according to the present invention has no absorption edge in a wavelength region of at leas 0.45 nm. Consequently, no such absorption peak that X-rays are absorbed by the X-ray mirror is present in the wavelength region of at least 0.45 nm, whereby irradiation strength for X-rays can be more reliably secured.

In the synchrotron radiation method according to the aforementioned further aspect, the X-ray mirror may contain a single type of mirror material selected from a group consisting of beryllium, titanium, silver, ruthenium, rhodium and palladium, nitrides, carbides and borides of these, diamond, diamond-like carbon and boron nitride.

In the synchrotron radiation method according to the aforementioned further aspect, the X-ray mirror may comprise a substrate and a layer containing a mirror material formed on the substrate.

In this case, the substrate can be previously worked into a shape required to the X-ray mirror, whereby an X-ray mirror of a complicated shape can be readily obtained.

In the synchrotron radiation method according to the aforementioned further aspect, the X-ray emitting step may include a step of converging X-rays with the X-ray mirror.

In this case, a step of cutting short-wave X-rays and the step of converging X-rays can be simultaneously carried out with the X-ray mirror, whereby the structure of a synchrotron radiation apparatus performing the synchrotron radiation method according to the present invention can be simplified.

In the synchrotron radiation method according to the aforementioned further aspect, the X-ray emitting step may include a step of magnifying the area of a region capable of being simultaneously irradiated with X-rays outgoing from the X-ray mirror with the X-ray mirror.

In this case, the X-ray mirror has both a shorter wavelength cutting function and the function of magnifying the area of the region capable of being simultaneously irradiated with X-rays, whereby the structure of a synchrotron radiation apparatus performing the synchrotron radiation method according to the present invention can be simplified.

In the synchrotron radiation method according to the aforementioned further aspect, the X-ray emitting step may include a step of further converging X-rays with a converging mirror.

Therefore, the X-ray mirror for cutting shorter wavelengths and the converging mirror are independently employed, whereby the synchrotron radiation method according to the present invention can be readily executed by inserting the X-ray mirror according to the present invention in a conventional synchrotron radiation apparatus.

In the synchrotron radiation method according to the aforementioned further aspect, the X-ray emitting step may include a step of magnifying the area of a region capable of being simultaneously irradiated with X-rays outgoing from the X-ray mirror with a magnifying mirror.

In this case, the X-ray mirror for cutting shorter wavelengths and the magnifying mirror are independently employed, whereby the synchrotron radiation method according to the present invention can be readily executed by inserting the X-ray mirror according to the present invention in a synchrotron radiation apparatus for carrying out the conventional synchrotron radiation method.

In the synchrotron radiation method according to the aforementioned further aspect, it may employ an X-ray mirror whose surface upon which X-rays are incident is mechanically polished in the X-ray emitting step.

In the synchrotron radiation method according to the aforementioned further aspect, it may employ an X-ray mirror whose surface upon which X-rays are incident is chemically polished in the X-ray emitting step.

In the synchrotron radiation method according to the aforementioned further aspect, it may employ an X-ray mask, and this X-ray mask may include a membrane and an X-ray absorber formed on the membrane. The membrane may contain a single species selected from a group consisting of diamond, diamond-like carbon, boron nitride and beryllium.

At this point, the material employed in the membrane of the X-ray mask according to the present invention has no absorption edge in a wavelength region around 0.67 nm, dissimilarly to a silicon-based material having been employed for a conventional membrane. Therefore, when employing X-rays having wavelengths of not more than 0.7 nm which is a shorter wavelength region than general in an exposure step, these X-rays can be prevented from being absorbed in the membrane. Consequently, a sufficient quantity of exposure can be secured. Therefore, transmittance in the membrane for X-rays can be rendered higher than the case of employing a conventional X-ray mask, whereby a high throughput can be secured.

In the synchrotron radiation method according to the aforementioned further aspect, it may employ an X-ray mask, and this X-ray mask may include a membrane and an X-ray absorber formed on the membrane. The membrane may contain a material having an absorption edge only in at least either one of a wavelength region of less than 0.45 nm and a wavelength exceeding 0.7 nm as to X-rays, and the X-ray absorber may contain a material having an absorption edge in a wavelength region of at least 0.6 nm and less than 0.85 nm.

In this case, the material contained in the membrane has no absorption edge in a wavelength region of a least 0.45 nm and not more than 0.7 nm, whereby X-rays of a shorter wavelength region than general can be effectively utilized in an X-ray exposure step when applying the synchrotron radiation method according to the present invention to the X-ray exposure step.

While the absorbance for X-rays exhibits a peak value at the absorption edge wavelength of the material, the absorbance for X-rays reaches a sufficiently large value also in a wavelength region of 0.15 nm around this absorption edge wavelength. Therefore, when the X-ray absorber contains a material having an absorption edge in the wavelength region of at least 0.6 nm and less than 0.85 nm, X-rays employed for exposure can be reliably screened with this X-ray absorber in the wavelength region (at least 0.45 nm and not more than 0.7 nm) of the X-rays employed for exposure. Further, the material having an absorption edge in such a wavelength region is employed as the X-ray absorber, whereby the thickness of the X-ray absorber can be rendered smaller than general. Consequently, the aspect ratio of a transfer circuit pattern formed by the X-ray absorber can be reduced. When applying the synchrotron radiation method according to the present invention to an X-ray exposure method, therefore, a fine circuit pattern can be reliably transferred with X-rays of a shorter wavelength region than a conventional X-ray exposure step.

In the synchrotron radiation method according to the aforementioned further aspect, the X-ray absorber may contain a single species selected from a group consisting of tungsten, tantalum and rhenium.

In the synchrotron radiation method according to the aforementioned further aspect, the X-ray absorber may include stacked first layer and second layer.

In this case, a plurality of layers are formed in the X-ray absorber, whereby the degree of freedom of the material employed as the X-ray absorber can be further enlarged. When forming the X-ray absorber by combining materials whose absorption peak wavelengths for X-rays are different, X-rays can be reliably screened with an X-ray absorber of a smaller thickness than the case of forming the X-ray absorber with a single material.

In the synchrotron radiation method according to the aforementioned further aspect, a first material contained in the first layer may have a larger atomic weight than the atomic weight of a second material contained in the second layer.

Further, a heavy element such as molybdenum or rhodium whose atomic weight is relatively large may be employed as the first material, and it is preferable to employ a light element such as carbon or beryllium whose atomic weight is relatively small as the second material. Thus, the thickness of the X-ray absorber can be more reduced by employing materials whose absorption peak wavelengths for X-rays are different.

In the synchrotron radiation method according to the aforementioned further aspect, it may employ a plurality of X-ray mirrors in the X-ray emitting step.

In this case, the degree of freedom at the time of designing the X-ray oblique-incidence angles or the outgoing optical axis in the X-ray mirrors can be enlarged by employing a plurality of X-ray mirrors.

Further, X-rays of a shorter wavelength region can be more reliably cut by employing a plurality of X-ray mirrors.

In the synchrotron radiation method according to the aforementioned further aspect, it may employ at least two and not more than four X-ray mirrors in the X-ray emitting step.

In the case of employing two X-ray mirrors in this case, for example, the oblique-incidence angles of X-rays with respect to the X-ray mirrors can be arbitrarily set in a state keeping the outgoing direction of the X-rays from the X-ray mirrors constant by controlling the positions of the X-ray mirrors and the oblique-incidence angles of the X-rays with respect to the X-ray mirrors. Consequently, the peak wavelength of the X-rays can be arbitrarily changed.

When employing the X-ray by three or four, the oblique-incidence angles of the X-rays with respect to the X-ray mirrors can be controlled without changing the optical axes of the X-rays. Therefore, it becomes possible to readily carry out the synchrotron radiation method according to the present invention by inserting the X-ray mirrors according to the present invention in a synchrotron radiation apparatus in which the conventional synchrotron radiation method has been performed.

When increasing the number of the X-ray mirrors to three or four, the width of a wavelength region capable of controlling the peak wavelength of X-ray can be more spread.

In the synchrotron radiation method according to the aforementioned further aspect, the outgoing direction of X-rays outgoing from the X-ray mirror finally reached by X-rays among the plurality of X-ray mirrors may be substantially identical to the incidence direction of X-rays incident upon the X-ray mirror initially reached by X-rays among the plurality of X-ray mirrors in the X-ray emitting step.

In this case, X-rays having an arbitrary peak wavelength can be obtained in a state rendering the outgoing direction of the X-rays substantially identical to the incidence direction by controlling the positions of the X-ray mirrors and the angles with respect to the X-rays.

In the synchrotron radiation method according to the aforementioned further aspect, the X-ray emitting step may include a step of controlling the position of the X-ray mirror and a step of controlling the angle of a surface of the X-ray mirror upon which X-rays are incident and the incidence direction of the X-rays.

In this case, X-rays having an arbitrary peak wavelength can be more reliably obtained in a state keeping the outgoing direction and the incidence direction of the X-rays substantially identical.

Further, the peak wavelength of the X-rays can be controlled by controlling the angle (oblique-incidence angle) of the surface of the X-ray mirror upon which X-rays are incident and the incidence direction of the X-rays.

In the synchrotron radiation method according to the aforementioned further aspect, the outgoing optical axis of X-rays outgoing from the X-ray mirror finally reached by the X-rays among the plurality of X-ray mirrors may be substantially identical to the incidence optical axis of X-rays incident upon the X-ray mirror initially reached by the X-rays among the plurality of X-ray mirrors.

In this case, X-rays having an arbitrary peak wavelength can be obtained when controlling the oblique-incidence angles of the X-rays with respect to the X-ray mirrors in a state rendering the outgoing optical axis and the incidence optical axis of the X-rays substantially identical.

In the synchrotron radiation method according to the aforementioned further aspect, it may include a step of controlling the position of the X-ray mirror in a state keeping the outgoing optical axis substantially identical and a step of controlling the angle of the surface of the X-ray mirror incident upon X-rays and the incidence direction of the X-rays in the X-ray emitting step.

In this case, X-rays having an arbitrary peak wavelength can be readily obtained in a state keeping the outgoing optical axis substantially identical.

In the synchrotron radiation method according to the aforementioned further aspect, the X-ray emitting step may further comprise a step of changing the peak wavelength of X-rays outgoing from the X-ray mirror.

In this case, the peak wavelength of the X-rays can be controlled to be suitable to an X-ray mask employed in the synchrotron radiation method, resolution required to a transfer circuit pattern, the characteristics of resist applied onto a semiconductor substrate and the like. Consequently, a circuit pattern of higher resolution can be reliably transferred when applying X-rays obtained by the synchrotron radiation method according to the present invention to an X-ray exposure step.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a model diagram showing a control method in a system employing two X-ray mirrors according to the present invention in an embodiment 10 of the present invention.

FIG. 9 is a model diagram showing a control method in a system employing three X-ray mirrors according to the present invention in an embodiment 11 of the present invention.

DESCRIPTION OF THE PREFERRED EMBODIMENTS

Embodiments of the present invention are now described on the basis of drawings.

(Embodiment 1)

Figure 1:
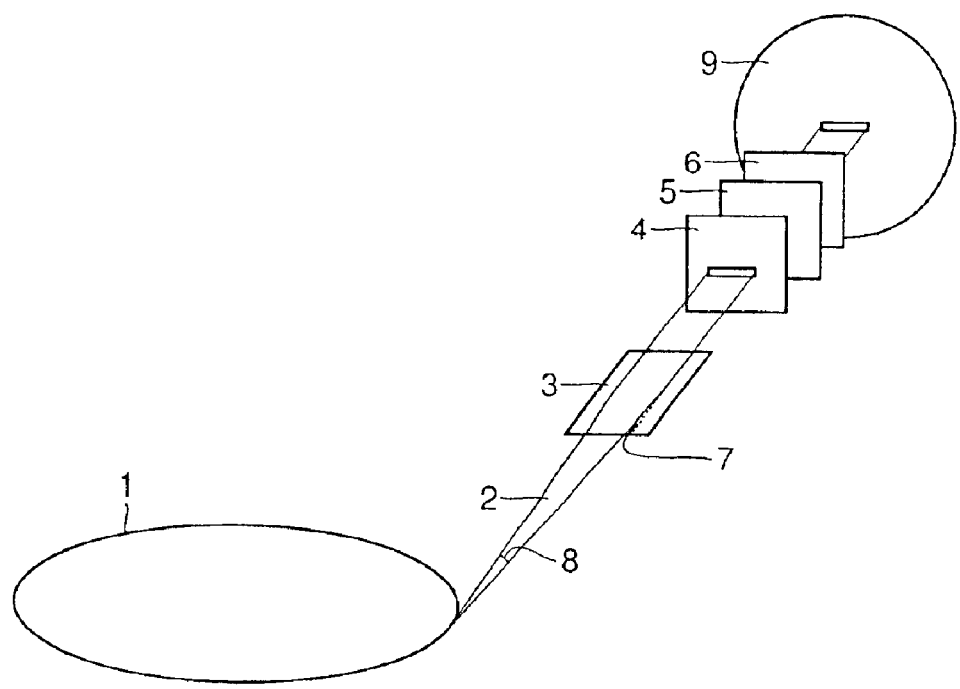
FIG. 1 is a model diagram showing an embodiment 1 of an X-ray exposure apparatus according to the present invention.

The present invention is basically structured by an apparatus for and a method of taking out X-rays of a shorter wavelength region than general optimum for X-ray exposure from a synchrotron radiation source and an X-ray mask for utilizing the taken-out X-rays as exposure light. FIG. 1 is a model diagram showing an embodiment 1 of an X-ray exposure apparatus according to the present invention. Referring to FIG. 1, the X-ray exposure apparatus comprises a synchrotron radiation source 1, an X-ray mirror 3, a heat removal filter 4, a beryllium window 5 and an X-ray mask 6. At this point, the heat removal filter 4 consists of beryllium, and has a function of cutting X-rays of a longer wavelength region. The beryllium window 5 serves as a partition between a vacuum region and the atmosphere. A transfer circuit pattern to be transferred to a semiconductor wafer 9 is formed on the X-ray mask 6 by an X-ray absorber.

Radiation 2 outgoing from the synchrotron radiation source 1 is first incident upon the X-ray mirror 3. The current angle formed by the optical axis of the radiation 2 and a surface of the X-ray mirror reflecting X-rays is regarded as an oblique-incidence angle 7. The angle for converging the radiation 2 in the X-ray mirror 3 is shown as a converging angle 8. The radiation 2 reflected on the X-ray mirror 3 reaches the semiconductor wafer 9 through the heat removal filter 4, the beryllium window 5 and the X-ray mask 6. A semiconductor device can be manufactured with an X-ray exposure method utilizing such reflected light 2.

The X-ray mirror 3 may also have a function as a converging mirror converging the radiation 2 and a function as a magnifying mirror magnifying the area (irradiated area) of a region which can be simultaneously irradiated with the radiation 2 outgoing from the X-ray mirror 3. Further, the X-ray exposure apparatus according to the present invention may comprises a converging mirror and a magnifying mirror independently of the X-ray mirror 3.

At this point, that having a silicon wafer as a substrate and forming a diamond layer of 50 $\mu$m in thickness on this substrate surface with plasma CVD was employed as the X-ray mirror 3 in the X-ray exposure apparatus according to the present invention. The surface of this diamond layer is mechanically polished, so that surface roughness is 0.4 nm (rms). The surface of the diamond layer may be chemically polished.

Figure 2:
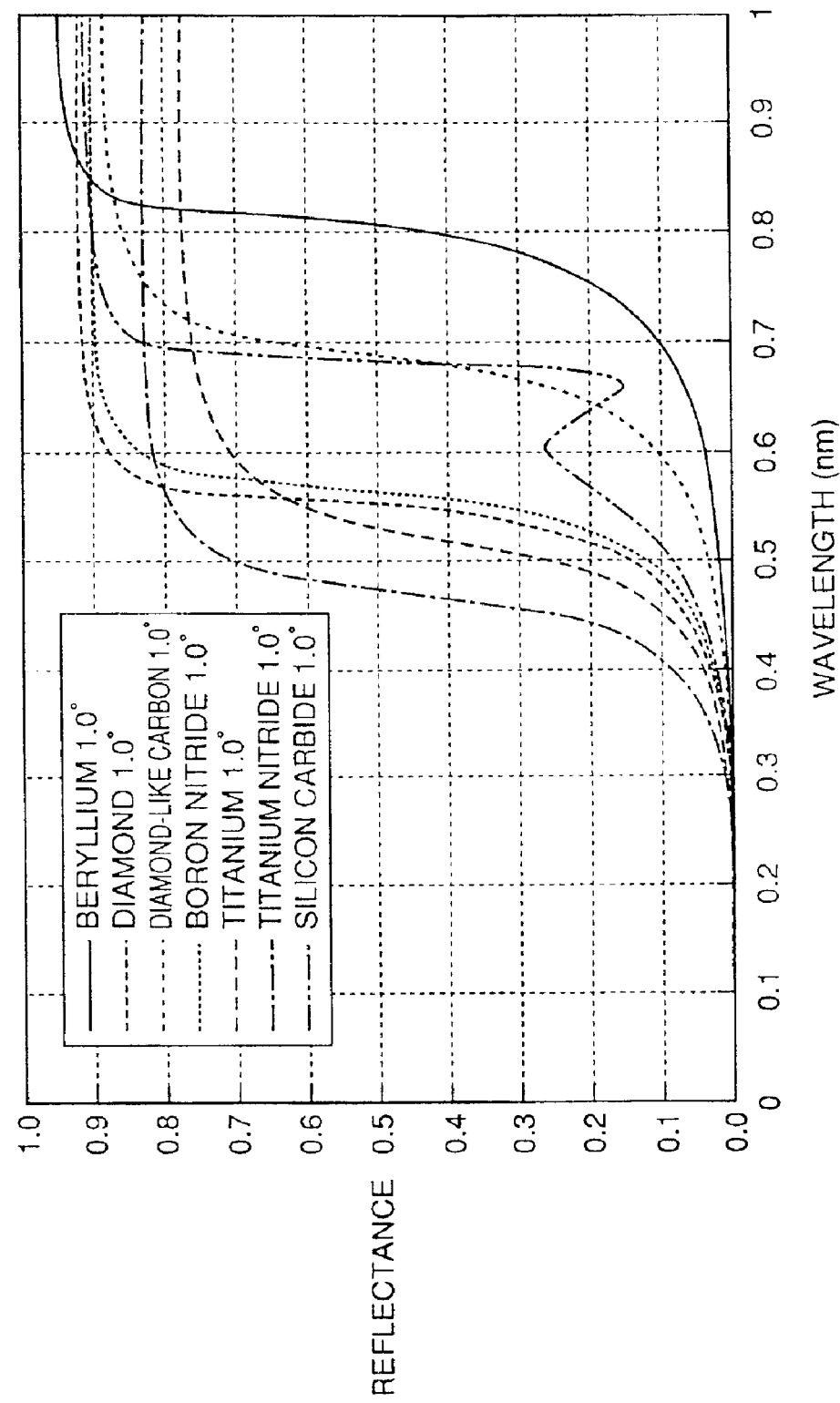
FIG. 2 is a graph showing the relations between wavelengths of X-rays and reflectance for X-rays as to materials for X-ray mirrors in embodiments 1 to 4 of the present invention.

With respect to the X-ray mirror 3 having such a structure, the radiation 2 was introduced under a condition of an oblique angle of 1°, for evaluating the X-ray reflection characteristic (characteristic cutting X-rays of a shorter wavelength region) of the X-ray mirror 3. FIG. 2 shows the result. FIG. 2 is a graph showing the relations between wavelengths of X-rays and reflectance for X-rays as to materials for the X-ray mirror.

At this point, the inventors have found that X-rays of a shorter wavelength region than general can be employed in an X-ray exposure step. In order to implement an X-ray exposure apparatus employing X-rays of such a shorter wavelength region, they have made various studies. As one of these studies, they have made a study as to material for an X-ray mirror for cutting shorter wavelengths employed for a beam line for taking out X-rays from a synchrotron radiation source in order to take out X-rays optimum for exposure employing X-rays of a shorter wavelength region.

The inventors have first studied reflection characteristics for X-rays on surfaces of various types of materials. Consequently, they have confirmed that it is to some extent possible to move the wavelength region of cut X-rays to a shorter wavelength region than general also in a mirror employing a heavy element such as gold or platinum studied as an X-ray mirror in general by reducing the oblique-incidence angle. When employing general gold or platinum, however, X-rays of a wavelength region of 0.3 to 0.5 nm could not be completely cut but X-rays of this wavelength region of 0.3 to 0.5 nm mixed into X-rays outgoing from the X-ray mirror in a considerable ratio. X-rays of such a wavelength region mix into X-rays employed for exposure to generate more photoelectrons than general when the X-rays are incident upon resist applied onto a semiconductor wafer, thereby exerting bad influence on the accuracy of a formed pattern.

In order to solve such a problem, therefore, the inventors have devised employment of a material containing a light element such as diamond or boron nitride having high density and also a small atomic weight as the material for the reflecting surface of the X-ray mirror.

It has proved that, when employing diamond or boron nitride as an X-ray mirror, it reflects X-rays up to a shorter wavelength region of about 0.6 nm with high reflectance also when enlarging the oblique-incidence angle to 1°. In a shorter wavelength region of not more than 0.6 nm, reflectance for X-rays abruptly lowers in an X-ray mirror employing these materials. Therefore, mixture of X-rays in such a shorter wavelength region can be more reduced than the case of employing general gold or platinum.

Referring to FIG. 2, high reflectance of a substantially identical degree is obtained whichever one of diamond and boron nitride the X-ray mirror employs.

In the X-ray mirror employing diamond or boron nitride, it was possible to move a wavelength region cut in the X-ray mirror to a shorter wavelength side by setting the oblique incidence angle to a smaller angle of not more than 1°.

After reflectance for X-rays once lowers in the wavelength region of about 0.6 nm in the material consisting of these light elements, the reflectance remains in the lowering state and hardly fluctuates in a shorter wavelength region of less than 0.45 nm. Since there is no fluctuation of the reflectance in this manner, X-rays belonging to the shorter wavelength region of less than 0.45 nm can be removed from radiation more effectively than general. That is, when utilizing these materials, it becomes possible to form an X-ray mirror for cutting shorter wavelengths absorbing X-rays whose wavelengths are only less than 0.45 nm.

The material consisting of the aforementioned light element has no absorption edge in the wavelength region of at least 0.45 nm and not more than 0.7 nm. Therefore, the aforementioned material has no absorption peak in the aforementioned wavelength region. When applying these materials to an X-ray mirror, therefore, X-rays of the wavelength region of at least 0.45 nm and not more than 0.7 nm can be more reliably reflected than a conventional X-ray mirror. Consequently, sufficient irradiation strength for X-rays can be secured, whereby a high throughput can be attained.

When applying the aforementioned material to an X-ray mirror, further, X-rays of a shorter wavelength region than the wavelength of about 0.75 nm having been employed in general. Consequently, X-rays of a shorter wavelength region than general can be utilized. Therefore, it becomes possible to transfer a circuit pattern of higher resolution than general. Consequently, a semiconductor device more highly integrated than general can be obtained when employing the X-ray exposure apparatus according to the present invention.

Further, high reflectance can be attained to about 90% by employing a smooth surface obtained by polishing the material such as diamond or boron nitride as the reflecting surface for X-rays.

At this point, a shape such as a plane mirror, a spherical mirror or an aspherical mirror is proposed as to the conventional X-ray mirror. A cylindrical type or a toroidal type is proposed as the spherical mirror. Further, an ellipsoidal type, a paraboloid type or the like is proposed as the aspherical mirror. All of these have been devised for an object of increasing converging efficiency. Further, an aspherical mirror surface indescribable in a numerical formula has also been recently studied due to progress of working technique and evaluation technique as well as design technique.

As the substrate for the X-ray mirror, employment of not only glass but also a material, having been regarded as unsuitable for working in general since it is fragile although it has high hardness, has also been studied. This is because it has become possible to form a free-form surface with such a material of high hardness due to progress of working technique.

Therefore, the inventors have tried to work X-ray mirrors also with materials such as silicon carbide, graphite, boron nitride and the like in addition to a silicon oxide-based material such as fused quartz having been studied as the material for an X-ray mirror in general. Also with X-ray mirrors prepared from these silicon carbide, graphite and boron nitride, they could cut X-rays of a shorter wavelength region below the region around 0.6 nm by controlling oblique-incidence angles. In the X-ray mirrors employing silicon carbide and graphite, however, it was necessary to remarkably reduce the oblique-incidence angles. They have also studied employment of a surface formed with a diamond thin film as a reflecting surface of an X-ray mirror.

At this point, development of formation technique employing CVD rapidly progresses in recent years as to formation technique of silicon carbide or a diamond material. Therefore, it has been becoming possible to obtain a sample consisting of silicon carbide or a diamond material larger than general. Therefore, it has become possible to study this material such as silicon carbide as the material for an X-ray mirror.

When an X-ray mirror can be formed with a bulk material consisting of a diamond material, it is conceivable that an X-ray mirror having excellent characteristics can be obtained considering from its heat conduction characteristic or the like. However, it is industrially still difficult to form a bulky large-sized mirror with these materials. Therefore, the inventors have prepared miniature plane mirrors with these materials and verified the characteristics thereof. The characteristics have been excellent as expected.

When studying X-ray mirrors employing the aforementioned silicon carbide and diamond material, the inventors have formed these materials as thin films through CVD due to easiness of preparation steps and the like. They have mainly studied employment of the surface of this thin film as the reflecting surface of the X-ray mirror. That is, they form a diamond thin film on the surface of a substrate already worked into a prescribed shape with CVD. Then, they have performed mechanical or chemical working and completed the X-ray mirror.

At this point, they have made studies as to a carbon-based material such as graphite relatively easy to work, a crystal- or glass-based material mainly composed of a silicon oxide, a silicon carbide-based material selected in view of heat conductivity and resistance against irradiation damage although working becomes difficult, and a material such as boron nitride relatively fragile although the same is high in hardness and excellent in heat resistance as the substrate for the X-ray mirror. They have formed diamond thin films on surfaces of these materials with CVD.

More specifically, the inventors have formed the diamond thin films with CVD in a state of heating substrates of graphite, a silicon oxide, silicon carbide, boron nitride and the like to at least about 700° C. Consequently, it has been possible to form the diamond thin films on the surfaces of all materials of graphite, a silicon oxide, silicon carbide and boron nitride.

The inventors have studied process conditions for CVD and substrate treatment conditions of increasing nucleation density of diamond formation on substrate surfaces as to formation conditions for the diamond thin films, in order to improve smoothness of the surfaces of the formed diamond thin films. When employing a diamond thin film formed by CVD as an X-ray mirror as such, however, it has been difficult to obtain characteristics of a sufficiently satisfiable degree.

Therefore, the inventors have tried a method of forming a diamond thin film on a substrate material and thereafter performing working such as polishing as to the surface of the diamond thin film. As the working method, they have mainly studied polishing by mechanical working. Aiming at reduction of the working time or the like, further, they have made a search for working conditions also as to chemical polishing. Whichever method of mechanical working and chemical working has been employed, however, it has been difficult to work the surface of the diamond thin film.

When employing graphite as an X-ray mirror, on the other hand, it has been necessary to extremely reduce the oblique-incidence angle. Therefore, they have studied employment of a material referred to as diamond-like carbon (DLC) for the reflecting surface of the X-ray mirror for X-rays. When employing diamond-like carbon, it has been possible to attain a reflection characteristic for X-rays close to a diamond thin film. With diamond-like carbon, further, it has been possible to form a thin film in wider conditions which have been process conditions similar to manufacturing process conditions for a diamond thin film.

At this point, they have also prepared an X-ray mirror forming a thin film of boron nitride on a silicon substrate by CVD. Also as to the X-ray mirror having this thin film of boron nitride, they have evaluated the reflection characteristic under a condition of an oblique-incidence angle of 1°. FIG. 2 shows the result too.

Referring to FIG. 2, the reflectance for X-rays belonging to a shorter wavelength region of not more than 0.6 nm abruptly lowers from around the wavelength of about 0.6 nm of X-rays in the X-ray mirror having a diamond thin film. Therefore, it is understood that X-rays of shorter wavelengths can be obtained than a conventional X-ray exposure apparatus having employed X-rays of a wavelength region of at least 0.7 nm when employing this X-ray mirror.

Also as to the X-ray mirror employing boron nitride, X-rays having wavelengths of at least 0.6 nm can be similarly obtained although the position of a wavelength where the reflectance improves is slightly on a longer wavelength side than the X-ray mirror employing diamond.

(Embodiment 2)

Similarly to the embodiment 1 of the present invention, an X-ray mirror was prepared by forming a thin film of diamond-like carbon on a silicon substrate by vapor-phase synthesis. The reflection characteristic of this X-ray mirror employing diamond-like carbon was evaluated similarly to the embodiment 1 of the present invention. FIG. 2 shows the result.

Referring to FIG. 2, the reflection characteristic of the X-ray mirror employing diamond-like carbon is basically similar to the reflection characteristic of the X-ray mirror employing diamond. However, the mean density of diamond-like carbon is 3.32, and slightly lower than 3.52 which is the mean density of diamond. In the measurement result in this embodiment 2 setting the oblique-incidence angle of X-rays with respect to the X-ray mirror to 1° as to all X-ray mirrors, therefore, the rising wavelength of the reflectance of the X-ray mirror employing diamond-like carbon shifts to a longer wavelength side than the case of the X-ray mirror employing diamond.

When employing a material having an absorption edge only in at least either one of a wavelength region of less than 0.45 nm and a wavelength region exceeding 0.7 nm as to X-rays as the aforementioned diamond or diamond-like carbon as the material for the X-ray mirror, occurrence of such a problem that irradiation strength for X-rays lowers or changes in a wavelength region of not more than 0.7 nm can be prevented. Consequently, X-rays of a shorter wavelength region than the wavelength of about 0.75 nm having been employed in general can be utilized. Therefore, it becomes possible to transfer a circuit pattern of higher resolution than general.

FIG. 2 also shows reflection characteristic data as to an X-ray mirror employing silicon carbide as comparative example. As understood also from FIG. 2, an absorption edge is present in the wavelength region around 0.6 nm in the X-ray mirror employing silicon carbide, and hence the reflectance once lowers in this wavelength region. Consequently, it is understood that irradiation strength for X-rays lowers in the wavelength region of not more than 0.7 nm in the X-ray mirror employing silicon carbide as compared with the X-ray mirror according to the present invention.

Referring to FIG. 2, it is understood that diamond or the like which is the material for the X-ray mirror according to the present invention absorbs X-rays in a wavelength region of less than 0.3 nm by a least 90%.

When employing the X-ray mirror according to the present invention, therefore, short-wave X-rays having wavelengths of less than 0.3 nm can be reliably prevented from mixing into exposure light. Consequently, generation of photoelectrons in resist can be effectively prevented in exposure with these short-wave X-rays. Therefore, deterioration of resolution resulting from photoelectrons can be prevented.

(Embodiment 3)

An X-ray mirror was prepared by employing germanium as a substrate and forming a thin film of metal titanium on the surface of this substrate by sputtering. The thickness of this thin film of metal titanium is about 0.5 μm. As to this X-ray mirror employing metal titanium, the reflection characteristic was evaluated similarly to the embodiment 1 of the present invention. FIG. 2 shows the result.

Referring to FIG. 2, this X-ray mirror employing the thin film of metal titanium basically exhibits a reflection characteristic similar to the X-ray mirror employing a diamond thin film in the embodiment 1 of the present invention when setting the oblique-incidence angle of X-rays with respect to the X-ray mirror to 1°. However, the X-ray mirror employing the thin film of metal titanium is lower in reflectance for X-rays in a longer wavelength region than the X-ray mirror employing the diamond thin film.

(Embodiment 4)

An X-ray mirror was prepared by employing a metal, an alloy or ceramic as a substrate and forming a thin film of titanium nitride on this substrate by ion plating. At this point, silicon carbide was employed as a substrate for evaluating the reflection characteristic similarly to the embodiment 1 of the present invention as to an X-ray mirror forming a thin film of titanium nitride on this substrate consisting of silicon carbide.

Further, an X-ray mirror was formed by mechanically working beryllium. FIG. 2 shows evaluation results of the reflection characteristics of the X-ray mirror employing titanium nitride and the X-ray mirror employing beryllium.

Referring to FIG. 2, the X-ray mirror employing titanium nitride had a rising wavelength of reflectance shifting to a shorter wavelength side than the X-ray mirror employing titanium and exhibited higher reflectance than the X-ray mirror employing titanium in the case of setting the oblique-incidence angle to 1°.

Further, the X-ray mirror employing beryllium exhibited high reflectance with respect to X-rays having wavelengths of at least 0.8 nm. As shown in FIG. 2, beryllium lowers in reflectance, and thereafter the reflectance is stable in a shorter wavelength region, similarly to the remaining materials. Therefore, X-rays of the shorter wavelength region can be effectively removed similarly to the remaining materials by employing beryllium as the material for the X-ray mirror. Considering from the high reflectance in a wavelength region of at least 0.8 nm, it can be said that the same has excellent characteristics as the material for an X-ray mirror.

In order to implement cut wavelengths similar to the X-ray mirrors employing a diamond thin film and boron nitride, however, it is necessary to render the oblique-incidence angle smaller than 1°. Therefore, it cannot be employed at a large oblique-incidence angle and hence it can be said that the same is inferior to the X-ray mirror employing a diamond thin film as the total characteristics in the case of considering a function as a converging mirror converging X-rays. In order to implement a high throughput in the case of employing the X-ray mirror employing beryllium in an X-ray exposure apparatus, it is conceivable that a countermeasure of increasing the number of this X-ray mirror or the like becomes necessary.

Thus, X-rays having a peak wavelength in a region of shorter wavelengths than 0.7 nm having been regarded as the optimum exposure wavelength in general by employing a surface of diamond, diamond-like carbon or boron nitride as an X-ray mirror for cutting shorter wavelengths and adjusting the incidence angle of X-rays upon this X-ray mirror. Consequently, X-rays usable for a proximity exposure step employing X-rays of shorter wavelengths than general can be taken out.

Therefore, X-rays of shorter wavelengths than general can be utilized for the exposure step, whereby a circuit pattern having higher resolution than general can be transferred. Further, irradiation strength for the X-rays can also be enlarged, whereby a high throughput can be implemented.

A mirror material such as diamond is formed on a substrate material, whereby the substrate material can be previously worked to be a shape such as a spherical surface necessary as the X-ray mirror. Consequently, a large-sized X-ray mirror having a complicated shape can be readily obtained.

In the X-ray exposure apparatus according to the present invention, it becomes possible to employ X-rays having wavelengths in the range of about 0.3 to 1.5 nm as exposure light by employing the aforementioned X-ray mirror.

(Embodiment 5)

Figure 3:
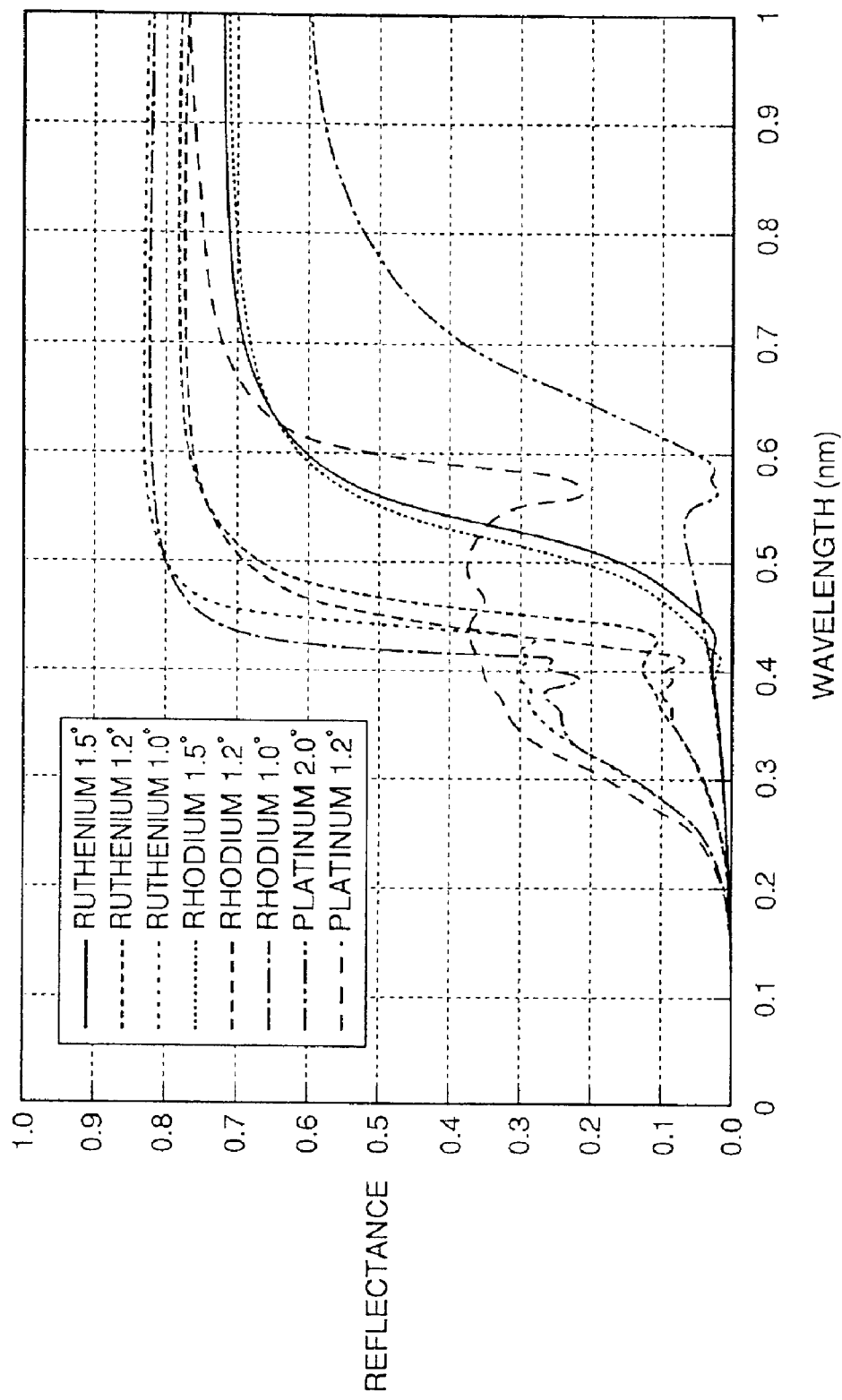
FIG. 3 is a graph showing the relations between wavelengths of X-rays and reflectance for X-rays as to materials for an X-ray mirror in an embodiment 5 of the present invention.

Silicon carbide or silicon oxide was employed as a substrate for an X-ray mirror, and the surface of this substrate was polished. Thereafter a thin film of ruthenium was formed on this polished surface by electron beam evaporation, thereby preparing an X-ray mirror. Another X-ray mirror was prepared by forming a thin film of rhodium on a polished surface of a substrate by electron beam evaporation. As to these X-ray mirrors employing ruthenium and rhodium, reflection characteristics as to X-rays were evaluated similarly to the embodiment 1 of the present invention. In this embodiment 5, oblique-incidence angles were varied for making evaluation also as to the relations between these oblique-incidence angles and the reflection characteristics. FIG. 3 shows the results. FIG. 3 is a graph showing the relations between wavelengths of X-rays and reflectance for X-rays as to the X-ray mirrors. FIG. 3 simultaneously shows a measurement result of a reflection characteristics as to an X-ray mirror employing platinum as comparative example.

At this point, a K absorption edge is present at 0.056051 nm in a shorter wavelength region, L absorption edges are present at 0.4180 nm and 0.4369 nm and an M absorption edge is present at 4.43 nm in ruthenium. In rhodium, a K absorption edge is present at 0.053392 nm, L absorption edges are present at 0.3629 nm, 0.3925 nm and 0.41299 nm and an M absorption edge is present at 4.04 nm.

Referring to FIG. 3, regions where reflectance for X-rays fluctuates are present in regions where the wavelengths of X-rays are around 0.4 nm in both data of the X-ray mirror employing ruthenium and the X-ray mirror employing rhodium due to influence by such L absorption edges. In reflected light from the X-ray mirrors in a wavelength region of at least 0.45 nm, however, influence of these absorption edges is small and X-rays of excellent characteristics can be obtained. That is, the X-ray mirror according to the present invention, hardly absorbing X-rays of the wavelength region of at least 0.45 nm, can be readily formed when employing ruthenium or rhodium which is a material having an absorption edge only in at least either one of wavelength regions of less than 0.45 nm and exceeding 0.7 nm (material having no absorption edge in the wavelength region of at least 0.45 nm and not more than 0.7 nm) as the material for the X-ray mirror. The X-ray mirror according to the present invention can more reliably reflect X-rays of the wavelength region of at least 0.45 nm than the conventional X-ray mirror, whereby sufficient irradiation strength for X-rays can be secured.

When reducing the oblique-incidence angle of X-rays with respect to the X-ray mirror from 1.5° to 1.0°, the peak wavelength of the obtained X-rays can be moved to a shorter wavelength side. When employing such an X-ray mirror, X-rays having a peak wavelength at the level of 0.4 nm can be readily obtained.

Referring to FIG. 3 at this point, platinum shown as comparative example has a K absorption edge and an L absorption edge located in a shorter wavelength region of not more than about 0.1 nm, similarly to gold or the like. In this platinum, however, an M absorption edge is further present in a wavelength region at the level of 0.5 nm.

Therefore, the graph showing the reflection characteristic of the X-ray mirror employing platinum lowers in reflectance in the wavelength region at the level of 0.5 nm. Further, reflectance in a wavelength region of 0.4 to 0.7 nm has become that by far smaller than the X-ray mirror according to the present invention employing ruthenium or the like. In the X-ray mirror employing platinum, further, reflectance in this wavelength region has some peaks, and it cannot be said much that the same has excellent characteristics as exposure light employed in an exposure step. In addition, it is understood that the total luminous energy of X-rays also becomes smaller than the case of employing the X-ray mirror according to the present invention.

(Embodiment 6)

Figure 4:
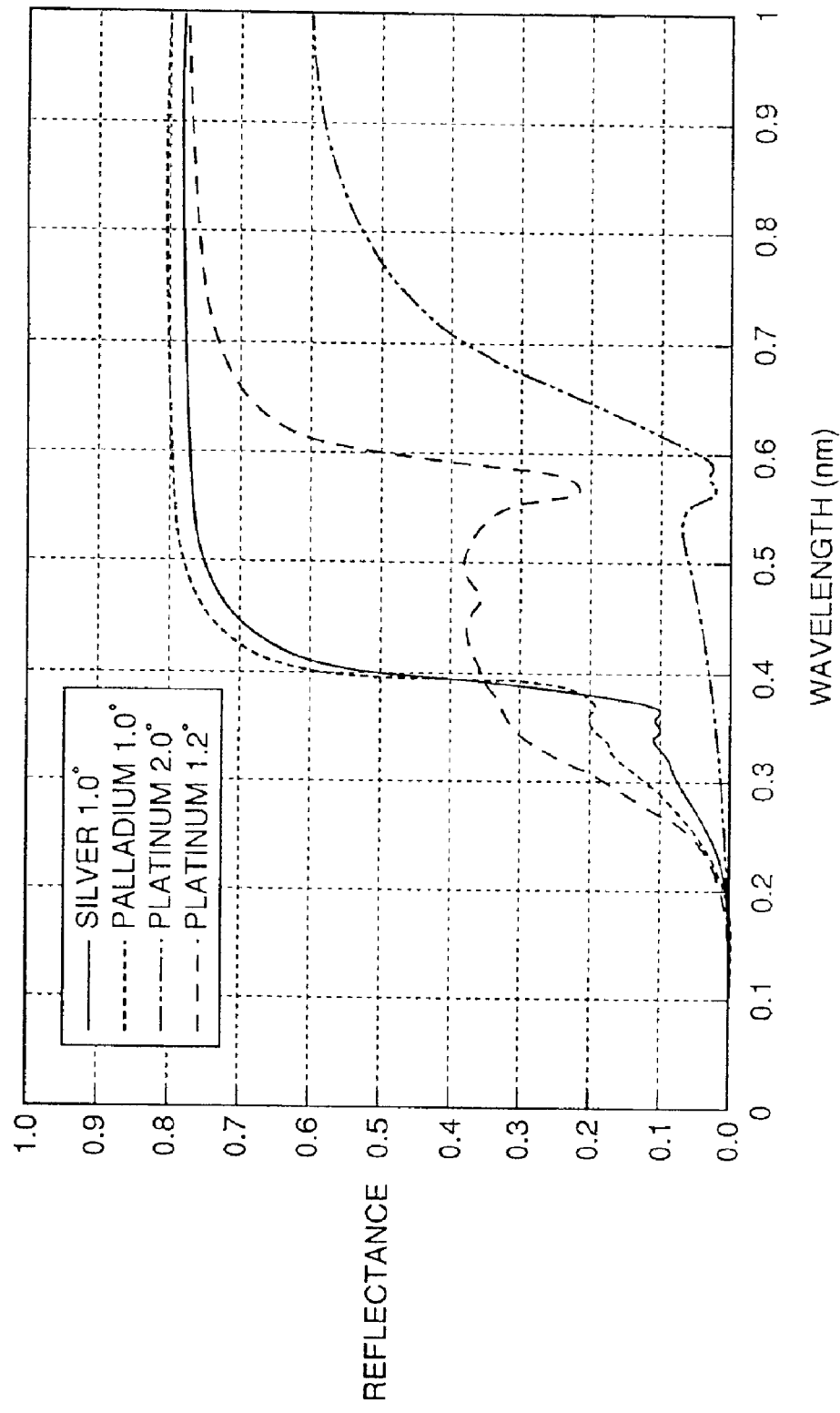
FIG. 4 is a graph showing the relations between wavelengths of X-rays and reflectance for X-rays as to materials for an X-ray mirror in an embodiment 6 of the present invention.

Silicon carbide is employed as a substrate for an X-ray mirror, and a surface of this silicon carbide becoming a reflecting surface is polished. An X-ray mirror was prepared by forming a thin film of silver on the polished surface of this substrate by electron beam evaporation. Another X-ray mirror was prepared by employing a similar substrate and forming a thin film of palladium on a polished surface by electron beam evaporation. As to these X-ray mirrors, reflection characteristics in the case of setting oblique-incidence angles to 1° were evaluated similarly to the embodiment 1 of the present invention. FIG. 4 shows the results. FIG. 4 is a graph showing the relations between wavelengths of X-rays and reflectance for X-rays as to the X-ray mirrors.

Referring to FIG. 4, the X-ray mirrors employing silver and palladium which are X-ray mirrors according to the present invention exhibit rises of reflectance in a wavelength region of around about 0.4 nm. As to X-rays of a wavelength region of 0.45 to 0.7 nm, the X-ray mirrors have stable reflectance. When employing the X-ray mirrors according to the present invention employing silver and palladium, therefore, X-rays having a peak wavelength in a shorter wavelength region than general and suitable for an X-ray exposure step can be readily obtained similarly to the embodiments 1 to 5 of the present invention.

As understood also by comparison with the reflection characteristic of an X-ray mirror employing platinum shown for comparison, it is understood that the X-ray mirrors according to the present invention rather exhibit higher reflectance with respect to X-rays of the wavelength region of 0.45 to 0.7 nm than the conventional X-ray mirror employing platinum.

While silicon carbide was employed as the substrate material at this point, a similar effect can be attained also when employing silicon oxide as the substrate material.

(Embodiment 7)

When forming a fine pattern with X-rays of shorter wavelengths than general as in the present invention, transmission ability for X-rays in a substrate material for an X-ray mask is also one of important characteristics. More specifically, it comes into question that the transmission ability for X-rays has dependency on the wavelengths of the X-rays in the substrate material for the X-ray mask.

That is, a material such as silicon nitride or silicon carbide containing silicon having been studied as a substrate for an X-ray mask in general has an extremely high degree of completion directed to practical use inclusive of a defect level in a thin film and the like, and is a preferable material in this point. However, an absorption edge as to X-rays is present in a wavelength region around 0.7 nm in silicon, and hence abrupt change of transmittance occurs with respect to X-rays around this wavelength region. Consequently, it could not be said that the conventional material containing silicon is suitable to be employed as a substrate for an X-ray mask when employing X-rays of a shorter wavelength region to be used in the present invention as exposure light.

Therefore, the inventors have studied employment of a thin film containing no silicon as a substrate for an X-ray mask. More specifically, they have studied employment of thin films structured by a material having carbon as a main material and light elements such as boron nitride and beryllium. Every one of the aforementioned materials exhibits excellent transmission ability with respect to X-rays with no absorption edge present at a wavelength of not more than 1.5 nm. In particular, diamond, exhibiting a value of at least twice that of silicon carbide also as to the Young's modulus, is extremely excellent in characteristics as a substrate for an X-ray mask.

A beryllium thin film has no transmission property as to light for alignment although transmission ability for X-rays is extremely excellent, and a thermal expansion coefficient was also large. Therefore, the beryllium thin film has been hardly studied as a substrate for an X-ray mask in proximity exposure technique employing X-rays.

However, it has been recognized that temperature rise of an X-ray mask in an exposure step is extremely small under conditions of employing exposure environment such as a decompressed helium atmosphere having excellent dissipation for which development is progressed at present and employing a large area batch exposure system such as flash exposure. Particularly when employing a diamond window or a beryllium window for heat absorption, temperature rise of the X-ray mask was substantially at an ignorable degree. Consequently, it has been recognized that such a problem that the thermal expansion coefficient of the beryllium thin film is large is not a large obstacle.

When employing an alignment method other than a system such as that detecting a mark formed on a semiconductor wafer through an X-ray mask, such as a global alignment system, for example, as an alignment system for the X-ray mask, it counts for nothing that the transmission property for light in the beryllium thin film is inferior. At this point, the positions of the X-ray mask and a holder for the X-ray mask are first previously adjusted in the global alignment system, for example. Then, the positions of the holder and a semiconductor wafer are controlled. A method of performing alignment of the X-ray mask and the semiconductor wafer by accurately controlling movement of the holder without performing alignment of the X-ray mask every exposure shot or the like corresponds thereto.

Boron nitride is superior to the beryllium thin film as the substrate for the X-ray mask, considering from hardness and the value of the thermal expansion coefficient. However, it has been difficult to form a film transmitting light employed for alignment similarly to the beryllium thin film, and hence the same has not been studied as a substrate material for an X-ray mask in general. However, as a result of employing the global alignment system and progressing improvement of positional accuracy of a stage holding a semiconductor wafer similarly to the case of the beryllium thin film, it has been recognized possible to employ this boron nitride as the substrate material for an X-ray mask too. It has also been clarified that boron nitride is such an excellent material that no absorption edge is present in a wavelength region of 0.5 nm of X-rays employed as exposure light in the present invention. That is, it is possible to apply these materials as substrate materials for X-ray masks in the X-ray exposure apparatus according to the present invention.

Figure 5:
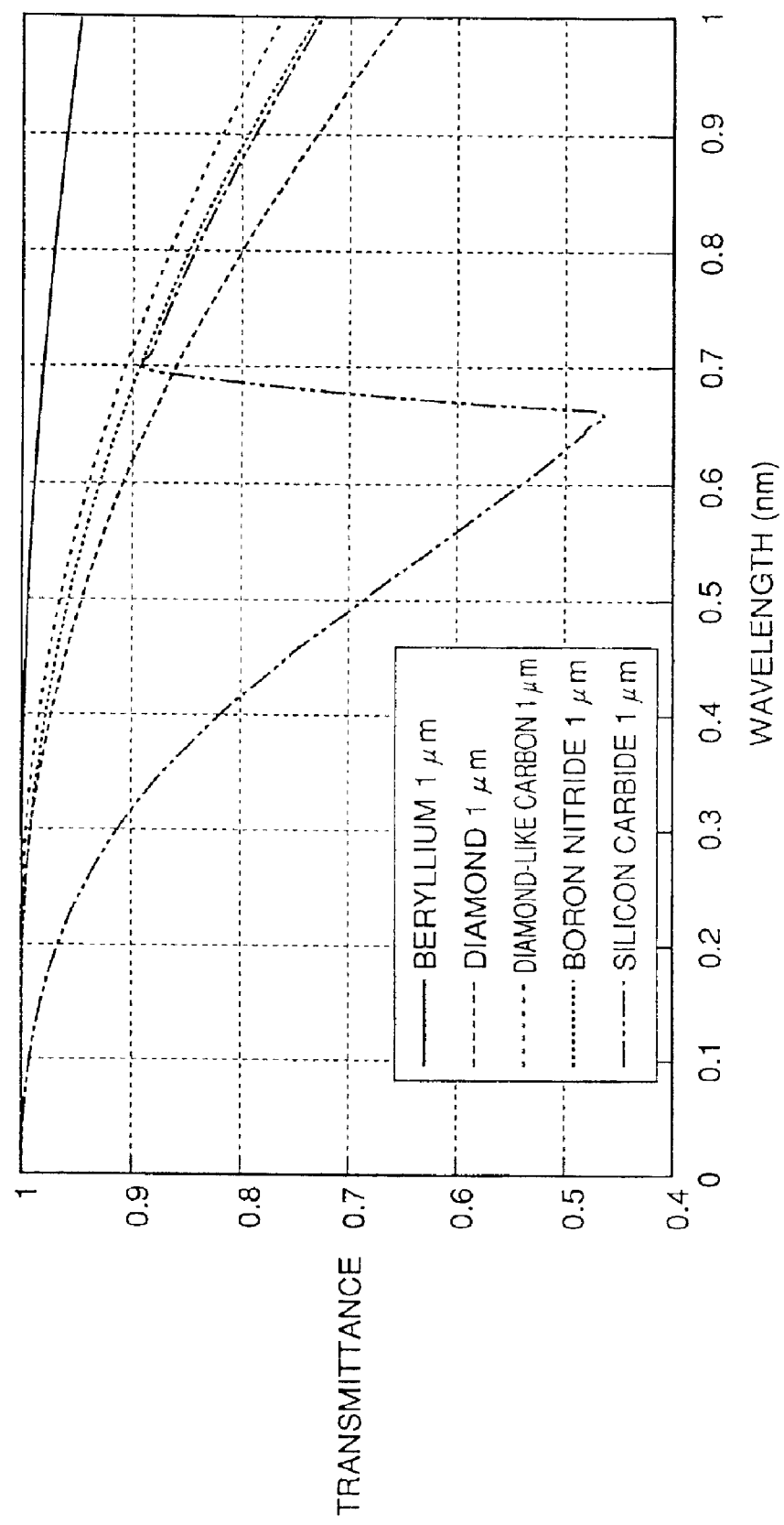
FIG. 5 is a graph showing the relations between wavelengths of X-rays and transmittance for X-rays as to membrane materials for an X-ray mask in an embodiment 7 of the present invention.

Thus, as to membrane materials (beryllium, diamond, diamond-like carbon and boron nitride) for X-ray masks employed in the X-ray exposure apparatus according to the present invention, transmission characteristics for X-rays were evaluated. FIG. 5 shows the results.

FIG. 5 is a graph showing the relations between wavelengths of X-rays and transmittance for X-rays as to the membrane materials. For the purpose of comparison, the transmission characteristic for X-rays is similarly shown also as to silicon carbide employed as a membrane for an X-ray mask in general. Referring to FIG. 5, it is understood that the membrane materials for the X-ray masks according to the present invention exhibit excellent transmittance for X-rays in a wavelength region of 0.45 to 0.7 nm than silicon carbide having been employed in general.

In evaluation of the transmission characteristics for X-rays as to various types of materials, measurement of total luminous energy was performed with respect to some wavelengths, and detailed studies as to dependency of the transmittance with respect to X-ray wavelengths were made by simulations.

(Embodiment 8)

It is now described that it is possible to attain such an effect that X-rays of a shorter wavelength region can be reliably cut also by inserting the X-ray mirror according to the present invention in an existing X-ray exposure apparatus.

Figure 6:
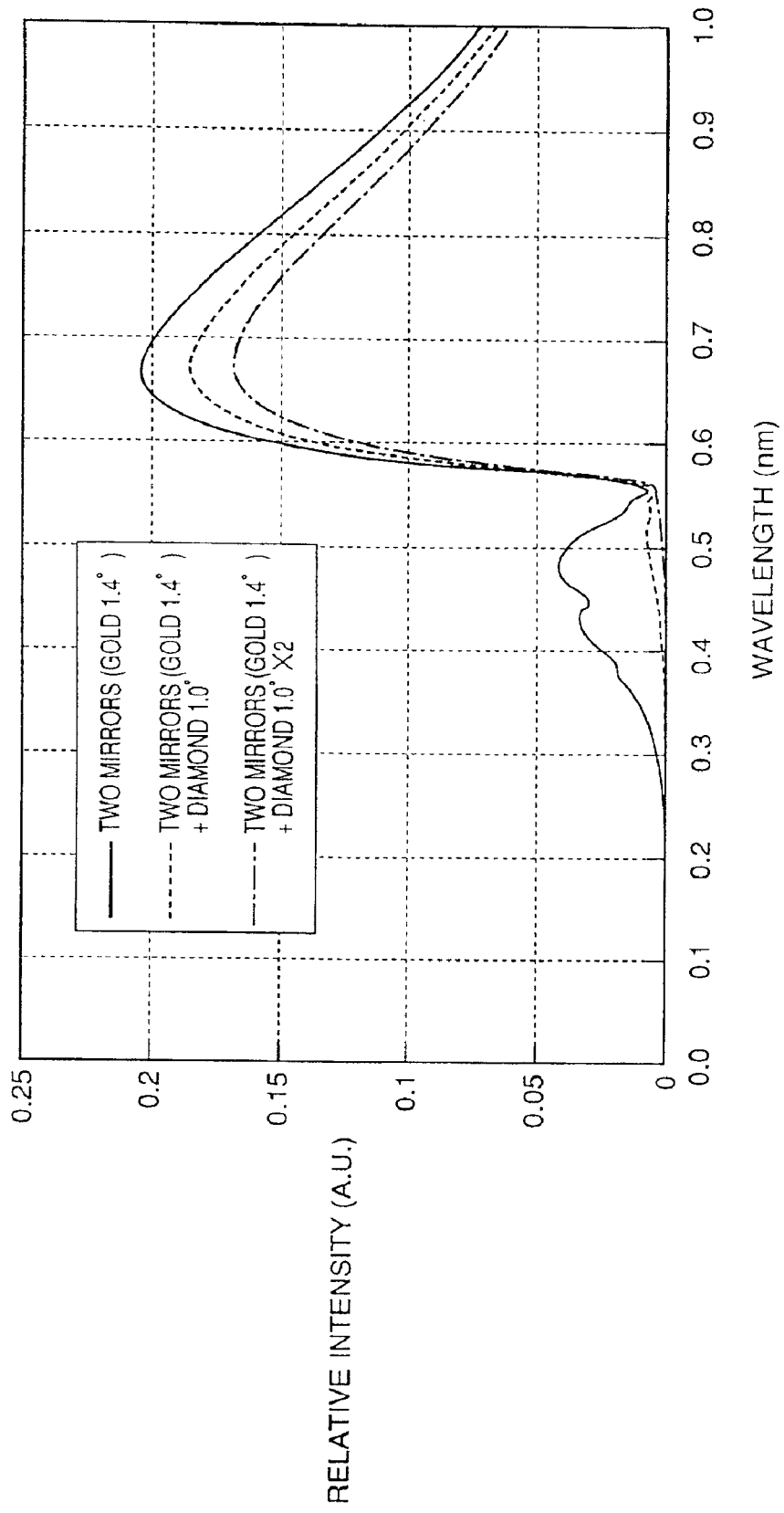
FIG. 6 is a graph showing the relations between wavelengths of X-rays and relative intensity obtained in an embodiment 8 of the present invention.

As the system of a conventional X-ray exposure apparatus, consider a system comprising a synchrotron radiation source whose critical wavelength is 0.7 nm, two X-ray mirrors containing gold and a beryllium window of 20 μm in thickness. X-rays outgoing from this synchrotron radiation source are reflected on the X-ray mirrors containing gold under a condition of an oblique-incidence angle of 1.4°. Thereafter the beryllium window transmits the X-rays, thereby cutting long-wave components. FIG. 6 shows the spectra of X-rays thus obtained. FIG. 6 is a graph showing the relations between wavelengths of X-rays and relative intensity of the X-rays. Referring to FIG. 6, a graph shown by a solid line in the figure shows the spectrum of the X-rays obtained in the aforementioned conventional X-ray exposure apparatus.

First, the X-ray mirror according to the present invention containing diamond is first inserted in such a conventional X-ray exposure apparatus under such a condition that the oblique-incidence angle is 1°. At this point, spectra of X-rays are shown as to both of the case of inserting a single X-ray mirror according to the present invention and the case of inserting two respectively.

As understood also from FIG. 6, it is understood that short-wave components of not more than 0.55 nm remaining also after transmission through the beryllium window in the conventional system are almost cut by inserting the X-ray mirror according to the present invention. It is understood that, when adding two X-ray mirrors according to the present invention, it is possible to further reduce the intensity of X-rays in the wavelength region of not more than 0.55 nm while rendering the peak wavelength substantially constant although the total intensity of the X-rays slightly weakens as compared with the case of adding a single X-ray mirror according to the present invention.

(Embodiment 9)

It is now described that it is possible to continuously change the peak wavelength of X-rays employed for exposure with the X-ray mirror according to the present invention.

Figure 7:
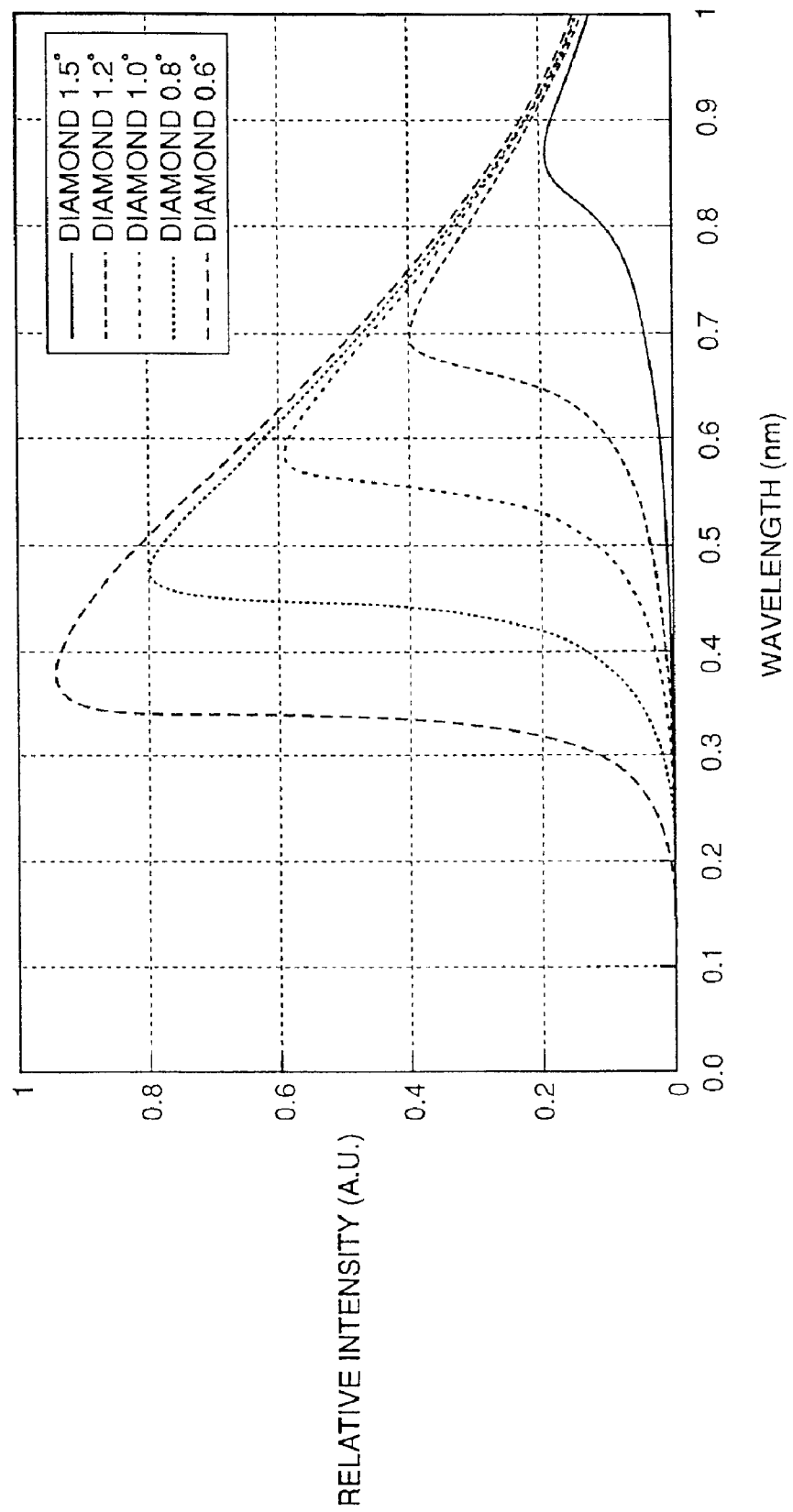
FIG. 7 is a graph showing the relations between wavelengths of X-rays and relative intensity obtained in an embodiment 9 of the present invention.

At this point, consider a system similar to the system of the X-ray exposure apparatus studied in the embodiment 8 of the present invention as the system of an X-ray exposure apparatus. In the embodiment 9 of the present invention, however, no X-ray mirror employing gold is employed but two X-ray mirrors according to the present invention employing diamond are employed from the first, dissimilarly to the system in the embodiment 8. FIG. 7 shows spectra of X-rays transmitted through a beryllium window in the case of changing the oblique-incidence angle of X-rays with respect to these two X-ray mirrors from 0.6 to 1.5°. At this point, FIG. 7 is a graph showing the relations between wavelengths of the X-rays and relative intensity of the X-rays.

Referring to FIG. 7, the peak wavelength of the obtained X-rays can be continuously changed by controlling the oblique-incidence angles of the X-rays with respect to the X-ray mirrors.

(Embodiment 10)

In control methods for the X-ray mirrors in the embodiments 8 and 9 of the present invention, a system capable of changing the oblique-incidence angles of X-rays with respect to the X-ray mirrors without changing the direction of optical axes of the X-rays is described.

FIG. 8 is a model diagram showing a control method in a system employing two X-ray mirrors according to the present invention. Referring to FIG. 8, X-rays 10 are incident upon a first-stage X-ray mirror 11 at an oblique-incidence angle α. The X-rays 10 reflected on the first-stage X-ray mirror 11 are incident upon a second-stage X-ray mirror 12 at the oblique-incidence angle α as well, and reflected.

It is assumed that Lα represents the current distance between the first-stage X-ray mirror 11 and the second-stage X-ray mirror 12 in the x-axis direction, and D represents the distance in the y-axis direction. The first-stage X-ray mirror 11 is fixed in set position, and has a rotating function about an axis perpendicular to the plane of the figure. The second-stage X-ray mirror 12 is movable in the x-axis direction, and has a rotating function about an axis perpendicular to the plane of the figure, similarly to the first-stage X-ray mirror 11. As shown in FIG. 8, the optical axis (outgoing optical axis) of the X-rays 10 outgoing from the second-stage X-ray mirror 12 becomes substantially parallel to the optical axis (incidence optical axis) of the X-rays 10 incident upon the first-stage X-ray mirror 11 by rendering the oblique-incidence angles of the X-rays 10 in the first-stage X-ray mirror 11 and the second-stage X-ray mirror 12 substantially identical. That is, the outgoing direction of the X-rays 10 outgoing from the second-stage X-ray mirror 12 as an X-ray mirror finally reached by the X-rays is substantially identical to the incidence direction of the X-rays 10 incident upon the first-stage X-ray mirror 11 as an X-ray mirror initially reached by the X-rays.

At this point, the expression that the outgoing direction of the X-rays 10 outgoing from the second-stage X-ray mirror 12 is substantially identical to the incidence direction of the X-rays 10 incident upon the first-stage X-ray mirror 11 indicates that the angle formed by the aforementioned outgoing direction and the aforementioned incidence direction (the angle formed by the outgoing optical axis and the incidence optical axis of the X-rays 10) is within a prescribed allowance range. More specifically, allowance of the incidence direction or the outgoing direction in the optical axis of the X-rays is about 0.1° per single X-ray mirror and the system shown in FIG. 8 comprises the two X-ray mirrors of the first-stage and second-stage X-ray mirrors 11 and 12, and hence the allowance of the system shown in FIG. 8 is 0.2°. When the angle formed by the aforementioned outgoing direction and the aforementioned incidence direction is not more than 0.2°, therefore, it can be regarded that the outgoing direction of the X-rays 10 outgoing from the second-stage X-ray mirror 12 is substantially identical to the incidence direction of the X-rays 10 incident upon the first-stage X-ray mirror 11 in real terms.

When setting the oblique-incidence angle of the X-rays 10 with respect to the first-stage X-ray mirror 11 to β larger than α, the optical axis of the X-rays 10 outgoing from the second-stage X-ray mirror 12 can be rendered substantially identical to the optical axis of the X-rays 10 incident upon the first-stage X-ray mirror 11 as well by setting the distance between the first-stage X-ray mirror 11 and the second-stage X-ray mirror 12 in the x-axis direction to Lβ and setting the oblique-incidence angle of X-rays in the second-stage X-ray mirror 12 to β.

At this time, the following relation holds:

$$D = L\alpha \times \tan(2\alpha) = L\beta \times \tan(2\beta) \quad (1)$$

Therefore, it becomes possible to continuously change the peak wavelength of X-rays similarly to the embodiment 9 of the present invention, without changing the direction of the optical axis of the X-rays 10.

(Embodiment 11)

FIG. 9 is a model diagram showing a control method for a system employing three X-ray mirrors according to the present invention. The distance between a first-stage X-ray mirror 11 and a second-stage X-ray mirror 12 in the x-axis direction is at a constant value L. The distance between the second-stage X-ray mirror 12 and a third-stage X-ray mirror 13 in the x-axis direction is also similarly at the constant value L. The first-stage X-ray mirror 11 is fixed in position, and has a rotating function about an axis perpendicular to the plane of the figure. The second-stage X-ray mirror 12 has a function of making translation in the y-axis direction. The third-stage X-ray mirror 13 has a rotating function about an axis perpendicular to the plane of the figure similarly to the first-stage X-ray mirror 11.

When the oblique-incidence angle of X-rays 10 incident upon the first-stage X-ray mirror 11 is α, it is assumed that Dα represents the distance between the first-stage X-ray mirror 11 and the second-stage X-ray mirror 13 in the y-axis direction. The angle of the third-stage X-ray mirror 13 is controlled so that the oblique-incidence angle of the X-rays 10 upon the third-stage X-ray mirror 13 is α. Consequently, the optical axis (outgoing optical axis) of the X-rays 10 outgoing from the third-stage X-ray mirror 13 as an X-ray mirror finally reached by the X-rays 10 and the optical axis (incidence optical axis) of the X-rays 10 incident upon the first-stage X-ray mirror 11 as an X-ray mirror initially reached by the X-rays 10 can be rendered substantially identical. However, the oblique-incidence angle of the X-rays 10 with respect to the second-stage X-ray mirror 12 becomes 2α. At this point, the expression that the aforementioned incidence optical axis and the outgoing axis are substantially identical indicates that the incidence optical axis and the outgoing optical axis substantially overlap while the angle formed by the incidence optical axis and the outgoing optical axis is within a prescribed allowance range. As described in the embodiment 10 of the present invention, the allowance in the optical axis incidence direction or the outgoing direction in the optical axis of X-rays per single X-ray mirror is about 0.1°. Therefore, the system shown in FIG. 9 comprises three X-ray mirrors of the first- to third-stage X-ray mirrors 11 to 13, and hence the allowance of the system shown in FIG. 9 is 0.3°.

Then, consider the case of rotating the first-stage X-ray mirror 11 so that the oblique-incidence angle of the X-rays 10 with respect to the first-stage X-ray mirror 11 becomes β. In this case, the second-stage X-ray mirror 12 is translated in the y-axis direction. The optical axis of the X-rays 10 outgoing from the third-stage X-ray mirror 13 and the optical axis of the X-rays 10 incident upon the first-stage X-ray mirror 11 can be rendered substantially identical similarly to the above by rotating the third-stage X-ray mirror 13 so that the oblique-incidence angle of the X-rays 10 becomes β in the third-stage X-ray mirror 13.

Thus, it becomes possible to arbitrarily select the oblique-incidence angles of the X-rays with respect to the X-ray mirrors 11, 12 and 13 while keeping the optical axes of the X-rays 10 identical. At this time, the following relation holds:

$$L = \frac{D\alpha}{\tan(2\alpha)} = \frac{D\beta}{\tan(2\beta)} \quad (2)$$

Figure 10:
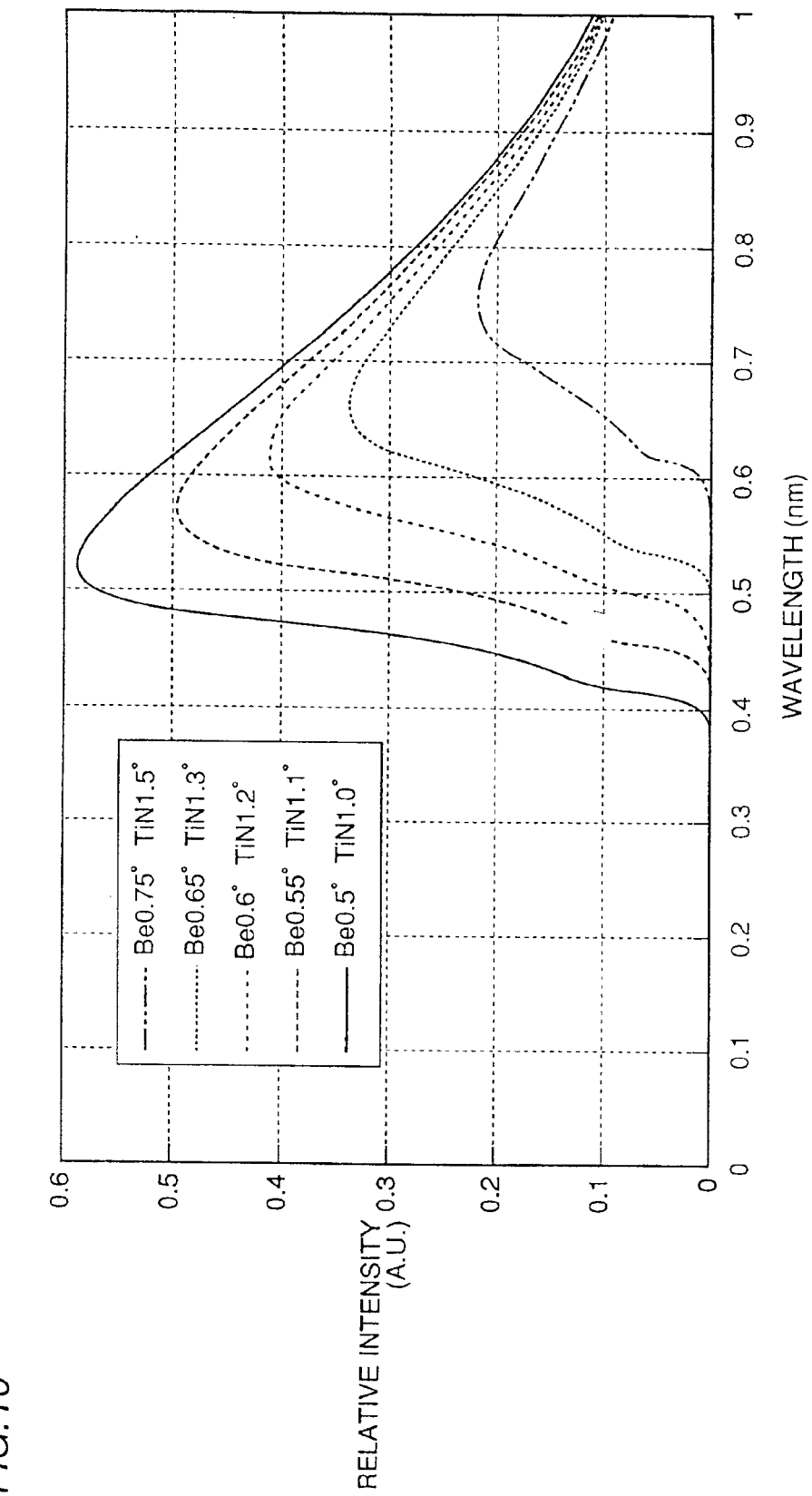
FIG. 10 is a graph showing the relations between wavelengths of X-rays and relative intensity obtained by the system shown in FIG. 9.

At this point, FIG. 10 shows spectra of X-rays obtained in the case of using X-ray mirrors employing beryllium as the first-stage X-ray mirror 11 and the third-stage X-ray mirror 13 and employing titanium nitride as the second-stage X-ray mirror 12 respectively. As the system of the X-ray exposure apparatus, consider a system employing a synchrotron radiation source of 0.7 nm in critical wavelength as a light source and a beryllium window of 20 μm in thickness as an X-ray extraction window.

FIG. 10 is a graph showing the relations between wavelengths of X-rays and relative intensity of the X-rays obtained in the system of the X-ray exposure apparatus according to the embodiment 11 of the present invention.

Referring to FIG. 10, the oblique-incidence angles in the first-stage X-ray mirror 11 (see FIG. 9) and the third-stage X-ray mirror 13 (see FIG. 9) are changed in the range of 0.5 to 0.75° at pitches of 0.05°. In order to correspond to this change, a range of 1.0 to 1.5° is changed at pitches of 0.1° as to the second-stage X-ray mirror 12 (see FIG. 9). As understood also from FIG. 10, it is understood possible to continuously change the peak wavelength of X-rays.

(Embodiment 12)

Figure 11:
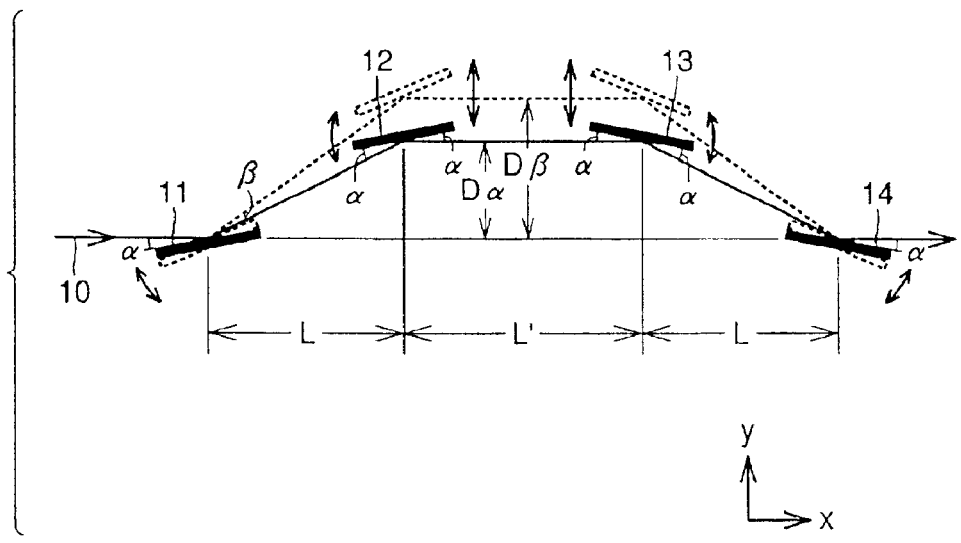
FIG. 11 is a model diagram showing a control method in a system employing four X-ray mirrors according to the present invention in an embodiment 12 of the present invention.

FIG. 11 is a model diagram showing a control method in a system employing four X-ray mirrors according to the present invention. With reference to FIG. 11, a system capable of changing oblique-incidence angles of X-rays with respect to X-ray mirrors without changing the optical axes of X-rays 10 with four X-ray mirrors is described.

Referring to FIG. 11, a second-stage X-ray mirror 12 is set on a position separating from a first-stage X-ray mirror 11 by a constant distance L in the x-axis direction. A third-stage X-ray mirror 13 is set on a position separating from the second-stage X-ray mirror 12 by L' in the x-axis direction. A fourth-stage X-ray mirror 14 is set on a position separating from the third-stage X-ray mirror 13 by the constant distance L in the x-axis direction. The first-stage X-ray mirror 11 and the fourth-stage X-ray mirror 14 are fixed in position, and have rotating functions about axes perpendicular to the plane of the figure. The second-stage X-ray mirror 12 and the third-stage X-ray mirror 13 have functions of moving in the y-axis direction in addition to rotating functions about axes perpendicular to the plane of the figure.

When the oblique-incidence angle of the X-rays 10 in the first-stage X-ray mirror 11 is α, the angles of rotation and positions of the X-ray mirrors 12, 13 ad 14 are so controlled that the oblique-incidence angles of the X-rays become α in all of the second-stage X-ray mirror 12, the third-stage X-ray mirror 13 and the fourth-stage X-ray mirror 14. It is assumed that Dα represents the current distance between the first-stage X-ray mirror 11 and the second-stage X-ray mirror 12 in the y-axis direction. Consequently, the optical axis (incidence optical axis) of the X-rays 10 incident upon the first-stage X-ray mirror 11 as an X-ray mirror initially reached by the X-rays 10 and the optical axis (outgoing axis) of the X-rays 10 outgoing from the fourth-stage X-ray mirror 14 as an X-ray mirror finally reached by the X-rays 10 become substantially identical. More specifically, the optical axis (incidence optical axis) of the X-rays 10 incident upon the first-stage X-ray mirror 11 and the optical axis (outgoing optical axis) of the X-rays 10 outgoing from the fourth-stage X-ray mirror 14 substantially overlap, while the angle formed by the incidence optical axis and the outgoing optical axis is within a prescribed allowance range (not more than 0.4° in the system shown in FIG. 11 since it comprises the four X-ray mirrors 11 to 14).

Then, the first-stage X-ray mirror 11 is so rotated that the oblique-incidence angle of the X-rays 10 in the first-stage X-ray mirror 11 becomes β. At this time, the second-stage X-ray mirror 12 and the third-stage X-ray mirror 13 are translated in the y-axis direction. At the same time, the respective X-ray mirrors 12 and 13 are so rotated that the oblique-incidence angles of the X-rays in the second-stage X-ray mirror 12 and the third-stage X-ray mirror 13 become β. The optical axis of the X-rays 10 outgoing from the fourth-stage X-ray mirror 14 and the optical axis of the X-rays 10 incident upon the first-stage X-ray mirror 11 can be rendered substantially identical similarly to the above by rotating the fourth-stage X-ray mirror so that the oblique-incidence angle of the X-rays becomes β also in the fourth-stage X-ray mirror 14. That is, it becomes possible to arbitrarily select the oblique-incidence angles of the X-rays with respect to the X-ray mirrors 11 to 14 while keeping the optical axes of the X-rays 10. At this time, the following relation holds:

$$L = D\alpha/\tan(2\alpha) = D\beta/\tan(2\beta) \quad (3)$$

Thus, it becomes possible to continuously change the peak wavelength of X-rays similarly to the embodiment 11 of the present invention without changing the optical axes of the X-rays.

(Embodiment 13)

Figure 12:
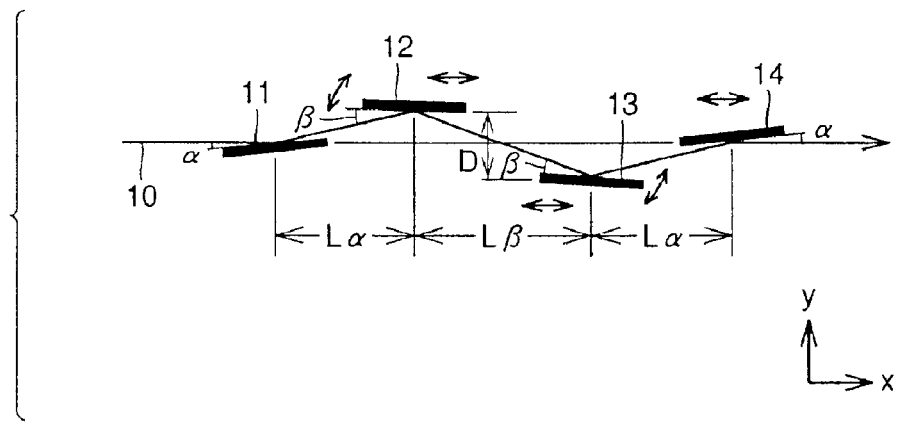
FIG. 12 is a model diagram showing a control method in a system employing four X-ray mirrors according to the present invention in an embodiment 13 of the present invention.

FIG. 12 is a model diagram showing a control method in another system employing four X-ray mirrors according to the present invention.

Referring to FIG. 12, a second-stage X-ray mirror 12 is set at a space by Lα from a first-stage X-ray mirror 11 in the x-axis direction. A third-stage X-ray mirror 13 is set at a space by Lβ from the second-stage X-ray mirror 12 in the x-axis direction. A fourth-stage X-ray mirror 14 is set at a space by Lα from the third-stage X-ray mirror 13 in the x-axis direction. The distances between the respective X-ray mirrors indicate the distances between the reflection centers in the respective X-ray mirrors.

At this point, the first-stage X-ray mirror 11 is also fixed in its position and angle of rotation. The second-stage X-ray mirror 12 and the third-stage X-ray mirror 13 have rotating functions about axes perpendicular to the plane of the figure and moving functions in the x-axis direction respectively. The fourth-stage X-ray mirror 14 is constant in angle of rotation, and has a moving function in the x-axis direction.

At this point, the oblique-incidence angles of X-rays in the first-stage X-ray mirror 11 and the fourth-stage X-ray mirror 14 are set to a constant value of α. This oblique-incidence angle α is set to the smallest possible value in order to suppress absorption of X-rays in the X-ray mirrors 11 and 14. Then, the oblique-incidence angles in the second-stage X-ray mirror 12 and the third-stage X-ray mirror 13 are set to β (β>α). The distance between the second-stage X-ray mirror 12 and the third-stage X-ray mirror 13 in the y-axis direction is set to a constant value D. Then, the following relation holds:

$$D = 2 \times L\alpha \times \tan(2\alpha) = L\beta \times \tan 2(\beta - \alpha) \quad (4)$$

The oblique-incidence angle β and the distances Lα and Lβ between the X-ray mirrors are controlled respectively so that the aforementioned relation is maintained.

At this point, such a state that attenuation of the X-rays 10 in the first-stage X-ray mirror 11 and the fourth-stage X-ray mirror 14 is hardly present can be attained by setting the oblique-incidence angle α to an extremely small angle. Further, the oblique-incidence angle β of the X-rays 10 in the second-stage X-ray mirror 12 and the third-stage X-ray mirror 13 can be arbitrarily controlled in a state of rendering the optical axis (outgoing optical axis) of the X-rays 10 outgoing from the fourth-stage X-ray mirror 14 as an X-ray mirror finally reached by the X-rays 10 and the optical axis (incidence optical axis) of the X-rays 10 incident upon the first-stage X-ray mirror 11 as an X-ray mirror initially reached by the X-rays 10 substantially identical. In the control method in the embodiment 13 of the present invention, therefore, an effect can be attained similarly to the embodiment 12 of the present invention, while the quantity of attenuation of X-rays can be more reduced than the embodiment 12 of the present invention. The expression that the outgoing optical axis and the incidence optical axis are substantially identical as in the above indicates that the optical axis (incidence optical axis) of the X-rays 10 incident upon the first-stage X-ray mirror 11 and the optical axis (outgoing optical axis) of the X-rays 10 outgoing from the fourth-stage X-ray mirror 14 substantially overlap while the angle formed by the incidence optical axis and the outgoing optical axis is within a prescribed allowance range (not more than 0.4° in the system shown in FIG. 12 since it comprises the four X-ray mirrors 11 to 14).

Figure 13:
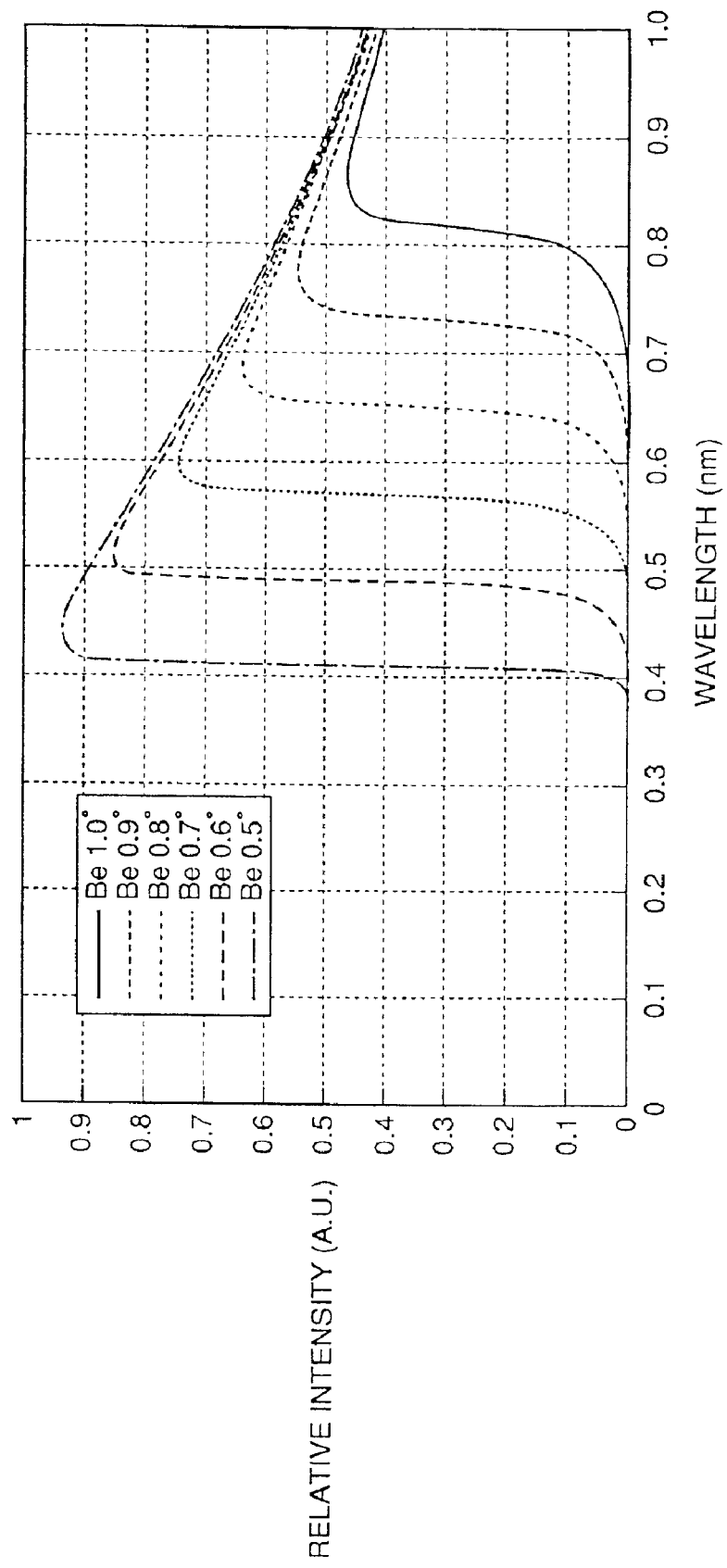
FIG. 13 is a graph showing the relations between wavelengths of X-rays and relative intensity obtained in the system shown in FIG. 12.

Thus, according to the present invention, X-rays having an arbitrary peak wavelength can be obtained without changing the optical axes of the X-rays 10. At this point, FIG. 13 shows spectra of X-rays obtained when applying X-ray mirrors employing beryllium to all X-ray mirrors 11 to 14 from the first stage to the fourth stage in the system shown in FIG. 12. FIG. 13 is a graph showing the relations between the wavelengths of X-rays and relative intensity of the X-rays in the embodiment 13 of the present invention.

FIG. 13 shows the spectra of the X-rays in the case of setting the oblique-incidence angle α in the first-stage X-ray mirror 11 and the fourth-stage X-ray mirror 14 at 0.5° and changing the oblique-incidence angle of the X-rays in the second-stage X-ray mirror 12 and the third-stage X-ray mirror 13 in the range of 0.5 to 1.0°. The remaining structure of the X-ray exposure apparatus is similar to the system employed in the embodiment 8 or the embodiment 9 of the present invention.

Referring to FIG. 13, it is understood possible to continuously change the peak wavelength of X-rays.

Thus, the peak wavelength of the X-rays can be arbitrarily changed, whereby X-rays of wavelengths more suitable to an employed X-ray mask, required resolution, the properties of used resist and the like can be used.

(Embodiment 14)

Figure 14:
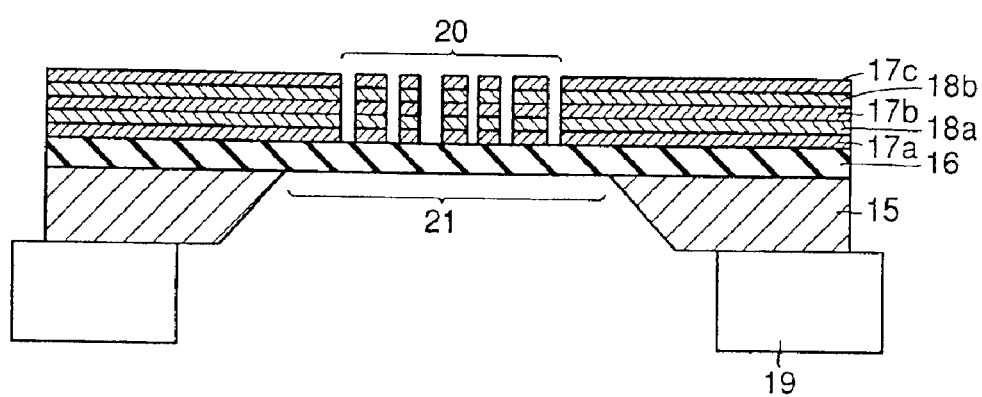
FIG. 14 is a sectional model diagram showing an X-ray mask according to an embodiment 14 of the present invention.

FIG. 14 is a sectional model diagram showing an X-ray mask according to the present invention. The X-ray mask is described with reference to FIG. 14.

Referring to FIG. 14, the X-ray mask comprises a substrate 15, a diamond membrane 16, an X-ray absorber consisting of thin films 17a to 17c of molybdenum which is a heavy element and thin films 18a and 18b of carbon which is a light element and a guard ring 19. The diamond membrane 16 is formed on the substrate 15. The molybdenum thin films 17a to 17c and the carbon thin films 18a and 18b are formed on the diamond membrane 16 as the X-ray absorber, to be alternately stacked with each other. A transfer pattern 20 is formed on this X-ray absorber. In a region located under the transfer pattern 20, a window part 21 is formed on the substrate 15. The rear surface of the diamond membrane 16 is exposed in the window part 21. The guard ring 19 is set under the substrate 15. At this point, the transfer pattern 20 formed on the X-ray absorber is formed by etching the X-ray absorber while employing a resist pattern formed with electron beam drawing as a mask.

The number of stacking of the X-ray absorber and the thicknesses of the respective layers are decided in response to a required quantity of screening, i.e., a necessary mask contrast. When rendering it a low contrast mask, for example, the number of stacking is relatively reduced to five layers as shown in FIG. 14. When rendering it a high contrast, on the other hand, the number of stacking is increased to 20 layers. When the number of stacking is at least two, a similar effect can be attained also with another number of stacking.

At this point, the wavelength region of X-rays which the X-ray absorber must screen in an exposure step employing X-rays extends over a wide region of 0.5 to 1.5 nm. In order to sufficiently screen all of a wavelength region requiring screening in the case of forming an X-ray absorber with a single material as general, therefore, it has been necessary to increase the thickness of the X-ray absorber. Consequently, the aspect ratio in the transfer pattern 20 enlarges and it has been disadvantageous in the case of forming a fine pattern.

A heavy metal, its compound, alloy and the like having been generally proposed as absorbers for X-rays in X-ray masks have high absorbability also with respect to X-rays of a shorter wavelength region to be utilized in the present invention. Therefore, it is in principle possible to employ these materials such as tungsten as the materials forming X-ray absorbers.

The inventors have prepared an X-ray mask comprising a plurality of X-ray absorbers making thicknesses of stacking of multilayer films different, in order to screen X-rays whose wavelengths are 0.5 to 1.5 nm by way of trial. Consequently, it has been possible to change the quantity of screening per wavelength, i.e., the contrast by controlling the thicknesses of stacking. That is, the contrast per wavelength of X-rays can be changed by controlling the thicknesses of stacking. Consequently, design of an X-ray mask having a contrast more suitable to the case of transferring a circuit pattern having high resolution has become possible.

While the X-ray mask shown in FIG. 14 has employed molybdenum as a heavy element and carbon as a light element, a similar effect can be attained also when employing an X-ray mask employing molybdenum as a heavy element and beryllium as a light element.

Since a diamond thin film is employed as the membrane, such a phenomenon that the membrane absorbs X-rays whose wavelengths are around 0.6 nm as in the case of employing general silicon carbide or the like as the membrane can be prevented.

When employing such an X-ray mask according to the present invention as the X-ray mask in the X-ray exposure apparatus according to the present invention shown in the embodiment 1 or the like, an exposure step can be carried out with X-rays of a shorter wavelength region than general.

Thus, the X-ray absorber consisting of a multilayer film serving as an X-ray screening material is employed, whereby it has become possible to solve such a problem that the aspect ratio of a transfer circuit pattern increases due to increase of the thickness of the X-ray absorber. Consequently, it has become possible to carry out the exposure step with short-wave X-rays whose peak wavelength is around 0.5 nm. That is, it has become possible to enlarge a resolution limit by Fresnel's diffraction which is the factor deciding the resolution limit of a proximity exposure step employing X-rays to a size region finer than general. Consequently, a circuit pattern of higher resolution than general can be transferred.

(Embodiment 15)

The inventors have employed beryllium as a membrane and prepared an X-ray mask rendering a heavy element rhodium and a light element beryllium. The structure of this X-ray mask is basically similar to the X-ray mask shown in FIG. 14. At this point, the membrane consisting of beryllium was formed by ion beam sputtering. Further, a window 21 (see FIG. 14) was formed by forming a transfer pattern on an X-ray absorber similarly to the embodiment 14 of the present invention and thereafter removing a silicon wafer employed as a substrate from the rear surface by etching.

Thus, an effect similar to the X-ray mask shown in the embodiment 14 of the present invention can be attained also by an X-ray mask employing rhodium as a heavy element and beryllium as a light element.

At this point, an X-ray mask employing a tantalum-based material or a tungsten-based material as the X-ray absorber can also be used in the X-ray exposure apparatus according to the present invention.

(Embodiment 16)

Figure 15:
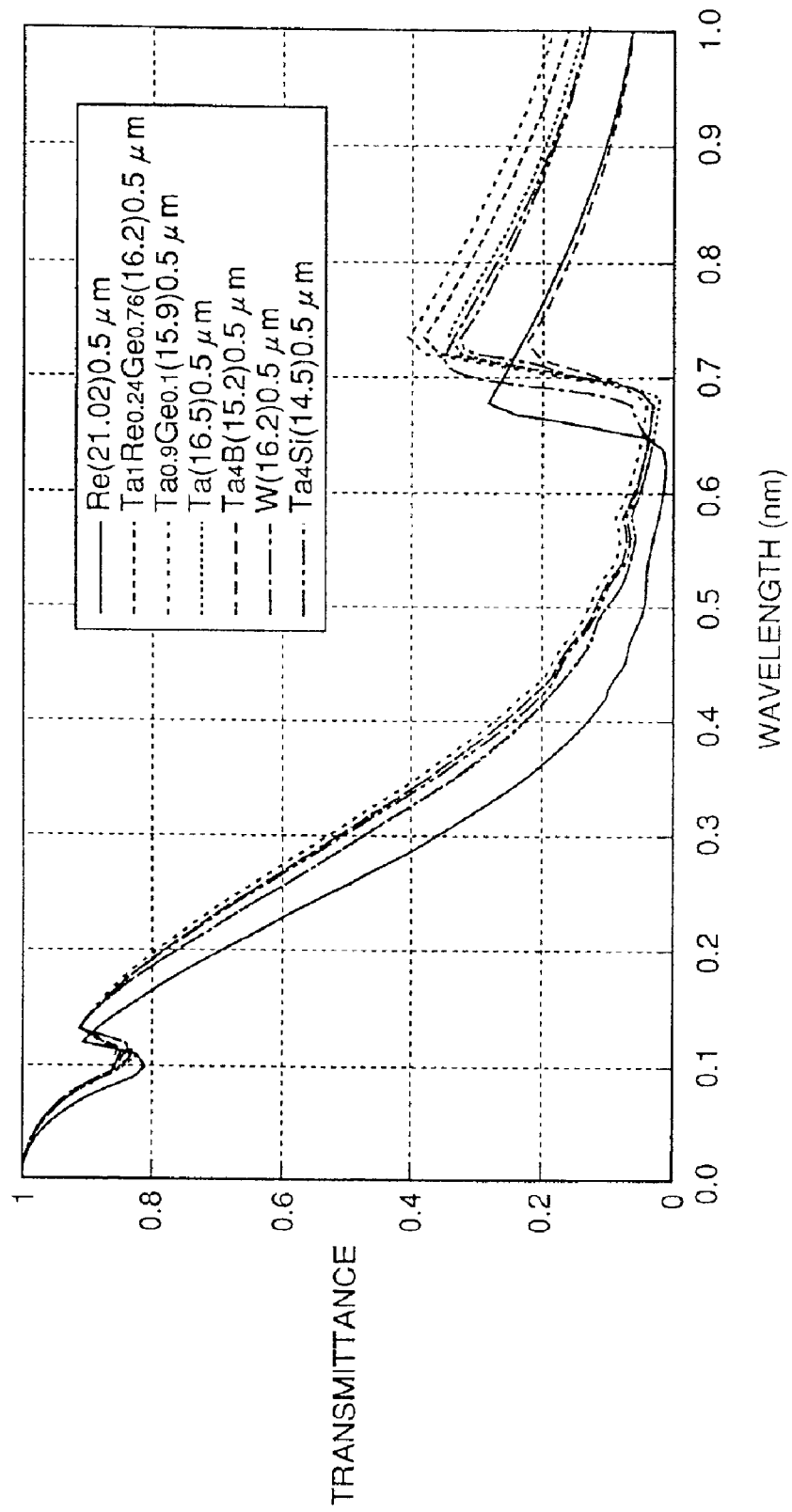
FIG. 15 is a graph showing the relations between wavelengths of X-rays and transmittance for X-rays as to materials employed as X-ray absorbers of X-ray masks.

FIG. 15 is a graph showing the relations between wavelengths of X-rays and transmittance for X-rays as to materials employed as X-ray absorbers. Among the legends in the figure, Re (21.02) 0.5 $\mu$m, for example, indicates that Re is employed as a sample, the density of this sample is 21.02 g/cm$^3$, and the thickness of the sample is 0.5 $\mu$m.

At this point, transmittance for X-rays in a tungsten- or tantalum-based material having been employed in general as an X-ray absorber lowers when converting the peak wavelength of X-rays to a shorter wavelength as the embodiments 8, 9, 11 and 13 of the present invention.

Referring to FIG. 15, when setting the peak wavelength of X-rays to 0.4 to 0.6 nm, the transmittance for X-rays becomes 0.1 to 0.5 times as compared with the case where the peak wavelength is around 0.8 nm as general. In other words, it becomes possible to render the thickness of the X-ray absorber necessary for obtaining a mask contrast similar to general 0.1 to 0.5 times. That is, it is understood possible to reduce the thickness of the X-ray absorber when employing the materials shown in FIG. 15 for the X-ray absorber as an X-ray absorber. Consequently, the aspect ratio of a transfer circuit pattern in the X-ray mask can be more reduced, whereby it becomes possible to further progress refinement of the transfer circuit pattern in the X-ray mask.

The X-ray mirrors and the X-ray masks shown in the embodiments 2 to 16 of the present invention can be applied to the X-ray exposure apparatus shown in the embodiment 1 of the present invention.

(Embodiment 17)

Figure 16:
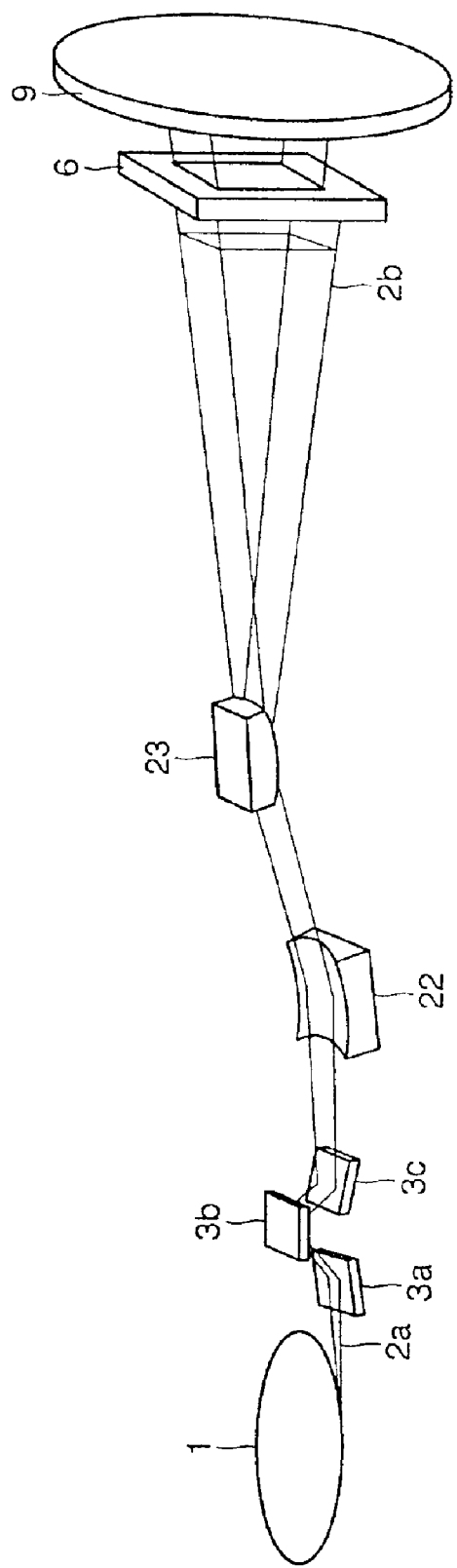
FIG. 16 is a schematic diagram of an X-ray exposure system according to the present invention.

FIG. 16 is a schematic diagram of an X-ray exposure system to which a synchrotron radiation apparatus according to the present invention is applied. With reference to FIG. 16, the synchrotron radiation apparatus and the X-ray exposure system are described.

Referring to FIG. 16, the synchrotron radiation apparatus comprises a synchrotron radiation source 1, X-ray mirrors 3a to 3c which are plane mirrors, a converging mirror 22 and a magnifying mirror 23. The X-ray exposure system comprises the aforementioned synchrotron radiation apparatus and an X-ray mask 6. The X-ray mirrors 3a to 3c consist of beryllium. The converging mirror 22 and the magnifying mirror 23 consist of rhodium respectively. At this point, the synchrotron radiation apparatus is employed as an X-ray radiation apparatus.

Radiation 2a outgoing from the synchrotron radiation source 1 is incident in order of the X-ray mirrors 3a to 3c, the converging mirror 22 and the magnifying mirror 23 as shown in FIG. 16, and finally applied to a semiconductor wafer 9 to which resist is applied through the X-ray mask 6.

The arrangement of the X-ray mirrors 3a to 3c is similar to the embodiment 11 of the X-ray mirrors according to the present invention shown in FIG. 9. The arrangement is so decided as to satisfy the numerical formula shown in numerical (2). Similarly to the embodiment 11 of the present invention, therefore, it follows that the optical axis of the radiation which is reflected light outgoing from the X-ray mirror 3c substantially overlaps with the optical axis of the radiation 2a outgoing from the synchrotron radiation source 1. Also in the case of changing the positions of the X-ray mirrors 3a to 3c or the oblique-incidence angle α (see FIG. 9) of the radiation upon the X-ray mirrors 3a to 3c, the optical axis of the radiation outgoing from the X-ray mirror 3c can be maintained on a position substantially overlapping with the optical axis of the radiation 2a outgoing from the synchrotron radiation source 1 when deciding the oblique-incidence angle α and the like to satisfy the numerical formula shown in the numerical (2), similarly to the embodiment 11 of the present invention. Consequently, the position of the optical axis of the radiation incident upon the converging mirror 22 can be kept constant also when changing the oblique-incidence angle α or the radiation in the X-ray mirrors 3a to 3c.

At this point, beryllium forming the X-ray mirrors 3a to 3c is 11.1 nm in absorption edge wavelength. Beryllium has no absorption edge in a wavelength region on a shorter wavelength side than this 11.1 nm. Therefore, X-rays having an arbitrary peak wavelength can be obtained in a wavelength region of 0.45 to 0.7 nm as shown in FIG. 13, while it is possible to absorb/cut X-rays of a shorter wavelength region than the arbitrary wavelength at the same time by changing the oblique-incidence angle of the radiation in the X-ray mirrors 3a to 3c consisting of beryllium.

Then, the radiation outgoing from the X-ray mirror 3c is incident upon the converging mirror 22 and the magnifying mirror 23. At this point, the radiation 2a outgoing from the synchrotron radiation source 1 is such that an outgoing angle in the horizontal direction is relatively large while an outgoing angle in a vertical direction is relatively small. When applying the radiation outgoing from the X-ray mirrors 3a to 3c to the X-ray mask 6 as such and carrying out an exposure step, therefore, it is difficult to secure a sufficient irradiation region in the vertical direction. In order to solve such a problem, a surface reflecting the radiation is in the form of a concave surface in the magnifying mirror 23. Consequently, an irradiation region of radiation 2b outgoing from the magnifying mirror 23 in the vertical direction can be magnified. While that whose surface reflecting the radiation is in the form of a concave surface is employed as the magnifying mirror 23 here, a magnifying mirror of the so-called mirror scan system magnifying the irradiation region of the radiation 2b outgoing from the mirror in the vertical direction by rotation-vibrating or parallel-vibrating the mirror may be employed in place of such a magnifying mirror.

The outgoing angle of the radiation 2a in the horizontal direction is relatively large, and hence it has been also difficult to attain sufficient irradiation strength when employing the radiation outgoing from the X-ray mirrors 3a to 3c as such for the exposure step. In order to solve such a problem, the surface reflecting the radiation is in the form of a concave surface in the converging mirror 22. Consequently, as to radiation at a large outgoing angle not incident upon the X-ray mask 6 when the converging mirror 22 is not present, the traveling direction of the radiation can be changed to be incident upon the X-ray mask 6. Therefore, the irradiation strength for the radiation incident upon the X-ray mask 6 can be increased.

Figure 17:
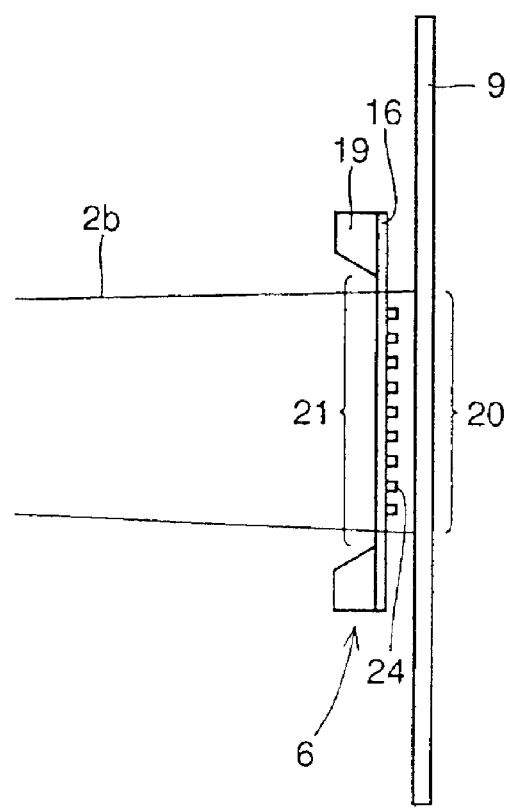
FIG. 17 is a partially enlarged sectional view showing an X-ray mask and a semiconductor wafer in FIG. 16.

Then, the radiation 2b outgoing from the magnifying mirror 23 is applied to the X-ray mask 6. The X-ray mask 6 comprises a guard ring 19, a diamond membrane 16 and a transfer pattern 20 consisting of an X-ray absorber 24, as shown in FIG. 17. The transfer pattern 20 is formed on a region located on a window part 21 in which the rear surface of the diamond membrane 16 is exposed. At this point, FIG. 17 is a partially enlarged sectional view showing the X-ray mask and a semiconductor wafer in FIG. 16. Referring to FIG. 17, the thickness of the diamond membrane 16 was set to 1 μm. As the material for the X-ray absorber 24, a material similar to the X-ray absorber of the X-ray mask in the embodiment 14 of the present invention can be employed. The radiation 2b transmitted through the X-ray mask 6 is applied to the semiconductor wafer 9 having a surface to which the resist is applied, and sensitizes the resist. Thus, the transfer pattern 20 of the X-ray mask 6 is transferred to the resist.

At this point, rhodium forming the converging mirror 22 and the magnifying mirror 23 can reflect radiation whose wavelength is substantially at least 0.45 nm under such a condition that the oblique-incidence angle is not more than 1.0°. Therefore, radiation of a wavelength region of at least 0.45 nm can be reliably obtained by setting the oblique-incidence angle of the radiation in the converging mirror 22 and the magnifying mirror 23 to not more than 1.0°.

In the synchrotron radiation apparatus and the X-ray exposure system according to the present invention, the X-ray mirrors 3a to 3c, the converging mirror 22 and the magnifying mirror 23 are set under ultrahigh vacuum environment. On the other hand, the X-ray mask 6 and the semiconductor wafer 9 are set under atmospheric pressure environment, or in a decompressed helium atmosphere or in the air. Therefore, an X-ray transmission window (not shown) defining a vacuum partition is set between the magnifying mirror 23 and the X-ray mask 6. Beryllium may be employed as the material for this X-ray transmission window. This beryllium has no absorption edge in the wavelength region of 0.45 to 0.7 nm. Therefore, the X-ray transmission window employing a beryllium film can efficiently transmit X-rays of the aforementioned wavelength region. Thus, it is preferable to employ a material such as beryllium having an absorption edge only in at least either one of a wavelength region of less than 0.45 nm and a wavelength region exceeding 0.7 nm, i.e., a material having no absorption edge in the wavelength region of at least 0.45 nm and not more than 0.7 nm also as the material for the X-ray transmission window. When the thickness of a portion transmitting X-rays in the X-ray transmission window can be sufficiently reduced, however, a material other than the above may be employed.

In the synchrotron radiation apparatus and the X-ray exposure system according to the present invention, the diamond membrane 16 is employed as the membrane of the X-ray mask 6. The absorption edge wavelength of carbon forming this diamond membrane is 4.368 nm, and carbon has no absorption edge in a shorter wavelength region than this 4.368 nm. On the other hand, silicon carbide having been employed as a membrane in general has an absorption edge in the wavelength region of 0.45 nm to 0.7 nm, and hence transmittance for X-rays lowers in the aforementioned wavelength region, as shown in FIG. 5. From this, it is understood that transmittance for X-rays in the wavelength region of 0.45 nm to 0.7 nm included in radiation can be more enlarged in the diamond membrane 16 as compared with a conventional membrane employing silicon carbide. Thus, the radiation (X-rays) 2b in the wavelength region of 0.45 nm to 0.7 nm can be effectively utilized by employing the X-ray mask shown in FIG. 17.

Thus, in the synchrotron radiation apparatus and the X-ray exposure system according to the present invention, radiation (X-rays) of the wavelength region of 0.45 nm to 0.7 nm can be obtained, while radiation components of a shorter wavelength side than an arbitrary wavelength in the wavelength region of 0.45 nm to 0.7 nm can be cut by controlling the oblique-incidence angle of the X-rays in the X-ray mirrors 3a to 3c. The aforementioned radiation components on the shorter wavelength side generate photoelectrons in the resist applied to the semiconductor wafer and hence become a factor lowering resolution of the transfer pattern transferred to the resist. According to the present invention, however, such radiation components on the shorter wavelength side can be reliably absorbed/cut and hence high resolution can be reliably attained as to the transfer pattern transferred to the resist.

Figure 18:
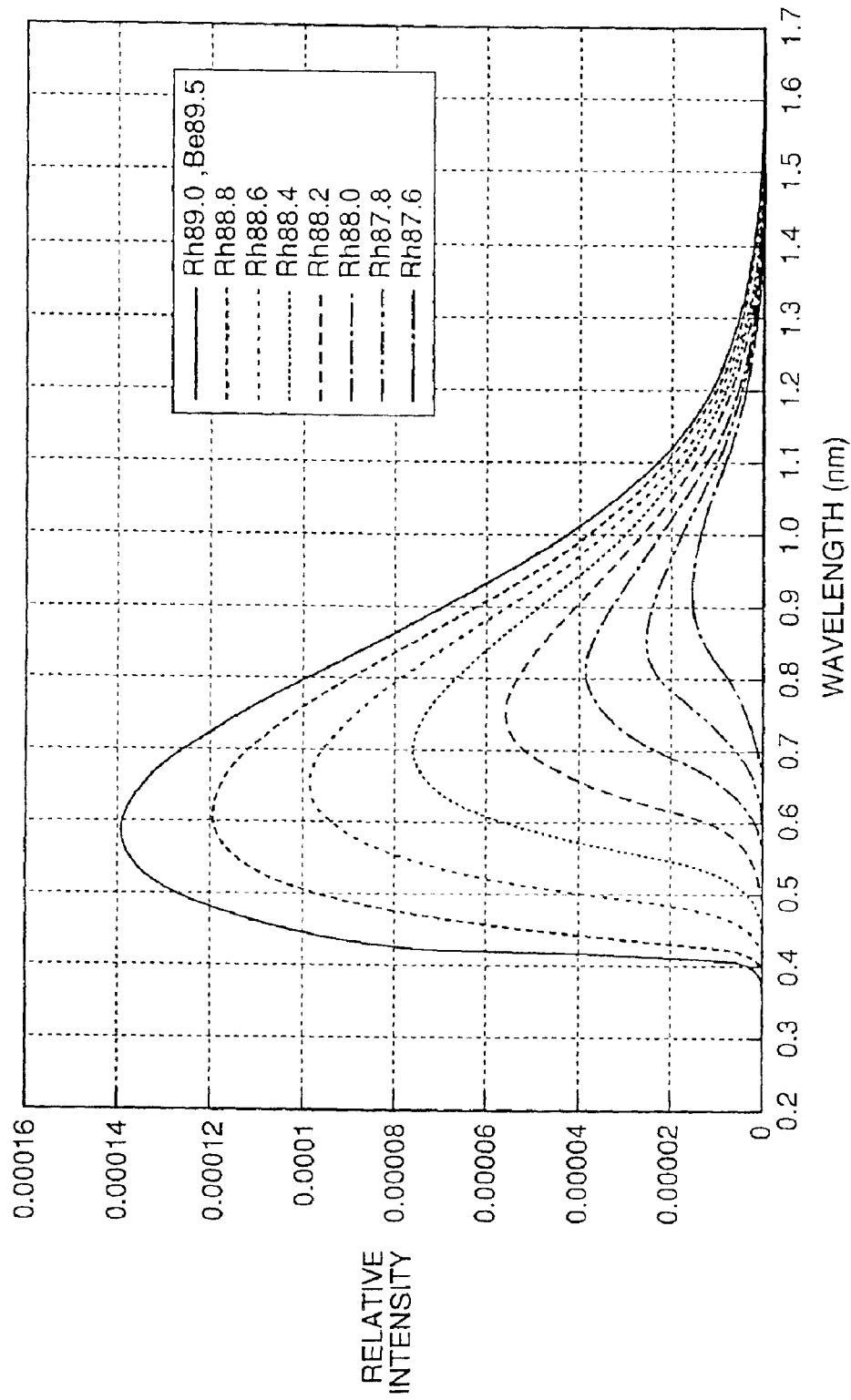
FIG. 18 is a graph showing the relations between wavelengths of X-rays and relative intensity obtained in synchrotron radiation apparatuses and X-ray exposure systems comprising mirrors consisting of beryllium and mirrors consisting of rhodium.

In the synchrotron radiation apparatus and the X-ray exposure system shown in FIG. 16, two X-ray mirrors consisting of beryllium may be employed in place of the X-ray mirrors 3a to 3c. These two X-ray mirrors may be similar in structure to the X-ray mirrors in the embodiment 8 of the present invention shown in FIG. 8. In this case, an effect similar to the embodiment 8 of the present invention can be attained. Spectra of radiation outgoing from the magnifying mirror 23 in the case of fixing the oblique-incidence angle α (see FIG. 8) of radiation in these two X-ray mirrors consisting of beryllium to 0.5° (incidence angle to 89.5°) and changing the oblique-incidence angle of the radiation in the converging mirror 22 and the magnifying mirror 23 (see FIG. 16) consisting of rhodium from 1.0° to 2.4° are shown in FIG. 18. At this point, FIG. 18 is a graph showing the relations between wavelengths of X-rays and relative intensity obtained in the X-ray exposure system comprising mirrors consisting of beryllium and mirrors consisting of rhodium.

At this point, rhodium has absorption edges at 0.3629 nm, 0.39425 nm and 0.41299 nm, and rhodium has no absorption edge in the wavelength region of 0.45 nm to 0.7 nm. When employing mirrors consisting of rhodium, therefore, spectra of X-rays are not disturbed due to such a phenomenon that X-rays are abruptly absorbed in the wavelength region of 0.45 nm to 0.7 nm. Consequently, X-rays exhibiting spectra in the form of stable and smooth curves can be obtained also when changing the oblique-incidence angle of the mirrors consisting of rhodium, as shown in FIG. 18.

Figure 19:
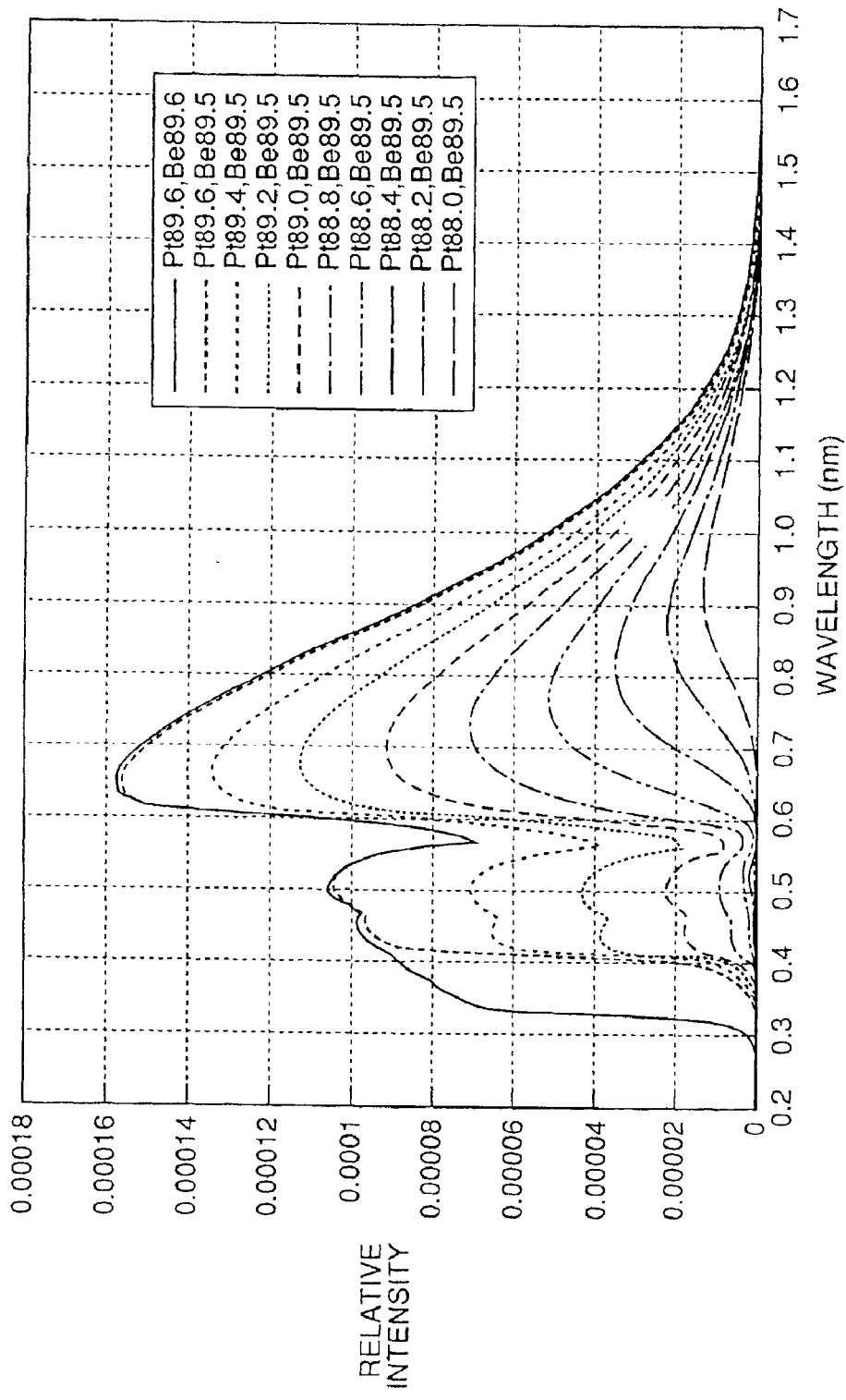
FIG. 19 is a graph showing the relations between wavelengths of X-rays and relative intensity obtained in synchrotron radiation apparatuses and X-ray exposure systems comprising mirrors consisting of beryllium and mirrors consisting of platinum.

At this point, FIG. 19 shows spectra of X-rays obtained when employing mirrors consisting of platinum in place of the aforementioned mirrors consisting of rhodium in the aforementioned synchrotron radiation apparatus and X-ray exposure system as comparative example. FIG. 19 is a graph showing the relations between wavelengths of X-rays and relative intensity obtained in the synchrotron radiation apparatus and the X-ray exposure system comprising mirrors consisting of beryllium and mirrors consisting of platinum. FIG. 19 shows data in the case of setting the oblique-incidence angle of the mirrors consisting of beryllium to 0.4° or 0.5° (incidence angle to 89.6° or 89.5°) and changing the oblique-incidence angle of the mirrors consisting of platinum from 0.4° to 2.0° (incidence angle from 89.6° to 88°). Platinum has absorption edges at 0.4093 nm, 0.4686 nm, 0.559 nm and 0.581 nm, and hence the intensity of X-rays lowers at the wavelengths corresponding to the absorption edges, as shown in FIG. 19. Also when changing the oblique-incidence angle of the mirrors consisting of platinum, the intensity of X-rays thus lowers at the wavelengths corresponding to the absorption edges.

Thus, referring to FIG. 18 and FIG. 19, X-rays in the aforementioned wavelength region can be more effectively utilized when employing the X-ray mirrors according to the present invention consisting of rhodium than the case of employing X-ray mirrors consisting of platinum.

Referring to FIG. 19, an X-ray spectrum (hereinafter referred to as a spectrum 1) in the case of setting the oblique-incidence angle of the mirrors consisting of platinum to 0.4° (incidence angle to 89.6°) and setting the oblique-incidence angle of the mirrors consisting of beryllium to 0.4° (incidence angle to 89.6°) is displayed with a solid line. An X-ray spectrum (hereinafter referred to as a spectrum 2) in the case of setting the oblique-incidence angle of the mirrors consisting of platinum to 0.4° (incidence angle to 89.6°) and setting the oblique-incidence angle of the mirrors consisting of beryllium to 0.5° (incidence angle to 89.5°) is displayed with a dotted line. Comparing this spectrum 1 with the spectrum 2, it is understood that X-rays of a wavelength region of not more than 0.4 nm can be reliably absorbed/cut by changing the oblique-incidence angle of the mirrors consisting of beryllium from 0.4° to 0.5°.

Figure 20:
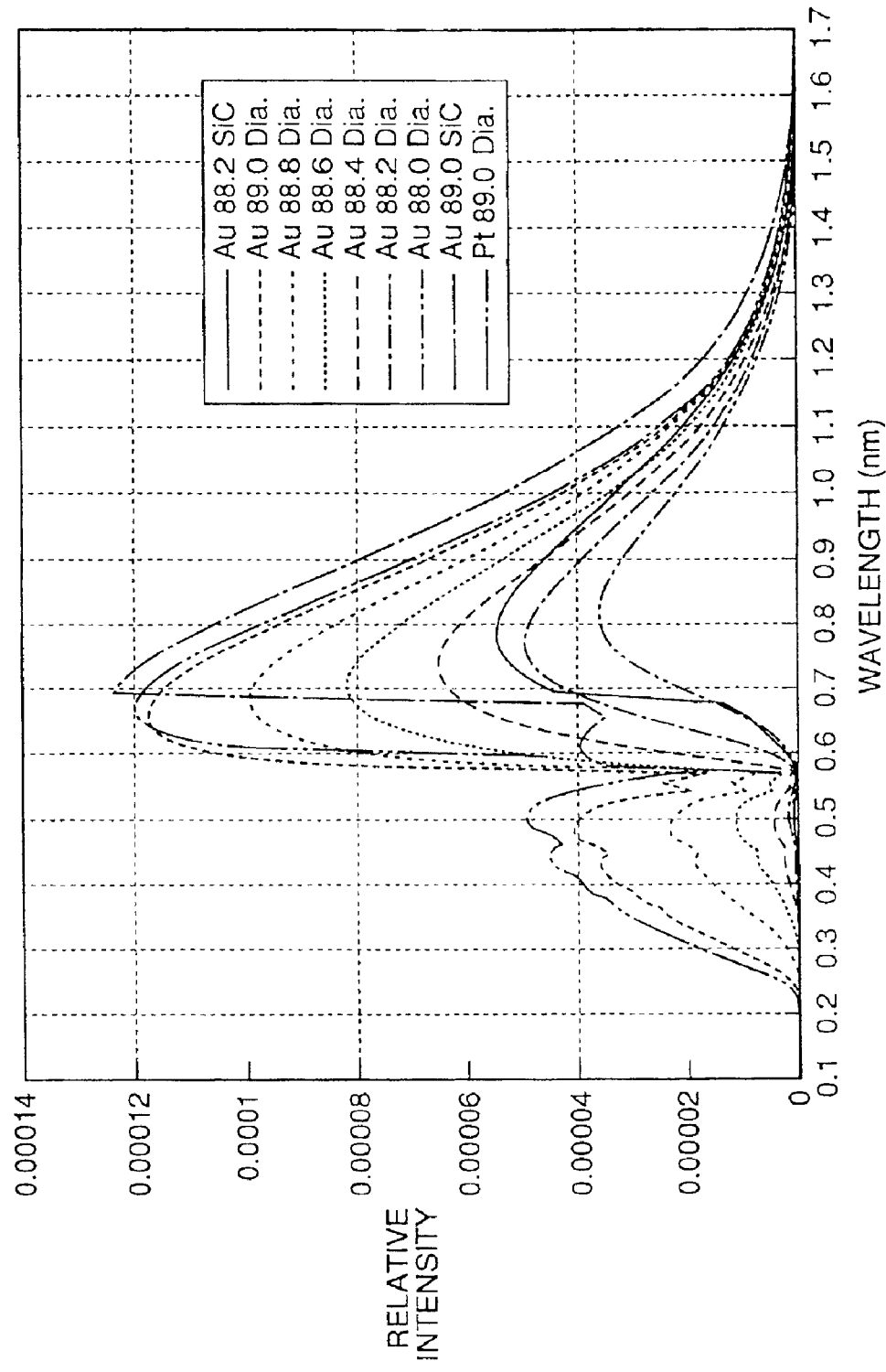
FIG. 20 is a graph showing the relations between wavelengths of X-rays transmitted through X-ray masks and relative intensity.

FIG. 20 shows X-ray spectra after transmitting X-rays reflected from two X-ray mirrors consisting of gold through a membrane of an X-ray mask. At this point, FIG. 20 is a graph showing the relations of wavelengths of X-rays transmitted through the X-ray mask and relative intensity. FIG. 20 shows the case of employing the diamond membrane according to the present invention as the membrane and the case of employing a conventional membrane consisting of silicon carbide.

Referring to FIG. 20, when employing silicon carbide as the membrane, silicon has an absorption edge in a wavelength range of 0.6738 and hence the intensity of the X-rays remarkably lowers at this absorption edge wavelength. On the other hand, no such intensity lowering of X-rays takes place in the case of employing the diamond membrane as the membrane of the X-ray mask. Since the mirrors consisting of gold are employed at this point, the intensity of X-rays lowers at 0.3616 nm, 0.3936 nm, 0.4518 nm, 0.5374 nm and 0.5584 nm which are absorption edge wavelengths of gold.

In the synchrotron radiation apparatus and the X-ray exposure system shown in FIG. 16 at this point, the X-ray mirrors and the X-ray masks shown in the embodiments 1 to 16 of the present invention can be applied.

(Embodiment 18)

Figure 21:
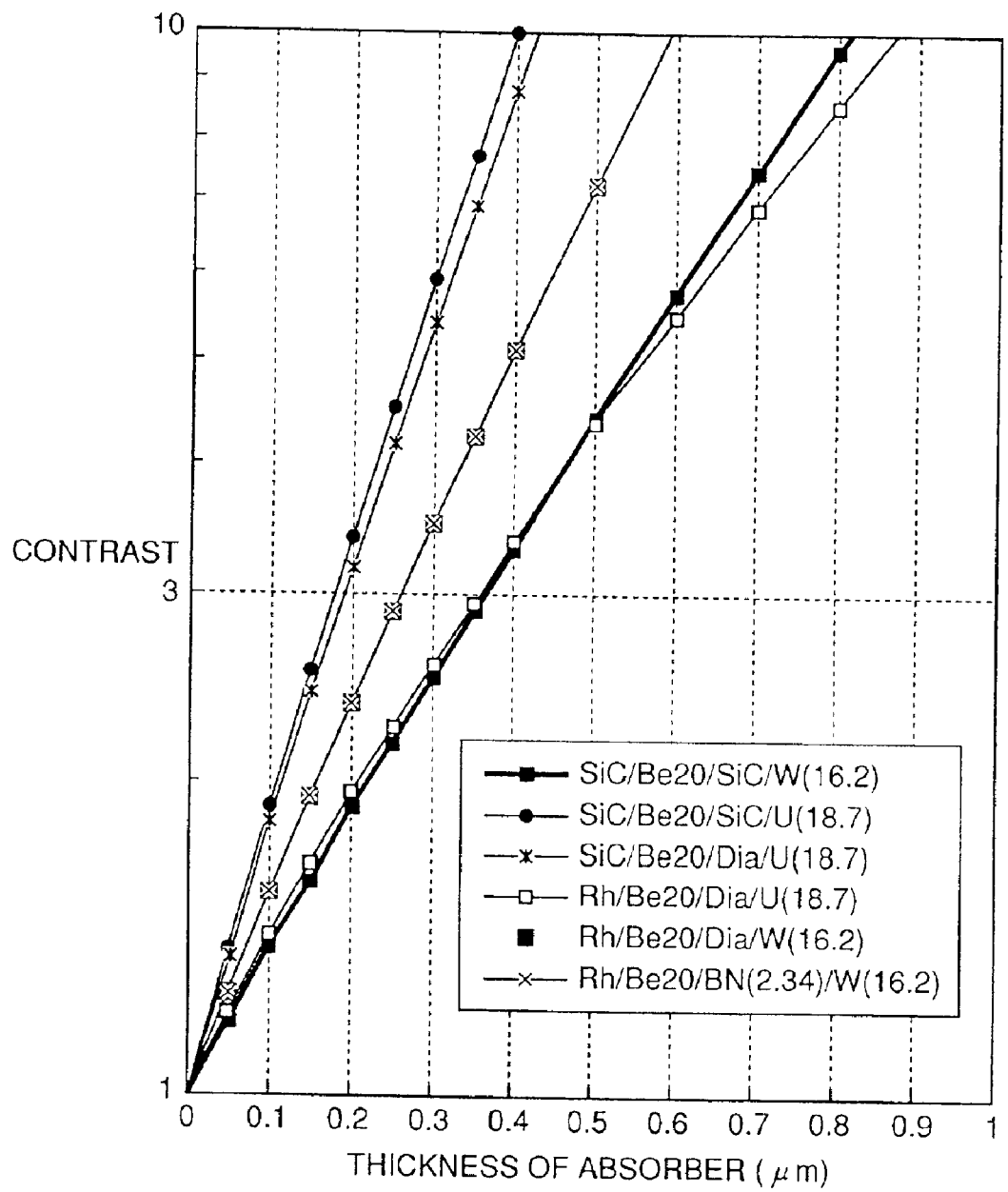
FIG. 21 is a graph showing the relations between thicknesses of X-ray absorbers and contrasts as to X-ray masks according to the present invention.
Figure 22:
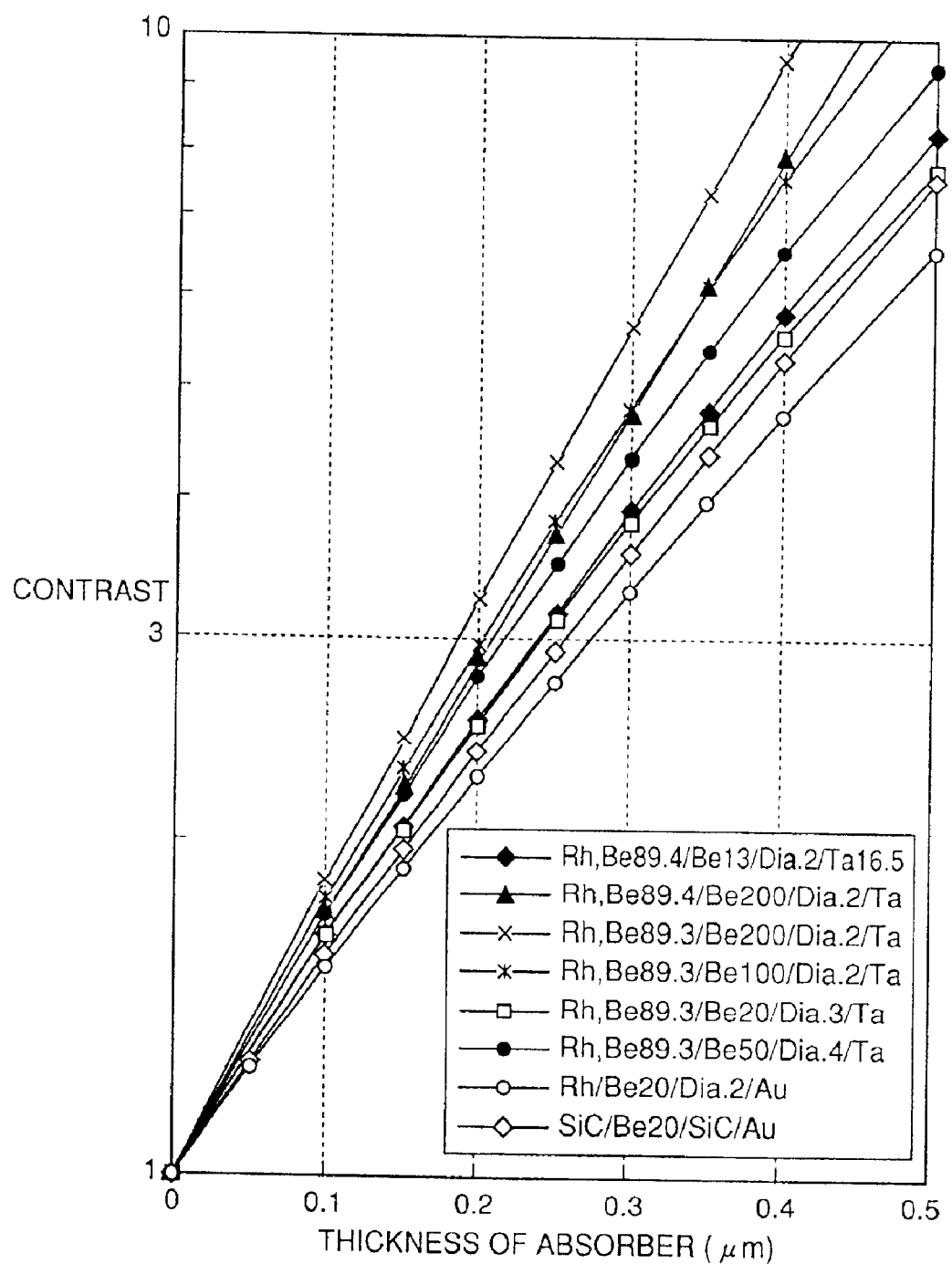
FIG. 22 is a graph showing the relations between thicknesses of X-ray absorbers and contrasts as to X-ray masks according to the present invention.
Figure 23:
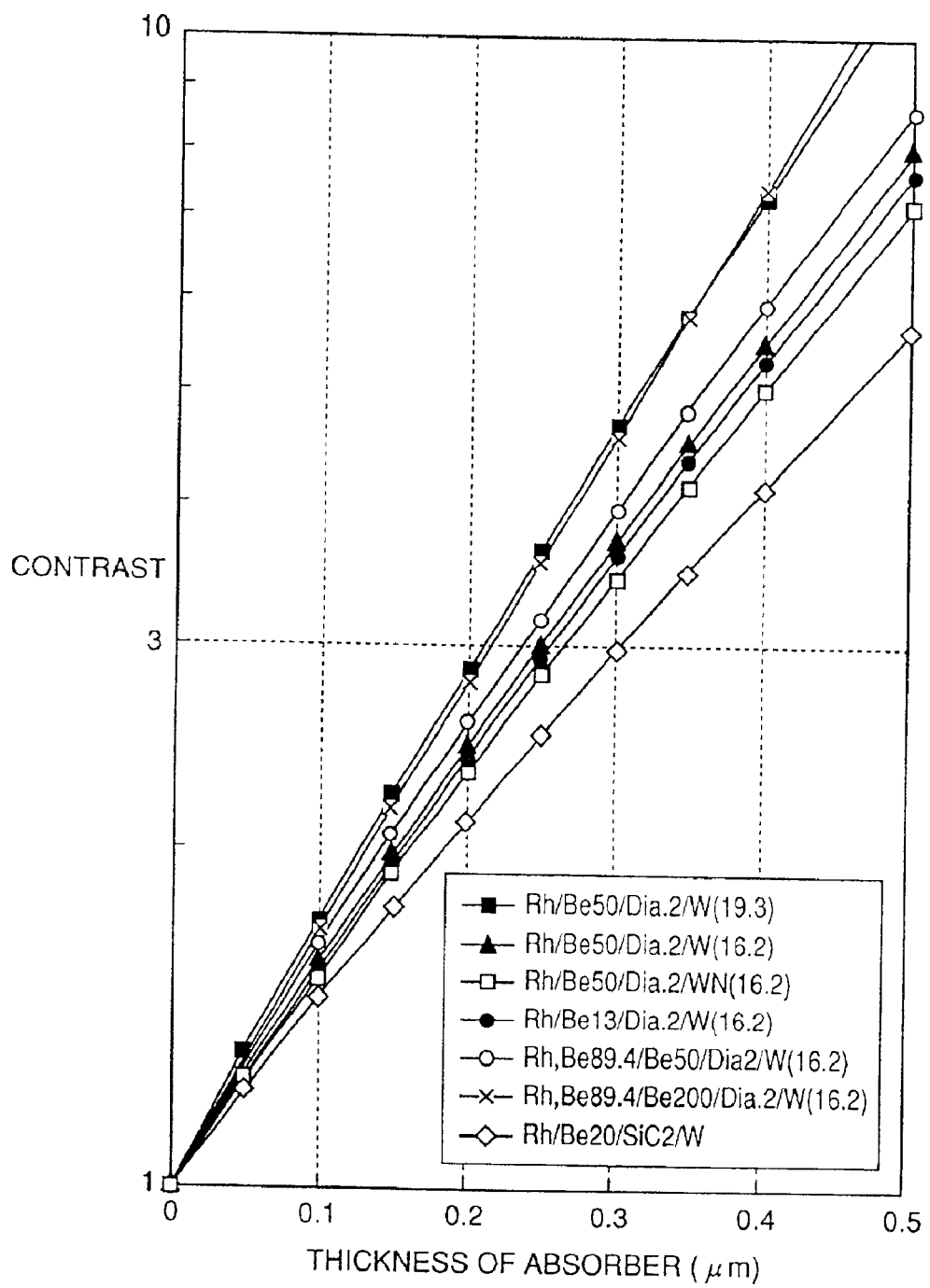
FIG. 23 is a graph showing the relations between thicknesses of X-ray absorbers and contrasts as to X-ray masks according to the present invention.
Figure 24:
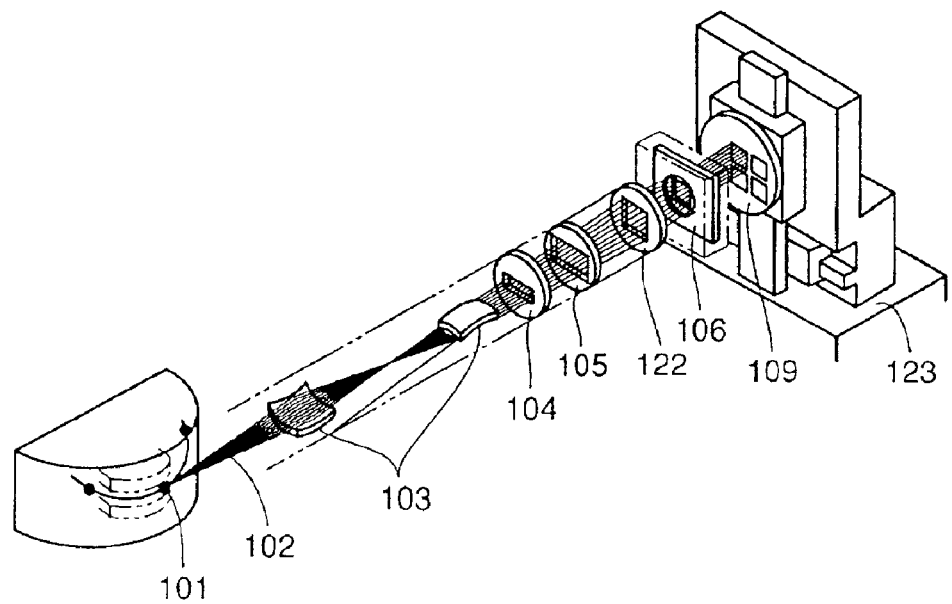
FIG. 24 is a schematic diagram of a conventional X-ray exposure apparatus.

As to X-ray masks, data of contrasts in the case of employing various materials as membranes and X-ray absorbers were obtained by simulations. FIGS. 21 to 23 are graphs showing the relations between the thicknesses of the X-ray absorbers and the contrasts as to the X-ray masks according to the present invention. At this point, it is assumed that the contrast is the ratio of the intensity of X-rays transmitted only through the membrane to the intensity of X-rays transmitted through both of the X-ray absorber and the membrane in the X-ray mask.

Referring to FIGS. 21 to 23, the relations between the thicknesses of the X-ray absorbers and the contrasts were investigated as to various combinations of materials for the membranes and the X-ray absorbers. At this point, display of legends in FIG. 21 shows material for X-ray mirror/thickness of beryllium window/material for membrane of X-ray mask/material for X-ray absorber (density of X-ray absorber). More specifically, SiC/Be20/SiC/W(16.2), for example, means that the material for the X-ray mirror is SiC/the thickness of a beryllium thin film of the beryllium window is 20 $\mu$m/the material for the membrane of the X-ray mask is SiC/the material for the X-ray absorber is tungsten (W), and the density of this X-ray absorber is 16.2 g/cm$^3$.

Referring to FIG. 21, data employing SiC as the X-ray mirror corresponds to conventional X-ray exposure conditions, and is the case of introducing X-rays having a peak wavelength in a wavelength region exceeding 0.7 nm into the X-ray mask. Data employing rhodium (Rh) as the X-ray mirror corresponds to the X-ray exposure conditions according to the present invention, and is the case of introducing X-rays having a peak wavelength in the wavelength region of at least 0.45 nm and not more than 0.7 nm into the X-ray mask.

First, data in the case of irradiating an X-ray mask employing SiC as a membrane and forming an X-ray absorber consisting of metal uranium (U) on the membrane with synchrotron radiation reflected by an X-ray mirror consisting of SiC (conventional exposure conditions) is shown by a legend of black circles. The incidence angle in this X-ray mirror consisting of SiC was set to 89°. The thickness of the membrane was set to 2 $\mu$m. At this point, a contrast suitable for transferring a pattern of high resolution whose design rule is about 0.05 $\mu$m is at least 3. Referring to FIG. 21, the thickness of an X-ray absorber consisting of uranium necessary for implementing this contrast 3 was about 0.18 $\mu$m. In this case, the aspect ratio of a transfer circuit pattern formed on the X-ray absorber is about 3.6, sufficiently smaller than such an aspect ratio that influence of a waveguide effect becomes remarkable. That is, it is understood that the aforementioned X-ray mask can manage both proper contrast and aspect ratio under the conventional exposure conditions. Further, it is understood that a substantially similar result appears also when employing diamond (Dia.) as the membrane in place of SiC in these conventional exposure conditions.

Then, an X-ray mask comprising the aforementioned diamond membrane and an X-ray absorber consisting of uranium was applied to exposure conditions according to the present invention. The result is shown by a legend of white squares. At this point, the incidence angle of X-rays in an X-ray mirror consisting of rhodium was set to 89°. In this case, the thickness of the X-ray absorber consisting of uranium was necessary by about 0.37 $\mu$m, in order to obtain the necessary contrast 3. In this case, the aspect ratio at the time when the design rule is 0.05 $\mu$m enlarges to 7.4. When the design rule becomes 0.035 $\mu$m, the aspect ratio exceeds 10. When the aspect ratio thus enlarges, it becomes difficult to transfer a fine circuit pattern due to a waveguide effect.

Then, a case of applying an X-ray mask according to the present invention comprising a diamond membrane and an X-ray absorber consisting of tungsten to exposure conditions according to the present invention is shown by black squares. At this point, carbon forming diamond has an absorption edge at a wavelength of 4.368 nm. Therefore, the diamond membrane does not strongly absorb X-rays in the wavelength region of at least 0.45 nm and not more than 0.7 nm employed as exposure light in the exposure conditions according to the present invention. Further, tungsten has an absorption edge at a wavelength of 0.68 nm. Therefore, X-ray absorbance of the X-ray absorber consisting of tungsten sufficiently enlarges as to X-rays employed as exposure light in the exposure conditions according to the present invention. Consequently, the thickness of the X-ray absorber consisting of tungsten necessary for obtaining the necessary contrast 3 was about 0.24 $\mu$m, as shown in FIG. 21. That is, the thickness of the X-ray absorber can be more reduced than the case of employing uranium as the X-ray absorber. In this case, the aspect ratio at the time when the design rule is 0.05 $\mu$m becomes 4.8, and it is possible to reduce influence by a waveguide effect. Consequently, it is understood that a sufficient contrast and a small aspect ratio can be managed and hence it is possible to transfer a fine circuit pattern. That is, it is understood that the aforementioned X-ray mask according to the present invention is particularly effective when employing X-rays of a shorter wavelength region than general as exposure light as in the exposure conditions according to the present invention.

A case of applying an X-ray mask comprising a membrane consisting of SiC and an X-ray absorber consisting of tungsten to the conventional exposure conditions is shown by black squares+a thick line. In this case, the thickness of the X-ray absorber consisting of tungsten necessary for obtaining the necessary contrast 3 becomes about 0.37 $\mu$m, and the aspect ratio at the time when the design rule is 0.05 $\mu$m enlarges to 7.4, as understood also from FIG. 21. Consequently, it is understood that it becomes difficult to transfer a fine circuit pattern when applying the X-ray absorber consisting of tungsten to the conventional exposure conditions.

Further, data in a case of applying an X-ray mask comprising a membrane consisting of boron nitride (BN) and an X-ray absorber consisting of tungsten to the exposure conditions according to the present invention is also similarly shown. Also in this case, it is understood a contrast of a sufficient magnitude and a small aspect ratio can be managed and hence it is possible to transfer a fine circuit pattern. The absorption edge of carbon forming diamond is 4.368 nm, and the absorption edge of nitrogen is 3.099 nm.

Then, as to the case of employing tantalum (Ta) and tungsten (W) as X-ray absorbers, the relations between contrasts and X-ray absorber thicknesses at the time of changing wavelength spectra of X-rays were obtained. At this point, the wavelength spectra of the X-rays were changed by changing the thicknesses of beryllium thin films of beryllium windows. FIGS. 22 and 23 show the results. At this point, display of legends in FIGS. 22 and 23 is basically similar to the display of legends in FIG. 21. However, materials are also described in the case of employing two X-ray mirrors, and incidence angles of X-rays in the X-ray mirrors were also described. For example, Rh,Be89.4/Be13/Dia.2/Ta16.5 means that an X-ray mirror consisting of rhodium (Rh) and an X-ray mirror consisting of beryllium (Be) are employed and the incidence angle of X-rays in the X-ray mirror consisting of Be is 89.4°/the thickness of the beryllium thin film of the beryllium window is 13 µm/the material for the membrane of the X-ray mask is diamond and the thickness is 2 µm/the material for an X-ray absorber is tantalum and the density of this X-ray absorber is 16.5 g/cm$^3$.

Referring to FIG. 22, it is understood that, when employing gold (Au) as an X-ray absorber, an X-ray absorber thickness necessary for obtaining a necessary contrast becomes thicker than the case of the X-ray mask according to the present invention. It is also understood that, when employing gold as the X-ray absorber, the thickness of the X-ray absorber for obtaining the necessary contrast becomes thicker than conventional exposure conditions, under exposure conditions according to the present invention.

Referring to FIGS. 22 and 23, a large contrast and a small aspect ratio can be managed when employing the X-ray mask according to the present invention comprising a diamond membrane and an X-ray absorber employing tantalum and tungsten under the exposure conditions according to the present invention employing rhodium as an X-ray mirror. Consequently, it is understood possible to transfer a fine circuit pattern.

While tungsten and tantalum have been employed as X-ray absorbers at this point, a similar effect can be attained also by employing an alloy or a compound such as TaGe, TaReGe, WN, WSi, WGe, WRe, WReGe or the like as the X-ray absorber in the X-ray mask according to the present invention. Although diamond has been employed as the membrane, a similar effect can be attained when employing a material such as boron nitride, diamond-like carbon or beryllium having no absorption edge in the wavelength region of at least 0.45 nm and not more than 0.7 nm as the membrane.

The X-ray mask shown in the embodiment 18 is applicable to the X-ray exposure apparatus shown in embodiment 1 and the synchrotron radiation apparatus and the X-ray exposure system shown in the embodiment 17. As to the X-ray absorber of the X-ray mask in this embodiment 18, a similar effect can be attained also when bringing this X-ray absorber into a multilayer structure as shown in FIG. 14.

The embodiments disclosed this time must be considered illustrative in all points and not restrictive. The scope of the present invention is shown not by the aforementioned embodiments but by the scope of claim, and it is intended that all modifications within the meaning and range equivalent to the scope of claim are included.

It is possible to utilize the present invention in a method of manufacturing a semiconductor device and manufacturing equipment for a semiconductor device or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An X-ray exposure apparatus, comprising:

a first stage X-ray mirror, and a second stage X-ray mirror, wherein $\alpha$ represents an angle of oblique incidence of an X-ray incident on said first stage X-ray mirror and said second stage X-ray mirror, L$\alpha$ represents a distance between said first and second stage X-ray mirrors, L$\alpha$ has a same direction of an optical axis of the X-ray incident on said first stage X-ray mirror, D represents a distance from incidence of an optical axis of the X-ray incident on said first stage X-ray mirror to said second stage X-ray mirror, and has a direction of an axis orthogonal to the optical axis of the X-ray incident on said first stage X-ray mirror and along a plane defined by the optical axis of the X-ray incident on said first stage mirror and an X-ray reflected from said first stage mirror, and said $\alpha$ and L$\alpha$ are changed to satisfy a relationship D=L$\alpha$×tan(2$\alpha$), whereby a spectral distribution of an X-ray outgoing from said second stage is changed, wherein the direction of the optical axis of the X-ray incident on said first stage X-ray mirror is substantially identical to a direction of the optical axis of the X-ray output from the second stage X-ray mirror.

2. An X-ray exposure apparatus, comprising:

a first stage X-ray mirror, a second stage X-ray mirror, and a third stage X-ray mirror, wherein $\alpha$ represents an angle of oblique incidence of an X-ray incident on said first stage X-ray mirror and said third stage X-ray mirror, 2$\alpha$ represents an angle of oblique incidence of an X-ray incident on said second stage X-ray mirror, L represents a distance between said first and second stage X-ray mirrors and a distance between said second and third stage X-ray mirrors, L has a same direction of an optical axis of the X-ray incident on said first stage X-ray mirror, D$\alpha$ represents a distance from incidence of an optical axis of the X-ray incident on said first stage X-ray mirror to said second stage X-ray mirror, and has a direction of an axis along the optical axis of the X-ray incident on said first stage X-ray mirror and orthogonal to a plane defined by the optical axis of the X-ray incident on said first stage mirror and an X-ray reflected from said first stage mirror, and said $\alpha$ and D$\alpha$ are changed to satisfy a relationship D$\alpha$=L×tan(2$\alpha$), whereby a spectral distribution of an X-ray outgoing from said third stage is changed, wherein the direction of the optical axis of the X-ray incident on said first stage X-ray mirror is substantially identical to a direction of the optical axis of the X-ray output from the third stage X-ray mirror.

3. An X-ray exposure apparatus, comprising:

a first stage X-ray mirror, a second stage X-ray mirror, a third stage X-ray mirror, and a fourth stage X-ray mirror, wherein $\alpha$ represents an angle of oblique incidence of an X-ray incident on each of said first, second, third, and fourth stage X-ray mirrors, L represents a distance between said first and second stage X-ray mirrors and a distance between said third and fourth stage X-ray mirrors, L has a same direction of an optical axis of the X-ray incident on said first stage X-ray mirror, Dα represents a distance from incidence of an optical axis of the X-ray incident on said first stage X-ray mirror to said third and fourth stage X-ray mirrors, and has a direction of an axis orthogonal to the optical axis of the X-ray incident on said first stage X-ray mirror and along a plane defined by the optical axis of the X-ray incident on said first stage mirror and an X-ray reflected from said first stage mirror, and said α and Dα are changed to satisfy a relationship Dα=L×tan(2α), whereby a spectral distribution of an X-ray outgoing from said fourth stage is changed, wherein the direction of the optical axis of the X-ray incident on said first stage X-ray mirror is substantially identical to a direction of the optical axis of the X-ray output from the fourth stage X-ray mirror.

4. An X-ray exposure apparatus, comprising:

a first stage X-ray mirror, a second stage X-ray mirror, a third stage X-ray mirror, and a fourth stage X-ray mirror, wherein α represents an angle of oblique incidence of an X-ray incident on each of said first and fourth stage X-ray mirrors, β represents and angle of oblique incidence of an X-ray incident on each of said second and third stage X-ray mirrors, Lα represents a distance between said first and second stage X-ray mirrors and a distance between said third and fourth stage X-ray mirrors, as seen along an x-axis corresponding to a direction of the X-ray incident on said first stage X-ray mirror, Lβ represents a distance between said second and third stage X-ray mirrors, as seen along said x-axis, D represents a distance between said second and third stage X-ray mirrors, as seen along a y-axis corresponding to a direction perpendicular to said x-axis, and said α, β, Lα and Lβ are changed to satisfy a relationship D=2×Lα×tan(2α)=β×tan 2(β−α), whereby a spectral distribution of an X-ray outgoing from said fourth stage is changed, wherein the direction of the optical axis of the X-ray incident on said first stage X-ray mirror is substantially identical to a direction of the optical axis of the X-ray output from the fourth stage X-ray mirror.

5. An X-ray exposure method employing an X-ray exposure apparatus including two X-ray mirrors including first and second stage X-ray mirrors, comprising the steps of changing a spectral distribution, rendering substantially identical a direction of an optical axis of an X-ray incident on said first stage X-ray mirror and a direction of an optical axis of an X-ray outgoing from said second stage X-ray mirror, and also changing a spectral distribution of the X-ray outgoing from said second stage X-ray mirror, by changing α and Lα to satisfy a relationship D=Lα×tan(2α), wherein α represents an angle of oblique incidence of an X-ray incident on said first and second stage X-ray mirrors, Lα represents a distance between said first and second stage X-ray mirrors as seen along an x axis corresponding to a direction of the X-ray incident on said first stage X-ray mirror, and D represents a distance from incidence of an optical axis of the X-ray incident on said first stage X-ray mirror to said second stage X-ray mirror, as seen along a y axis corresponding to a direction perpendicular to said x axis;

causing an X-ray incident on said first stage X-ray mirror; and exposing to an X-ray outgoing from said first stage X-ray mirror via said second stage X-ray mirror.

6. An X-ray exposure method employing an X-ray exposure apparatus including three X-ray mirrors including first, seconds and third stage X-ray mirrors, comprising the steps of:

changing a spectral distribution, rendering substantially identical an optical axis of an X-ray incident on said first stage X-ray mirror and an optical axis of an X-ray outgoing from said third stage X-ray mirror, and also changing a spectral distribution of the X-ray outgoing from said third stage X-ray mirror, by changing α and Dα to satisfy a relationship Dα=L×tan(2α), wherein α represents an angle of oblique incidence of an X-ray incident on said first and third stage X-ray mirrors, 2α represents an angle of oblique incidence of an X-ray incident on said second stage X-ray mirror, L represents a distance between said first and second stage X-ray mirrors and a distance between said second and third stage X-ray mirrors, as seen along an x axis corresponding to a direction of the X-ray incident on said first stage X-ray mirror and Dα represents a distance from incidence of an optical axis of the X-ray incident on said first stage X-ray mirror to said second stage X-ray mirror, as seen along a y axis corresponding to a direction perpendicular to said x axis;

causing an X-ray incident on said first stage X-ray mirror; and exposing to an X-ray outgoing from said first stage X-ray mirror via said second and third stage X-ray mirrors.

7. An X-ray exposure method employing an X-ray exposure apparatus including four X-ray mirrors including first, second, thirds and fourth stage X-ray mirrors, comprising the steps of:

changing a spectral distribution, rendering substantially identical an optical axis of an X-ray incident on said first stage X-ray mirror and an optical axis of an X-ray outgoing from said fourth stage X-ray mirror, and also changing a spectral distribution of the X-ray outgoing from said fourth stage X-ray mirror, by changing α and Dα to satisfy a relationship DαLxtan(2α), wherein α represents an angle of oblique incidence of an X-ray incident on each of said four X-ray mirrors, L represents a distance between said first and second stage X-ray mirrors and a distance between said third and fourth stage X-ray mirrors, as seen along an x axis corresponding to a direction of the X-ray incident on said first stage X-ray mirror, and Dα represents a distance from incidence of an optical axis of the X-ray incident on said first stage X-ray mirror to said third and fourth stage X-ray mirrors, as seen along a y axis corresponding to a direction perpendicular to said x axis;

causing an X-ray incident on said first stage X-ray mirror; and exposing to an X-ray outgoing from said first stage X-ray mirror via said second to fourth stage X-ray mirrors.

8. An X-ray exposure method employing an X-ray exposure apparatus including four X-ray mirrors including first, second, third, and fourth stage X-ray mirrors, comprising the steps of:

changing a spectral distribution, rendering substantially identical an optical axis of an X-ray incident on said first stage X-ray mirror and an optical axis of an X-ray outgoing from said fourth stage X-ray mirror, and also changing a spectral distribution of the X-ray outgoing from said fourth stage X-ray mirror, by changing $\alpha$, $\beta$, $L\alpha$, and $L\beta$ to satisfy a relationship $D=2\times L\alpha\times\tan(2\alpha)= L\beta\times\tan 2(\beta-\alpha)$, wherein $\alpha$ represents an angle of oblique incidence of an X-ray incident on each of said first and fourth stage X-ray mirrors, $\beta$ represents an angle of oblique incidence of an X-ray incident on each of said second and third stage X-ray mirrors, $L\alpha$ represents a distance between said first and second stage X-ray mirrors and a distance between said third and fourth stage X-ray mirrors, as seen along an x axis corresponding to a direction of the X-ray incident on said first stage X-ray mirror, $L\beta$ represents a distance between said second and third stage X-ray mirrors, as seen along said x axis, and D represents a distance between said second and third stage X-ray mirrors, as seen along a y axis corresponding to a direction perpendicular to said x axis;

causing an X-ray incident on said first stage X-ray mirror; and exposing to an X-ray outgoing from said first stage X-ray mirror via said second to fourth stage X-ray mirrors.

* * * * *